(12) United States Patent
Yosui et al.

(10) Patent No.: US 10,128,040 B2
(45) Date of Patent: Nov. 13, 2018

(54) INDUCTOR BRIDGE AND ELECTRONIC DEVICE

(71) Applicant: Murata Manufacturing Co., Ltd., Nagaokakyo-shi, Kyoto-fu (JP)

(72) Inventors: Kuniaki Yosui, Nagaokakyo (JP); Noboru Kato, Nagaokakyo (JP); Yuki Wakabayashi, Nagaokakyo (JP); Bunta Okamoto, Nagaokakyo (JP); Naoto Ikeda, Nagaokakyo (JP); Takeshi Kurihara, Nagaokakyo (JP)

(73) Assignee: MURATA MANUFACTURING CO., LTD., Kyoto (JP)

( * ) Notice: Subject to any disclaimer, the term of this patent is extended or adjusted under 35 U.S.C. 154(b) by 0 days.

(21) Appl. No.: 15/494,697

(22) Filed: Apr. 24, 2017

(65) Prior Publication Data

US 2017/0229235 A1    Aug. 10, 2017

Related U.S. Application Data

(63) Continuation of application No. 14/748,615, filed on Jun. 24, 2015, now Pat. No. 9,666,352, which is a
(Continued)

(30) Foreign Application Priority Data

Feb. 19, 2013  (JP) ................................ 2013-029783
Mar. 15, 2013  (JP) ................................ 2013-053920
(Continued)

(51) Int. Cl.
*H01F 38/14*    (2006.01)
*H03H 7/01*    (2006.01)
(Continued)

(52) U.S. Cl.
CPC ............... *H01F 38/14* (2013.01); *H01F 1/34* (2013.01); *H01F 27/245* (2013.01);
(Continued)

(58) Field of Classification Search
CPC ................. H01F 5/003; H01F 17/0006; H01F 2017/006; H01F 27/2804; H05K 1/147; H05K 1/165
See application file for complete search history.

(56) References Cited

U.S. PATENT DOCUMENTS 6,021,050 A * 2/2000 Ehman ................... H05K 1/162
                                                        174/255
7,338,332 B2 * 3/2008 Simonsson .......... H01R 4/4881
                                                        439/495
(Continued)

OTHER PUBLICATIONS

Yosui et al., "Inductor Bridge and Electronic Device", U.S. Appl. No. 14/748,615, filed Jun. 24, 2015.

*Primary Examiner* — Howard Williams
(74) *Attorney, Agent, or Firm* — Keating & Bennett, LLP

(57) ABSTRACT

An inductor bridge is provided with a flexible flat plate-shaped element body, a first connector, and a second connector. The element body includes therein an inductor portion. The inductor portion is configured by a spiral conductor pattern. The first connector is provided on the element body and is connected to a first circuit. The second connector is provided on the element body and is connected to a second circuit.

14 Claims, 58 Drawing Sheets

Related U.S. Application Data continuation of application No. PCT/JP2014/052029, filed on Jan. 30, 2014.

(30) Foreign Application Priority Data

| | | |
|---|---|---|
| May 24, 2013 | (JP) | 2013-110119 |
| Jun. 6, 2013 | (JP) | 2013-119385 |
| Aug. 23, 2013 | (JP) | 2013-173830 |
| Nov. 12, 2013 | (JP) | 2013-233643 |

(51) Int. Cl.

| | |
|---|---|
| H01F 27/28 | (2006.01) |
| H01F 27/245 | (2006.01) |
| H01F 1/34 | (2006.01) |
| H01Q 9/42 | (2006.01) |
| H01Q 1/38 | (2006.01) |
| H01F 27/40 | (2006.01) |
| H01Q 1/50 | (2006.01) |
| H05K 1/16 | (2006.01) |
| H05K 1/02 | (2006.01) |
| H05K 1/14 | (2006.01) |
| H01F 27/29 | (2006.01) |
| H01F 27/36 | (2006.01) |
| H04M 1/02 | (2006.01) |
| H01F 17/00 | (2006.01) |
| H05K 3/00 | (2006.01) |

(52) U.S. Cl.
 CPC ..... *H01F 27/2804* (2013.01); *H01F 27/2885* (2013.01); *H01F 27/29* (2013.01); *H01F 27/40* (2013.01); *H01Q 1/38* (2013.01); *H01Q 1/50* (2013.01); *H01Q 9/42* (2013.01); *H03H 7/0115* (2013.01); *H03H 7/0123* (2013.01); *H03H 7/0138* (2013.01); *H03H 7/1741* (2013.01); *H05K 1/028* (2013.01); *H05K 1/147* (2013.01); *H05K 1/165* (2013.01); *H01F 27/36* (2013.01); *H01F 2017/006* (2013.01); *H01F 2027/2809* (2013.01); *H01F 2027/295* (2013.01); *H04M 1/0277* (2013.01); *H05K 1/0218* (2013.01); *H05K 1/0225* (2013.01); *H05K 1/0233* (2013.01); *H05K 1/162* (2013.01); *H05K 3/0061* (2013.01); *H05K 2201/086* (2013.01); *H05K 2201/09263* (2013.01); *H05K 2201/10098* (2013.01); *H05K 2201/10189* (2013.01)

(56) References Cited

U.S. PATENT DOCUMENTS 8,159,313 B2 \* 4/2012 Uchaykin ............ H01P 1/2039
 333/166
8,692,642 B2 \* 4/2014 Singh .................... H01F 41/00
 336/200

\* cited by examiner

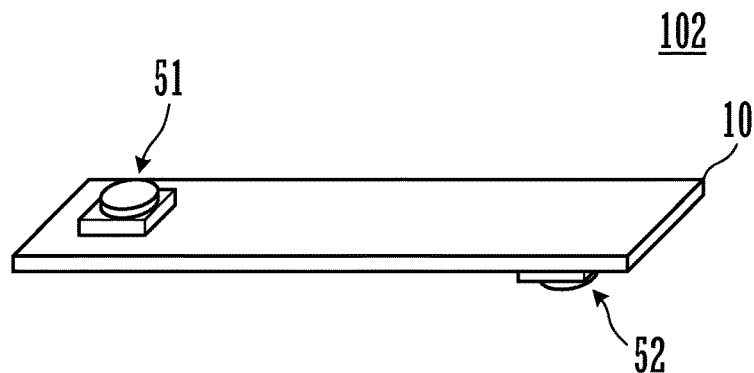
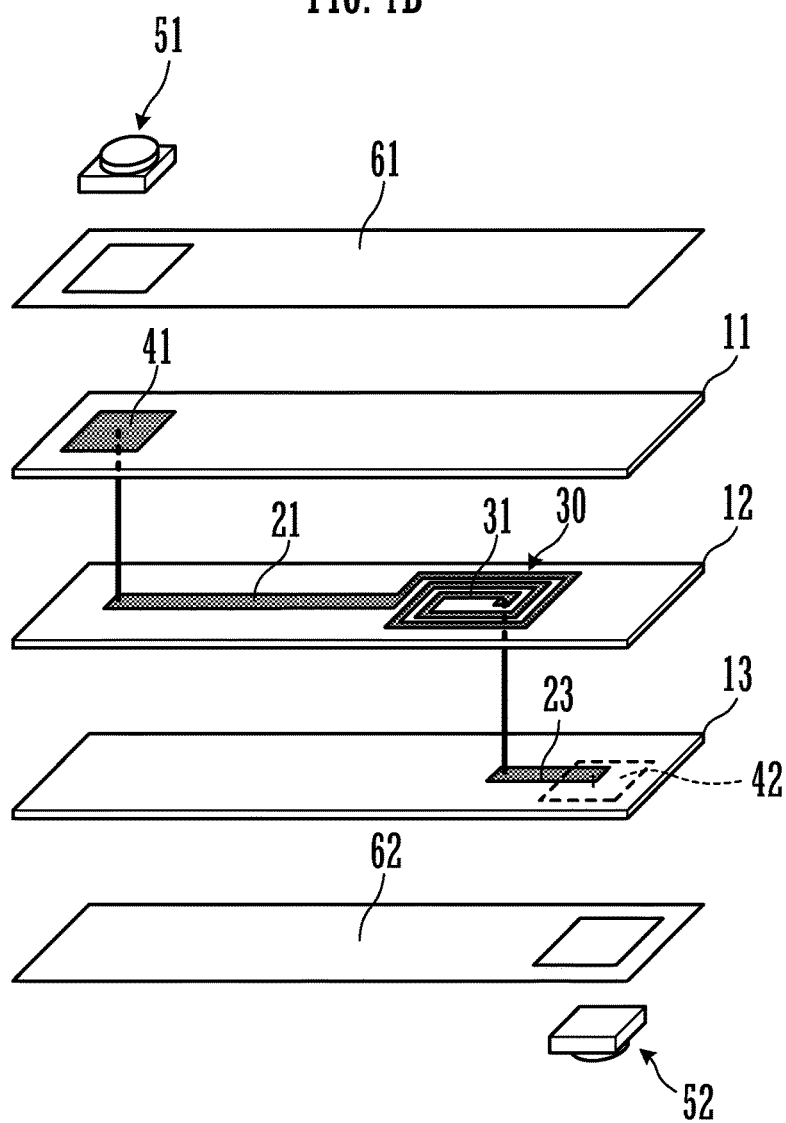

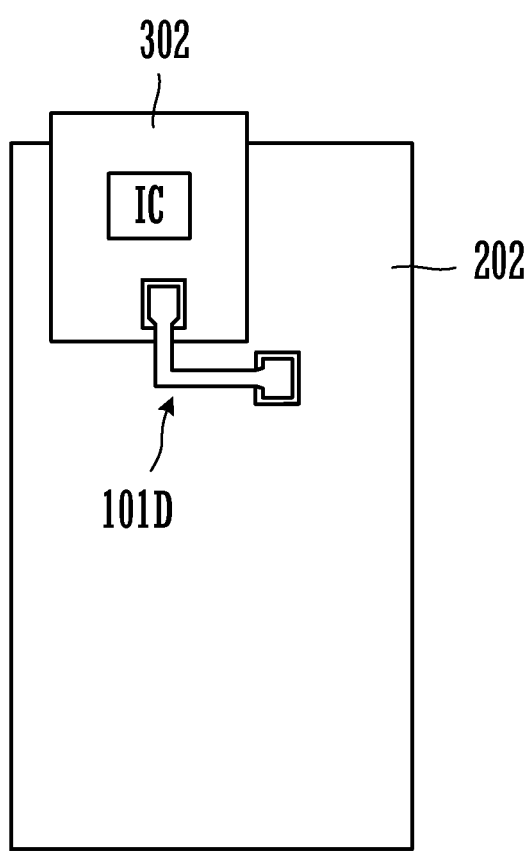

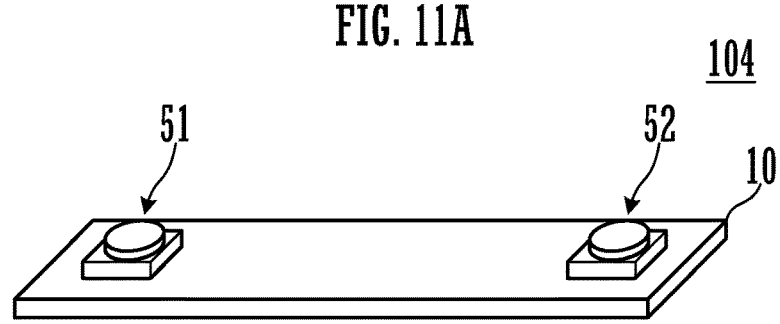
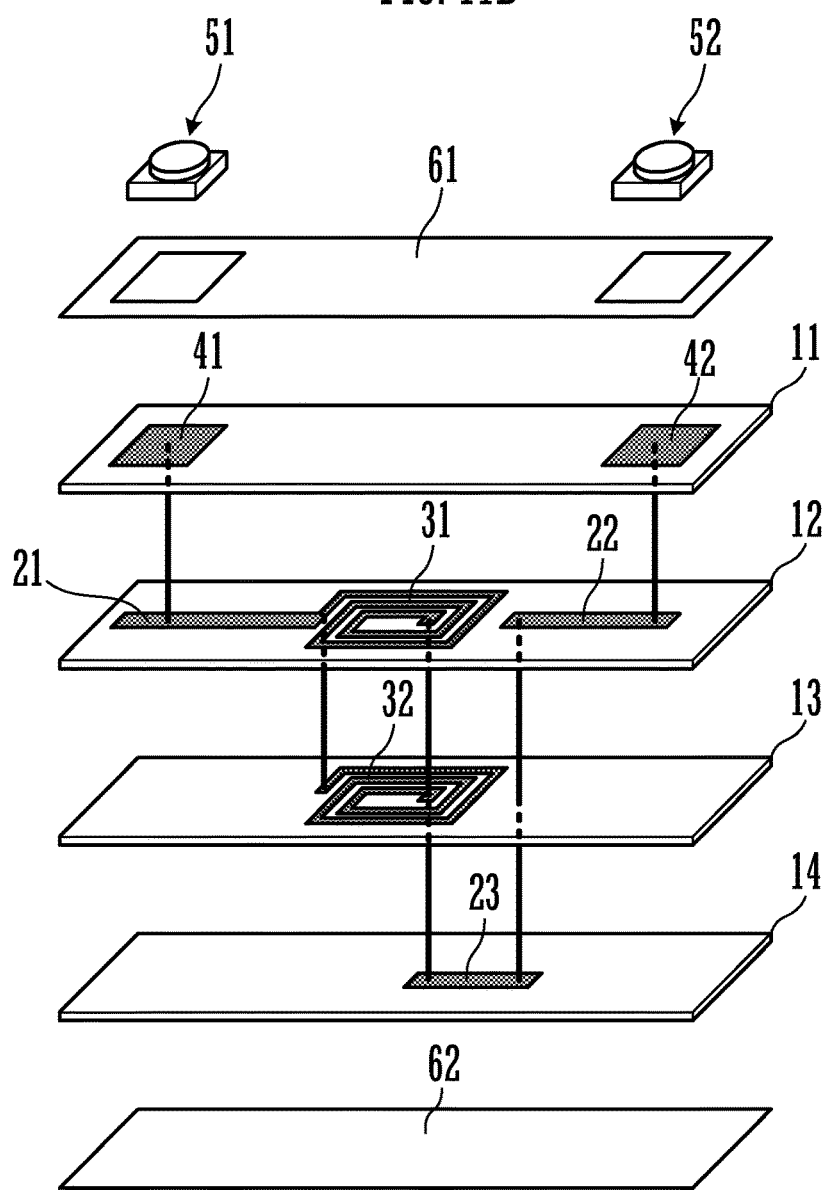

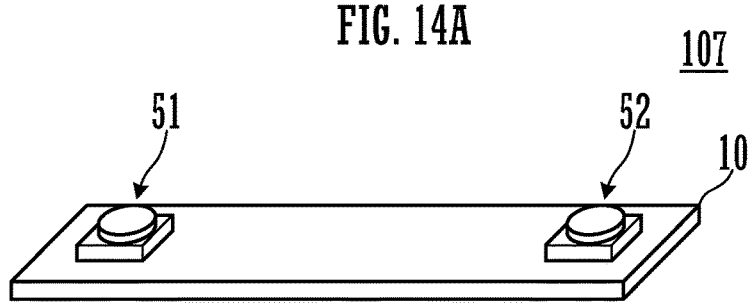
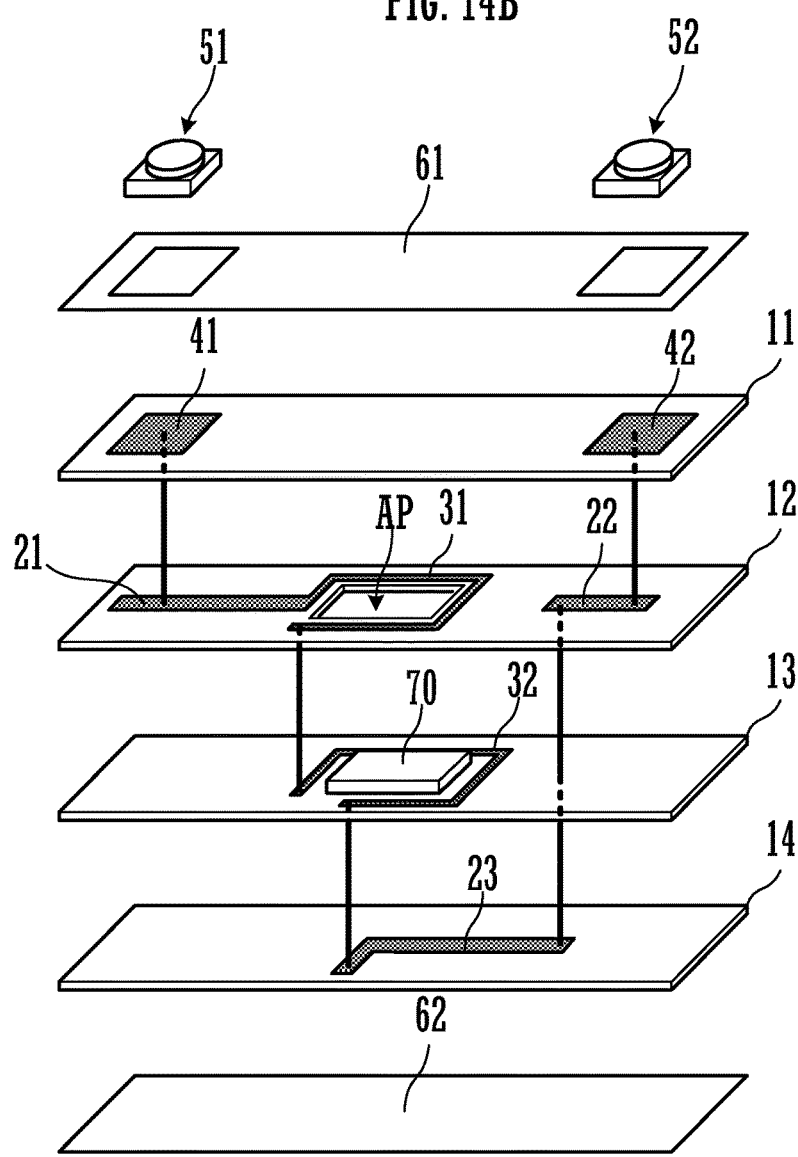

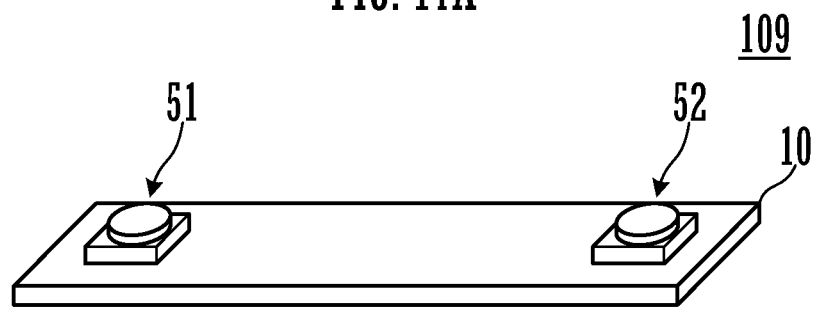
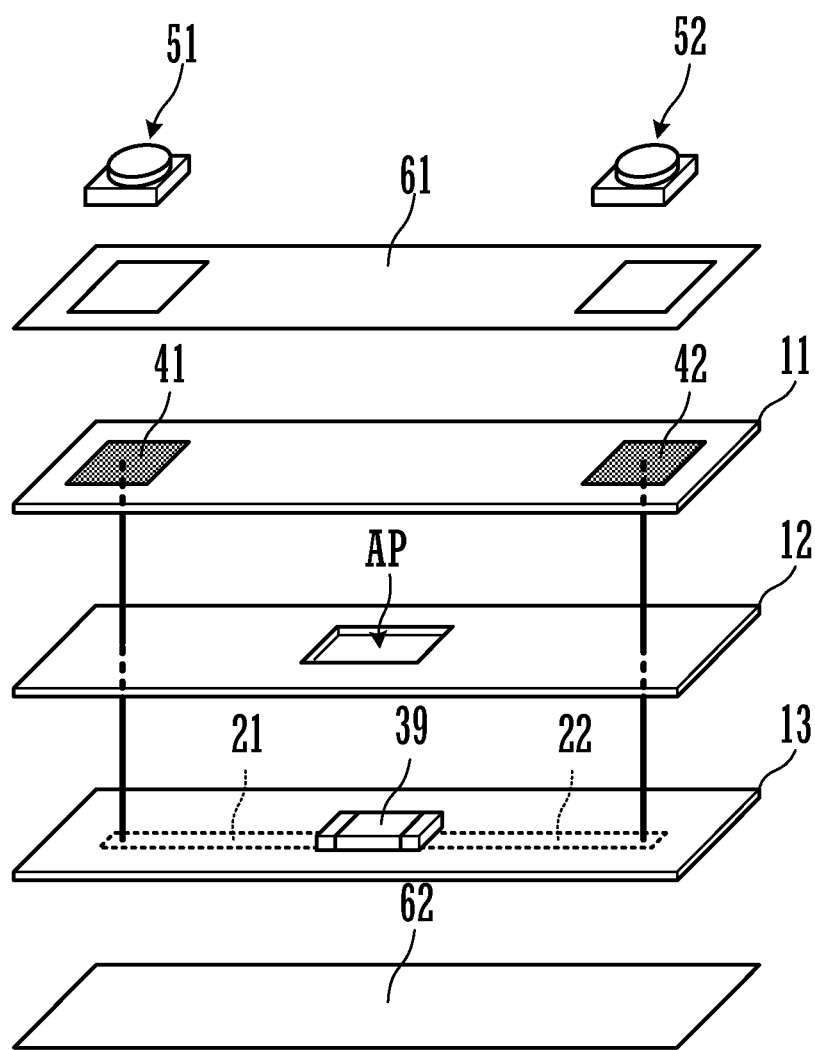

INDUCTOR BRIDGE AND ELECTRONIC DEVICE

BACKGROUND OF THE INVENTION

1. Field of the Invention

The present invention relates to an element that connects two circuits, and particularly to an inductor bridge including an inductance component, and an electronic device including the inductor bridge.

2. Description of the Related Art

Conventionally, in a small electronic device such as a mobile terminal, in a case in which such a device is provided with mounting circuit members such as a plurality of substrates in a housing, as disclosed in International Publication No. 2005/114778, for example, the mounting circuit members are connected by a flexible flat cable.

In a conventional electronic device including a plurality of substrates that are connected to each other by a flat cable, the substrate includes thereon an electronic component, as needed, to configure a circuit in substrate unit, and the flat cable is simply used as a wiring that connects the substrates to each other.

In such an electronic device provided with the mounting circuit members such as a plurality of substrates, an inductor required for a circuit, for example, is provided by mounting a chip inductor on the substrates or by forming a conductor pattern of an inductor on the substrates.

However, in a structure in which a chip inductor is mounted on a substrate, the substrate cannot be thin, which becomes a factor that obstructs a reduction in size of the entire electronic device. On the other hand, in a structure (hereinafter referred to as "pattern inductor") in which a conductor pattern forms an inductor, an area required for a circuit on the substrate is relatively large, which becomes a factor that obstructs the reduction in size of the electronic device.

Obviously, while any of the chip inductor and the pattern inductor, if a conductive pattern to be formed is miniaturized, can achieve the reduction in size of the electronic device, this causes some problems such that Equivalent Series Resistance (ESR) is increased or that Q value is decreased.

SUMMARY OF THE INVENTION

In view of the foregoing, preferred embodiments of the present invention provide an inductor bridge capable of reducing a size of an electronic device provided with an electronic circuit including an inductor, and an electronic device provided with such an inductor bridge.

An inductor bridge according to a preferred embodiment of the present invention is an element configured to bridge-connect a first circuit and a second circuit, and includes a flexible flat plate-shaped element body; a first connecting portion that is provided on the element body and connected to the first circuit; a second connecting portion that is provided on the element body and connected to the second circuit; and an inductor portion that is connected between the first connecting portion and the second connecting portion.

With the configuration described above, since an inductor is provided in the circuit without mounting a chip inductor and a pattern inductor to a mounting circuit member such as a substrate to be connected, an electronic device is able to be downsized. In addition, since the number of processing steps in which the chip inductor is mounted to the mounting circuit member such as a substrate is reduced, cost reduction is achieved.

The first connecting portion and the second connecting portion may preferably be electrically connected to each other by mechanical contact. Accordingly, the inductor bridge is able to be used as a connecting tool that connects circuits electrically and mechanically.

The element body may preferably be a laminate including a resin base material; and the resin base material may preferably be made of a liquid crystal polymer (LCP). Accordingly, the low dielectric constant characteristic is utilized effectively to reduce stray capacitance, so that the inductor bridge is able to be used as an inductor up to a higher frequency band.

The inductor portion preferably includes, for example, a spiral conductor pattern of which the coil axis is oriented in a direction perpendicular or substantially perpendicular to the principal surface of the element body. Accordingly, a large inductance is obtained with the small number of layers, so that the planar size required to obtain necessary inductance is reduced.

In a case in which the element body has a longer direction, the inductor portion includes, for example, a meander line-shaped conductor pattern of which the lines that are adjacent to each other each extend in the longer direction of the element body. Accordingly, the rigidity in the longer direction is enhanced. In addition, bending at a position other than a position of the inductor portion becomes easy.

In a case in which the element body has a shorter direction, the inductor portion, for example, includes a meander line-shaped conductor pattern of which the lines that are adjacent to each other each extend in the shorter direction of the element body. Accordingly, the flexibility in the overall longer direction is enhanced. In addition, the amount of the change in inductance with respect to the amount of the bending of the element body is significantly reduced or prevented.

The conductor pattern preferably is provided over a plurality of layers, for example, and the conductor patterns that are provided on adjacent layers are arranged so as not to be overlapped with each other in a plan view. Accordingly, with a slight increase in stray capacitance for the increase in inductance accompanying the increase in the number of layers, the inductor bridge is able to be used as an inductor up to a higher frequency band.

The conductor pattern is provided over a plurality of layers, for example, and a plurality of conductor patterns are connected in parallel to each other. Accordingly, equivalent series resistance is reduced.

The inductor portion, for example, preferably is a helical conductor pattern of which the coil axis is oriented in a direction in parallel or substantially parallel to the principal surface of the element body. Accordingly, even if the conductors are adjacent to each other, an eddy current is hardly generated in the conductors, so that change in inductance by a surrounding environment is significantly reduced or prevented.

A magnetic body (core) may preferably be arranged near the conductor pattern in the element body. Accordingly, an inductor bridge is further downsized.

The first connecting portion may preferably be provided on a first end portion of the element body; the second connecting portion may preferably be provided on a second end portion of the element body; and the element body may preferably include a bending portion between the first end portion and the second end portion. Accordingly, the inductor bridge, in a state of being bent, connects two circuits and is easily stored in a limited space in the housing of an electronic device.

The bending portion may preferably be a portion to be bent along a line (bending line) and may preferably be provided in a region in which the inductor portion is provided; and the inductor portion may preferably have a shape of an ellipse of which the major axis is non-perpendicular to the line. Accordingly, the conductor pattern including the inductor portion is hardly disconnected.

The bending portion may preferably be arranged at a position other than a line passing through the center of the inductor portion. Accordingly, the inductor bridge is easily bent at a highly flexible position, which significantly reduces or prevents stress to the inductor portion and causes the inductor bridge to easily maintain the characteristics as an inductor.

The bending portion may preferably include an interlayer connection conductor (via conductor).

The element body may preferably include two shield conductor patterns that interpose the inductor portion between the shield conductor patterns in a laminating direction. Accordingly, the inductor portion is electromagnetically shielded, so that stable characteristics are obtained.

The inductor portion may preferably include a conductor pattern of which the coil axis is oriented in a direction perpendicular or substantially perpendicular to the principal surface of the element body and which preferably has a helical shape over a plurality of layers; a plurality of conductor patterns may preferably be provided in a position of facing each other between the layers; and, among the plurality of conductor patterns, a line width of the (outermost) conductor pattern that is close to the first connecting portion on a path and a line width of the (outermost) conductor pattern that is close to the second connecting portion on a path may preferably be thinner than a line width of the conductor patterns of other layers. The configuration significantly reduces parasitic capacitance, increases self-resonant frequency, and widens a pass band width.

The inductor portion may preferably include a conductor pattern of which the coil axis is oriented in a direction perpendicular or substantially perpendicular to the principal surface of the element body and which preferably has a helical shape over a plurality of layers; a plurality of conductor patterns may preferably be provided in a position of facing each other between the layers; the plurality of conductor patterns may preferably include a first (outermost) conductor pattern that is close to the first connecting portion and the second connecting portion on a path; and a second (outermost) conductor pattern of a layer that is adjacent to the first conductor pattern; and a distance between the first conductor pattern and the second connecting portion may preferably be larger than a distance between the conductor patterns in other layers that are adjacent to the first conductor pattern. The configuration significantly reduces parasitic capacitance, increases self-resonant frequency, and widens a pass band width.

An electronic device according to a preferred embodiment of the present invention includes an inductor bridge according to any one of the preferred embodiments of the present invention described above; a first circuit; and a second circuit, and the first circuit and the second circuit are connected to each other through the inductor bridge.

The electronic device includes, for example, a first mounting circuit member including the first circuit; and a second mounting circuit member including the second circuit, and the first mounting circuit member and the second mounting circuit member are provided at a different position in a height direction; and when the inductor bridge is bent, the first connecting portion is connected to the first mounting circuit member, and the second connecting portion is connected to the second mounting circuit member.

An electronic device according to a preferred embodiment of the present invention includes an inductor bridge according to one of the preferred embodiments of the present invention described above; a first circuit; a second circuit; a first mounting circuit member including the first circuit; and a second mounting circuit member including the second circuit, and the first mounting circuit member and the second mounting circuit member are provided at a different position in a height direction; the second mounting circuit member includes a ground conductor pattern; and the inductor bridge, when being bent, is connected between the first mounting circuit member and the second mounting circuit member in a state in which the coil axis of the inductor portion is arranged non-perpendicular to the face of the second mounting circuit member. The configuration reduces or prevents undesired coupling between the inductor portion and a ground conductor and significantly reduces an eddy current generated in the ground conductor.

An electronic device according to a preferred embodiment of the present invention may preferably include an inductor bridge according to any one of the preferred embodiments of the present invention described above; and a mounting circuit member (substrate) including a planar conductor (ground electrode) that is electrically connected to the first connecting portion, and the inductor bridge may preferably include a first wiring pattern that is connected to the first connecting portion; and a second wiring pattern that is connected to the second connecting portion; and the second wiring pattern and the inductor portion may preferably be provided on a layer farther away from the planar conductor than the first wiring pattern.

An electronic device according to a preferred embodiment of the present invention may preferably include an inductor bridge according to any one of the preferred embodiments of the present invention described above; and an antenna including an antenna element pattern that is electrically connected to the first connecting portion, and the inductor bridge may preferably include a first wiring pattern that is connected to the first connecting portion; and a second wiring pattern that is connected to the second connecting portion; and the second wiring pattern may preferably be provided on a layer farther away from the antenna element pattern than the first wiring pattern.

An electronic device according to a preferred embodiment of the present invention may preferably include an inductor bridge according to any one of the preferred embodiments of the present invention described above; an antenna including an antenna element pattern that is electrically connected to the first connecting portion; and a planar conductor that is electrically connected to the second connecting portion, and the inductor bridge may preferably include a first wiring pattern that is connected to the first connecting portion; and a second wiring pattern that is connected to the second connecting portion; and the first wiring pattern may preferably be provided on a layer farther away from the planar conductor than the second wiring pattern.

An electronic device according to a preferred embodiment of the present invention may preferably include an inductor bridge according to any one of the preferred embodiments of the present invention described above; an antenna including an antenna element pattern that is electrically connected to the first connecting portion; and a metal member that is arranged on an opposite side of the antenna across the inductor bridge, and the inductor bridge may preferably include a first wiring pattern that is connected to the first connecting portion; and a second wiring pattern that is connected to the second connecting portion; and the first wiring pattern may preferably be provided on a layer farther away from the metal member than the second wiring pattern.

An electronic device according to a preferred embodiment of the present invention may preferably include an inductor bridge according to any one of the preferred embodiments of the present invention described above; and a planar conductor (such as a battery), and the inductor portion may preferably include a conductor pattern of which the coil axis is oriented in a direction perpendicular or substantially perpendicular to the principal surface of the element body and preferably has a spiral shape over a plurality of layers; and, among the conductor patterns, a layer on which the conductor pattern with the large number of turns is provided may preferably be arranged on a layer spaced away from the planar conductor.

An electronic device according to a preferred embodiment of the present invention may preferably include an inductor bridge according to any one of the preferred embodiments of the present invention described above; and the inductor portion may preferably include a conductor pattern of which the coil axis is oriented in a direction perpendicular or substantially perpendicular to the principal surface of the element body and preferably has a spiral shape over a plurality of layers; and the plurality of conductor patterns may preferably be provided in a position of facing each other between the layers.

An electronic device according to a preferred embodiment of the present invention may preferably include an inductor bridge according to any one of the preferred embodiments of the present invention described above; and a planar conductor (metal body), and the inductor portion may preferably include a conductor pattern of which the coil axis is oriented in a direction perpendicular or substantially perpendicular to the principal surface of the element body and preferably has a spiral shape over a plurality of layers; and the plurality of conductor patterns may preferably be provided in a position in which a capacitance is generated between the conductor pattern and the planar conductor.

The capacitance and the inductor portion may preferably define a low pass filter.

According to various preferred embodiments of the present invention, since an inductor is provided in the circuit without mounting a chip inductor and a pattern inductor to a mounting circuit member such as a substrate to be connected, an electronic device is downsized. In addition, since the number of processes in which the chip inductor is mounted to the mounting circuit member such as a substrate is reduced, cost reduction is achieved.

The above and other elements, features, steps, characteristics and advantages of the present invention will become more apparent from the following detailed description of the preferred embodiments with reference to the attached drawings.

BRIEF DESCRIPTION OF THE DRAWINGS

FIG. 7A is a perspective view showing an appearance of an inductor bridge 102, and FIG. 7B is an exploded perspective view of the inductor bridge.

FIG. 9 is a view showing a state in which two substrates are connected to each other with an inductor bridge.

FIG. 11A is a perspective view showing an appearance of an inductor bridge according to a third preferred embodiment of the present invention, and FIG. 11B is an exploded perspective view of the inductor bridge.

FIG. 14A is a perspective view showing an appearance of an inductor bridge according to a sixth preferred embodiment of the present invention, and FIG. 14B is an exploded perspective view of the inductor bridge.

FIG. 17A is a perspective view showing an appearance of an inductor bridge according to an eighth preferred embodiment of the present invention, and FIG. 17B is an exploded perspective view of the inductor bridge.

DETAILED DESCRIPTION OF THE PREFERRED EMBODIMENTS

Figure 1A:
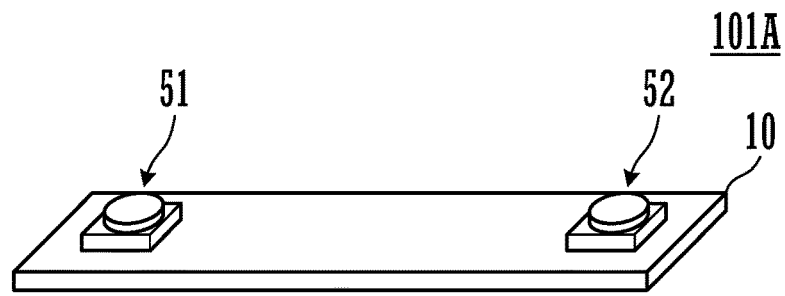
FIG. 1A is a perspective view showing an appearance of an inductor bridge according to a first preferred embodiment of the present invention.

Hereinafter, with reference to the attached drawings, several specific examples will describe a plurality of preferred embodiments of the present invention. In the drawings, the components and elements assigned with the same reference numerals or symbols will represent identical components and elements. Obviously, each of the preferred embodiments is illustrative and the configuration shown in different preferred embodiments is partially replaced and combined with each other.

First Preferred Embodiment

Figure 1B:
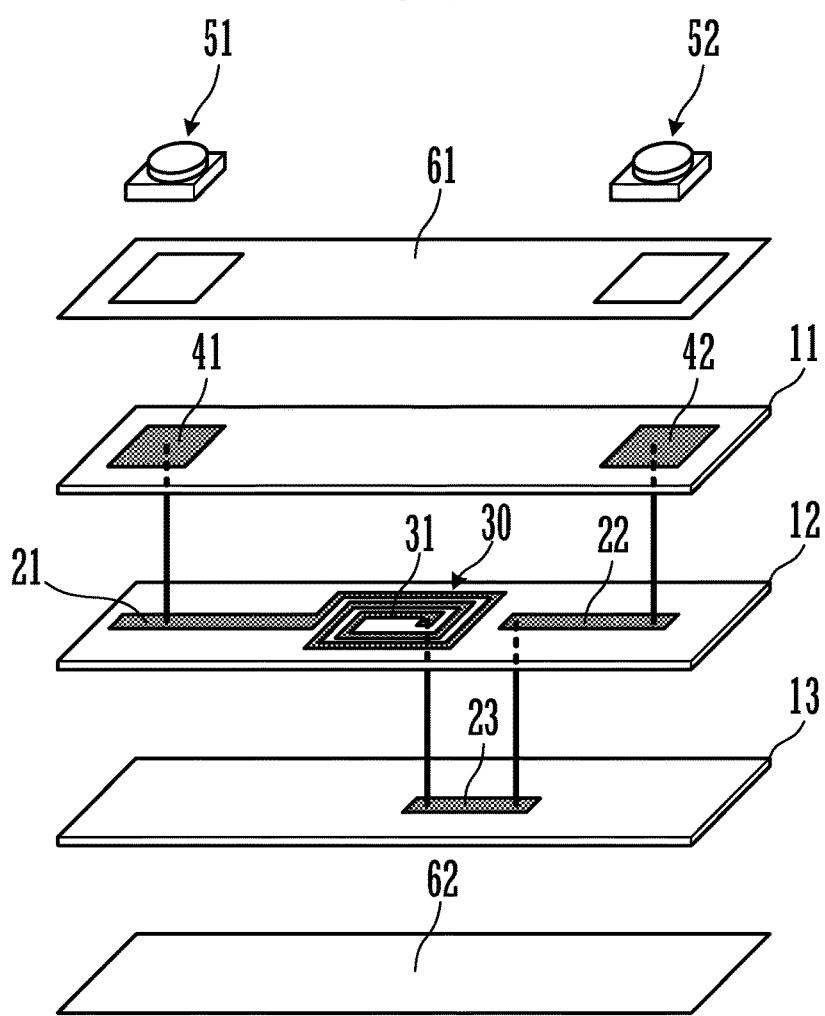
FIG. 1B is an exploded perspective view of the inductor bridge.

FIG. 1A is a perspective view showing the appearance of an inductor bridge according to a first preferred embodiment of the present invention, and FIG. 1B is an exploded perspective view of the inductor bridge. The inductor bridge 101A is an element configured to bridge-connect a first circuit and a second circuit. As shown in FIG. 1A, the inductor bridge 101A is provided with a flexible flat plate-shaped element body 10, a first connector 51, and a second connector 52. The element body 10 includes therein an inductor portion to be described later. The first connector 51 is provided on a first end portion of the element body 10 and connected to the first circuit by mechanical contact. The second connector 52 is provided on a second end portion of the element body 10 and connected to the second circuit by mechanical contact. The first connector 51 is equivalent to the "first connecting portion" of a preferred embodiment of the present invention, and the second connector 52 is equivalent to the "second connecting portion" of a preferred embodiment of the present invention.

As shown in FIG. 1B, the element body 10 is configured by laminating resin base materials 11, 12, and 13 of a liquid crystal polymer (LCP). The resin base material 12 includes an inductor portion 30 defined by a conductor pattern 31. The conductor pattern 31 is a spiral conductor pattern of which the coil axis is oriented in a direction perpendicular or substantially perpendicular to the face of the resin base material 12 (direction perpendicular or substantially perpendicular to the principal surface of the element body 10).

The resin base material 12 includes thereon wiring patterns 21 and 22, and the resin base material 13 includes thereon a wiring pattern 23. The first end of the wiring pattern 21 is connected to the outer peripheral end of the conductor pattern 31 of the inductor portion, the inner peripheral end of the conductor pattern 31 is connected to the first end of the wiring pattern 23 through a via conductor (interlayer connection conductor), and the second end of the wiring pattern 23 is connected to the first end of the wiring pattern 22 through the via conductor.

The resin base material 11 includes thereon connector mounting electrodes 41 and 42 to mount the connectors 51 and 52. These connector mounting electrodes 41 and 42 are connected to the second ends of the wiring patterns 21 and 22 through the via conductor, respectively.

The resin base material 11 includes a resist layer 61 on the upper surface thereof, and the resin base material 13 includes a resist layer 62 on the lower surface thereof. It is to be noted that the resist layer 62 is not essential and is not necessary to be provided.

A non-limiting example of a method of manufacturing the inductor bridge 101A is as follows.

(1) To begin with, a resin base material and a metal foil (copper foil, for example) are laminated and the metal foil is patterned by photolithography to form wiring patterns 21, 22, and 23, a conductor pattern 31, and connector mounting electrodes 41 and 42. In addition, the resin base materials 11 and 12 include a via conductor. The via conductor is mounted by arranging conductive paste including copper, silver, and tin after providing a through hole by laser or the like, and curing the paste in the following heating and pressurizing process.

(2) The resin base materials 11, 12, and 13 are laminated, heated, and pressurized to configure a laminate (aggregate substrate).

(3) The resist layers 61 and 62 are printed on the opposite surfaces of the laminate, respectively.

(4) The connectors 51 and 52 are soldered.

(5) The aggregate substrate is divided to obtain an individual inductor bridge 101A.

Figure 2A:
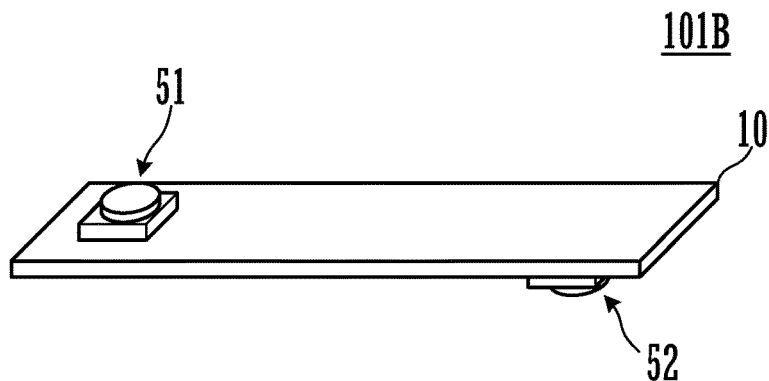
FIG. 2A is a perspective view showing an appearance of another inductor bridge according to the first preferred embodiment of the present invention.
Figure 2B:
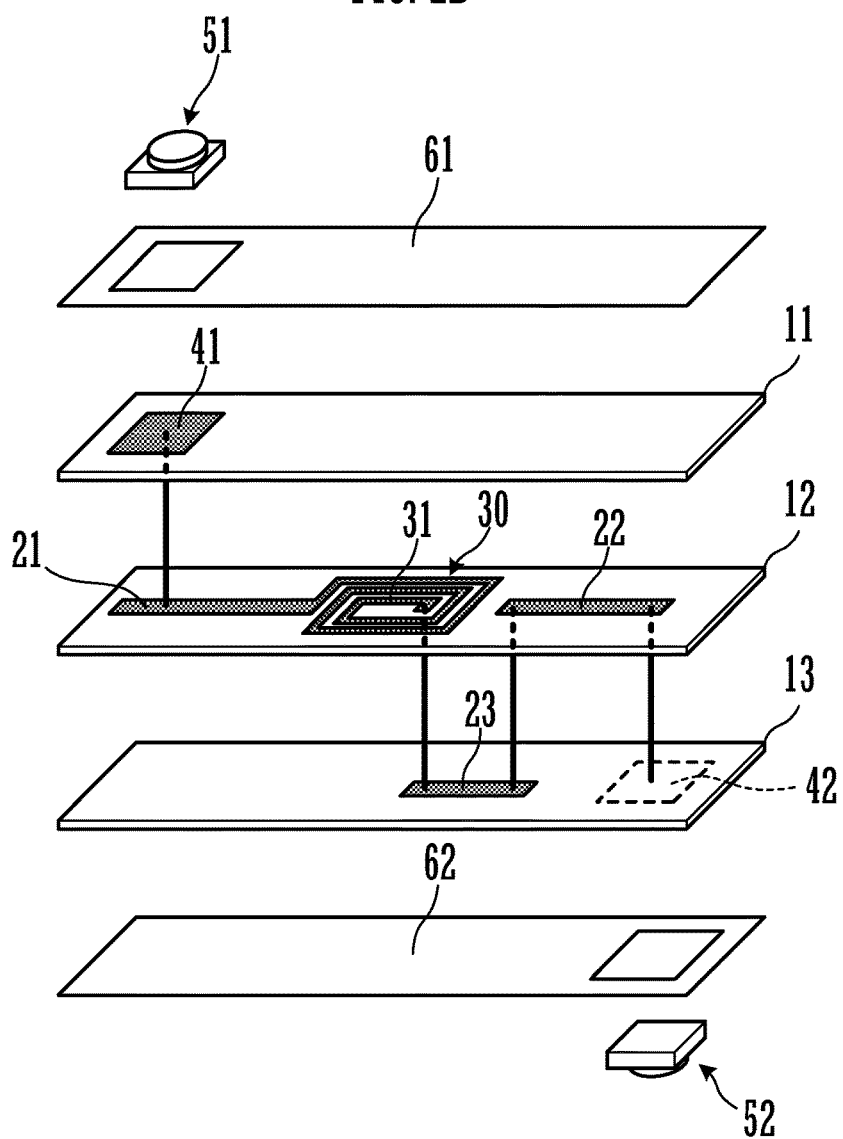
FIG. 2B is an exploded perspective view of the inductor bridge.

FIG. 2A is a perspective view showing the appearance of another inductor bridge according to the first preferred embodiment of the present invention, and FIG. 2B is an exploded perspective view of the inductor bridge. The inductor bridge 101B includes the first connector 51 and the second connector 52 that are mounted on different surfaces with respect to the element body 10.

As shown in FIG. 2B, the connector mounting electrode 42 is formed on the lower surface of the resin base material 13. The resist layers 61 and 62 are provided in a pattern corresponding to the positions of the connector mounting electrodes 41 and 42. Other configurations are preferably the same as the configurations of the examples shown in FIG. 1A and FIG. 1B.

Figure 3A:
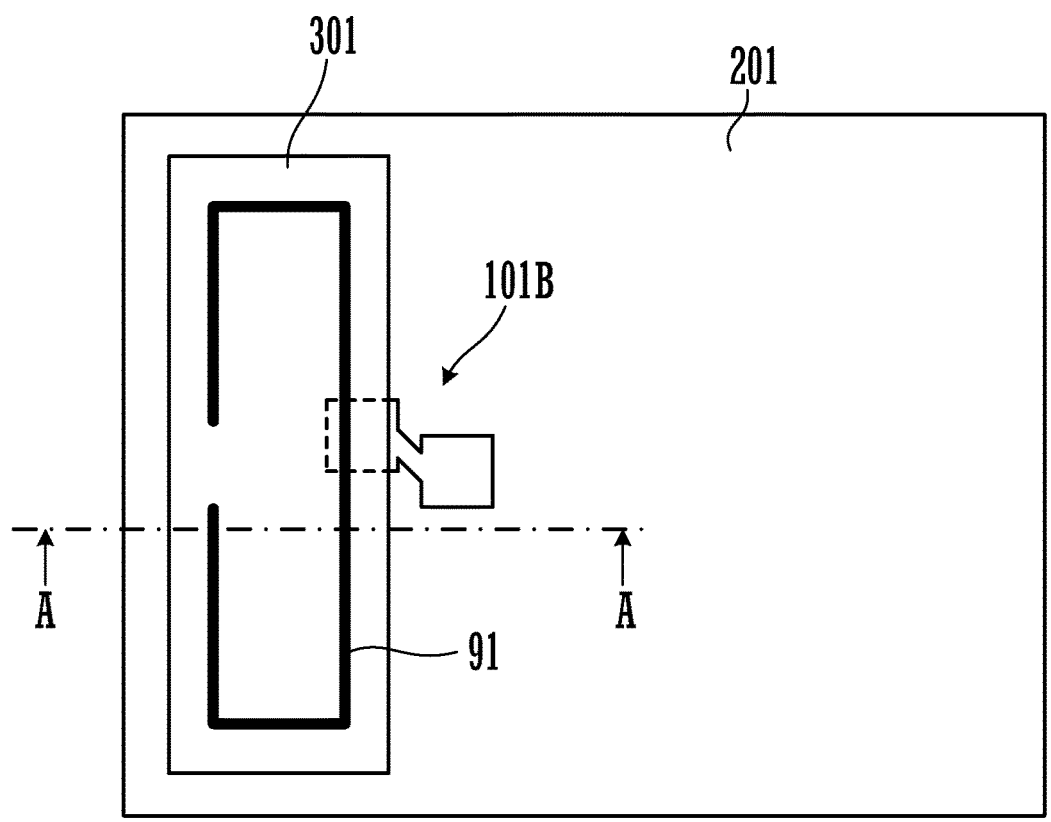
FIG. 3A is a plan view showing a state in which a mother substrate 201 and an antenna substrate 301 are connected to each other using an inductor bridge 101B.
Figure 3B:
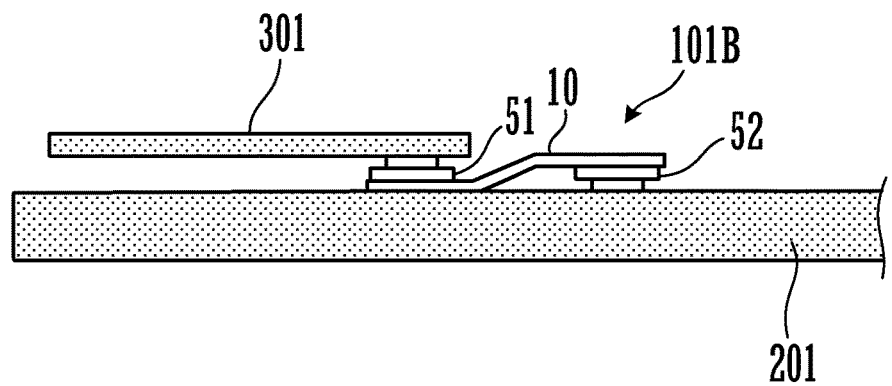
FIG. 3B is a cross sectional view taken on line A-A of FIG. 3A.

FIG. 3A is a plan view showing a state in which a mother substrate 201 and an antenna substrate 301 are connected to each other using the inductor bridge 101B, and FIG. 3B is a cross sectional view taken on line A-A of FIG. 3A.

The antenna substrate 301 includes thereon an antenna element pattern 91. The antenna element pattern 91 includes a feed point, and the first connector 51 of the inductor bridge 101B is connected to the feed point or a portion drawn out from the feed point. The second connector 52 of the inductor bridge 101B is connected to a connecting portion provided on the upper surface of the mother substrate 201.

Figure 4A:
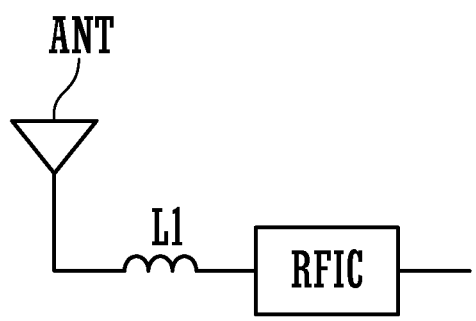
FIG. 4A is a block diagram of a high frequency circuit equipped with the inductor bridge 101B and the antenna substrate 301.
Figure 4B:
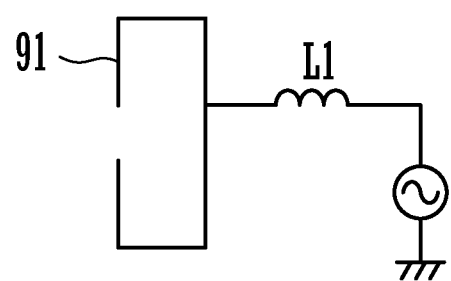
FIG. 4B is an equivalent circuit diagram of the high frequency circuit.

FIG. 4A is a block diagram of a high frequency circuit equipped with the inductor bridge 101B and the antenna substrate 301, and FIG. 4B is an equivalent circuit diagram of the high frequency circuit. The inductor bridge 101B includes an inductor L1. As shown in FIG. 4A, the inductor L1 is connected between an antenna ANT and an RFIC. In other words, as shown in FIG. 4B, the inductor L1 is inserted in series in a feeding portion of the antenna element pattern 91. The inductor L1 performs impedance matching between a feed circuit (RFIC) and the antenna, and the frequency characteristics of the antenna.

Figure 5:
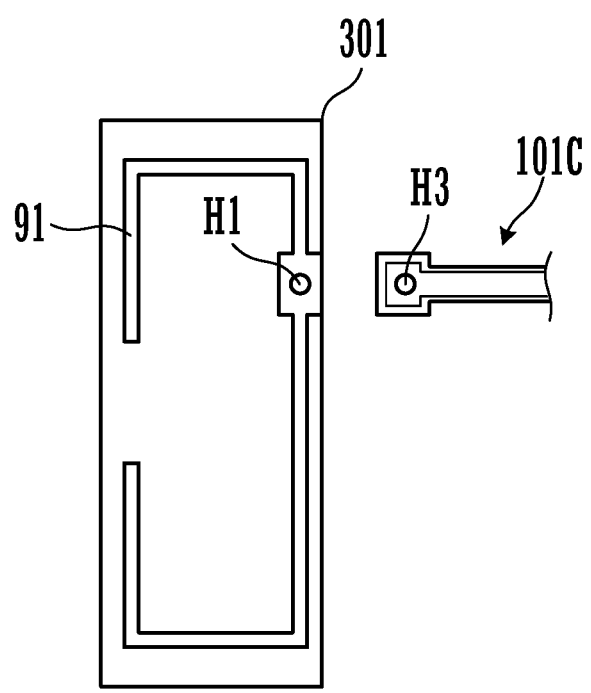
FIG. 5 is a view showing an example of a structure of a portion connecting the antenna substrate 301 and an inductor bridge 101C.

FIG. 5 is a view showing an example of a structure of a portion connecting the antenna substrate 301 and an inductor bridge 101C. The configurations other than the connector of the inductor bridge 101C are preferably the same as the configurations of the inductor bridges 101A and 101B that have already been shown. The feed point of the antenna element pattern 91 includes a hole H1.

The inductor bridge 101C includes a first end portion that includes an electrode (first connecting portion) and a hole H3. Screwing a screw into the hole H1 through the hole H3 on the side of the inductor bridge makes mechanical and electrical connections.

Figure 6A:
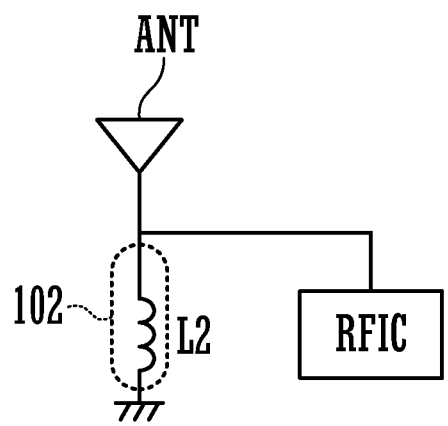
FIG. 6A is a block diagram showing one example of application of an inductor bridge.
Figure 6B:
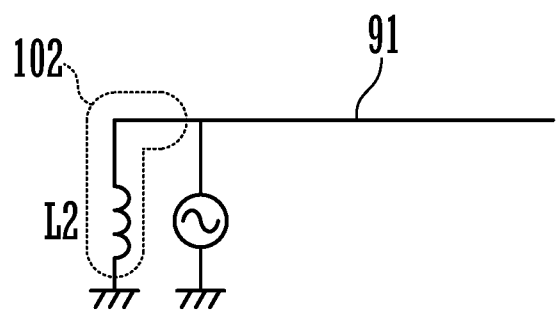
FIG. 6B is an equivalent circuit diagram of the inductor bridge.

FIG. 6A is a block diagram showing another example of application of the inductor bridge, and FIG. 6B is an equivalent circuit diagram of the inductor bridge. This example shows an example of an antenna configured by inserting an inductor between a ground connection point in an inverted F-shaped antenna and the ground.

In FIG. 6A and FIG. 6B, the inductor bridge 102 includes an inductor L2. The inductor L2 is connected between the antenna ANT and the ground to define the inverted F-shaped antenna. Specifically, as shown in FIG. 6B, the inductor L2 is connected between the end of the antenna element pattern 91, and the ground, and the feed circuit (RFIC) is connected near the inductor L2 of the antenna element pattern 91.

FIG. 7A is a perspective view showing the appearance of an inductor bridge 102, and FIG. 7B is an exploded perspective view of the inductor bridge 102. The inductor bridge 102 includes the first connector 51 and the second connector 52 that are mounted on different surfaces with respect to the element body 10.

As shown in FIG. 7B, the connector mounting electrode 42 is provided on the lower surface of the resin base material 13. The resist layers 61 and 62 are provided in a pattern corresponding to the positions of the connector mounting electrodes 41 and 42. The resin base material 12 includes an inductor portion 30 defined by a conductor pattern 31.

The resin base material 12 includes thereon a wiring pattern 21, and a resin base material 13 includes thereon a wiring pattern 23. The first end of the wiring pattern 21 is connected to the outer peripheral end of the conductor pattern 31 of the inductor portion, and the inner peripheral end of the conductor pattern 31 is connected to the first end of the wiring pattern 23 through the via conductor (interlayer connection conductor).

The resin base materials 11 and 13 include thereon the connector mounting electrodes 41 and 42 to mount the connectors 51 and 52. These connector mounting electrodes 41 and 42 are connected to the second ends of the wiring patterns 21 and 23 through the via conductor, respectively. Other configurations are preferably the same as the configurations of the examples shown in FIG. 1A and FIG. 1B.

Figure 8:
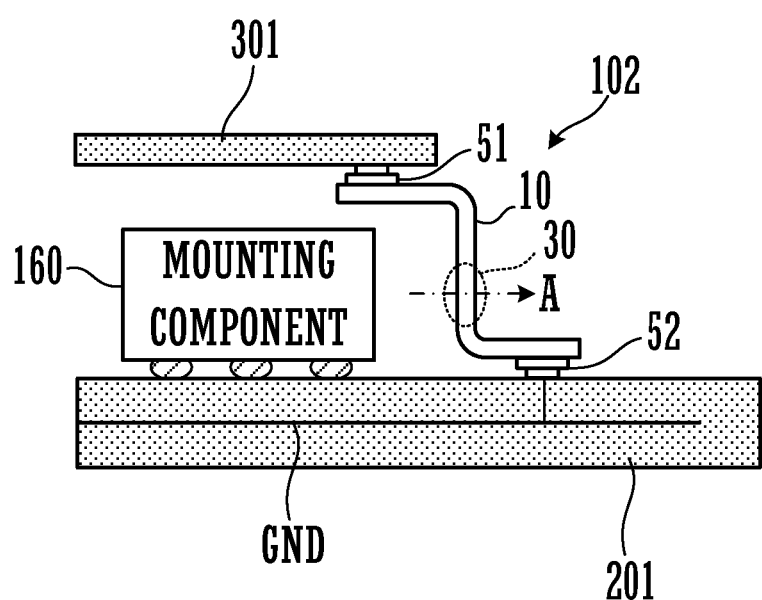
FIG. 8 is a cross sectional view showing a state in which the mother substrate 201 and the antenna substrate 301 are connected to each other by using the inductor bridge 102.

FIG. 8 is a cross sectional view showing a state in which the mother substrate 201 and the antenna substrate 301 are connected to each other using the inductor bridge 102.

The antenna substrate 301 includes thereon an antenna element pattern 91. The antenna element pattern 91 includes an end portion, and the first connector 51 of the inductor bridge 102 is connected to the end portion or a part drawn out from the end portion. The second connector 52 of the inductor bridge 102 is connected to a connecting portion formed on the upper surface of the mother substrate 201. The connecting portion on the mother substrate 201 is electrically connected to a ground conductor pattern GND expanding two-dimensionally.

Between the antenna substrate 301 and the mother substrate 201, the mother substrate 201 includes a surface mounting component 160 with respect to the mother substrate 201.

The inductor portion 30 of the inductor bridge 102 is provided at a position close to the second connector 52 connected to the ground. In other words, the inductor portion 30 is provided away from the antenna substrate 301. This significantly reduces or prevents degradation of the antenna characteristics due to the electromagnetic radiation in the inductor portion 30. In addition, the wiring pattern 21 close to the antenna of the inductor bridge is caused to act as a part of the antenna.

Moreover, as shown in FIG. 8, if the inductor portion 30 of the inductor bridge 102 extends in a direction perpendicular or substantially perpendicular to the mother substrate 201, the coil axis A of the inductor portion 30 is parallel or substantially parallel to the mother substrate 201. Therefore, the inductor portion 30 is difficult to be affected by the ground conductor pattern GND provided in the mother substrate 201. Specifically, the configuration significantly reduces or prevents undesired coupling between the inductor portion 30 and the ground conductor GND and significantly reduces an eddy current generated in the ground conductor GND. The coil axis A of the inductor portion 30 may not necessarily be completely parallel to the mother substrate 201, and, unless the coil axis A is at least perpendicular or substantially perpendicular to the mother substrate 201, the effects is achieved to a considerable extent according to the angle.

It should be noted that, other than the inductor bridge 102 as shown in FIG. 7A and FIG. 7B, other inductor bridges such as the inductor bridge 101B as shown in FIG. 2A and FIG. 2B is applied to configure the inductor portion of the inverted F-shaped antenna.

FIG. 9 is a view showing a state in which two substrates are connected to each other with an inductor bridge. A substrate 302 includes an electronic component such as an IC. The inductor bridge 101D includes a first connecting portion that is connected to the upper surface of the substrate 302, and a second connecting portion that is connected to the upper surface of the mother substrate 202.

The configuration other than the connector of the inductor bridge 101D is the same as the configuration of the inductor bridge 101A that has already been shown.

A description with reference to the drawings in each preferred embodiment to be shown later will be given of only a portion of the configuration that is different from the configuration of the inductor bridge shown in the first preferred embodiment of the present invention. Therefore, the configuration of the inductor bridges 103 to 107, 108A, 108B, and 109 to be described below and the configuration of the inductor bridges 101B to 101D, and 102 is combined or replaced to be implemented.

Second Preferred Embodiment

Figure 10A:
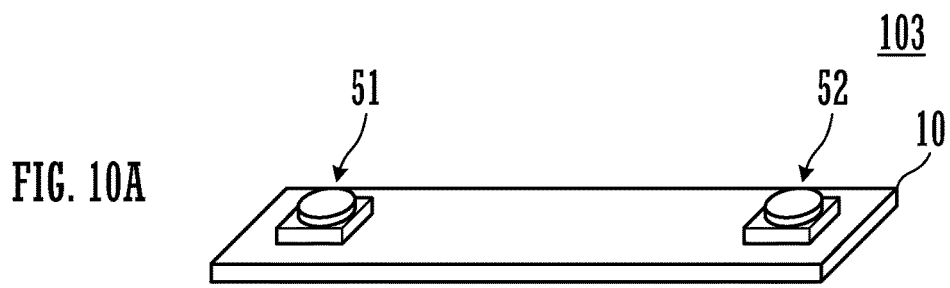
FIG. 10A is a perspective view showing an appearance of an inductor bridge according to a second preferred embodiment of the present invention.
Figure 10B:
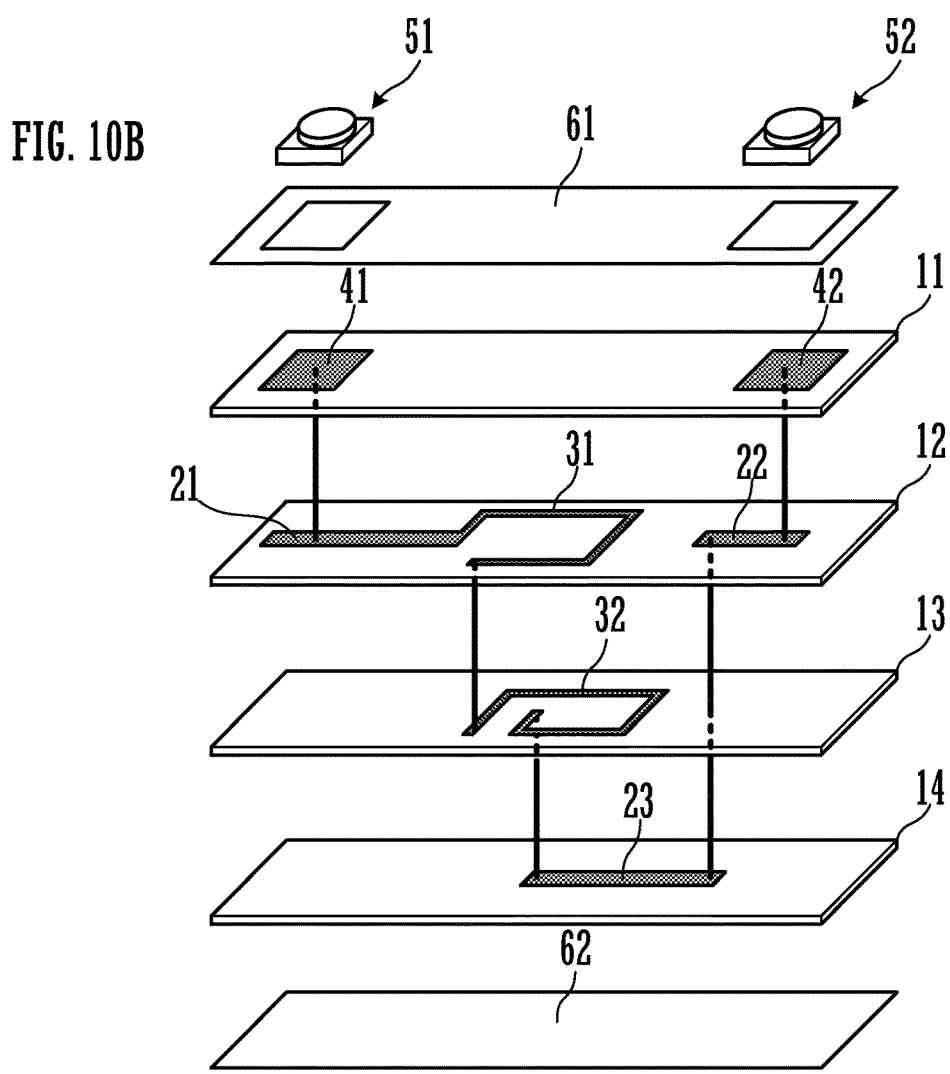
FIG. 10B is an exploded perspective view of the inductor bridge.

FIG. 10A is a perspective view showing the appearance of an inductor bridge according to a second preferred embodiment of the present invention, and FIG. 10B is an exploded perspective view of the inductor bridge. The inductor bridge 103 is provided with a flexible flat plate-shaped element body 10, a first connector 51, and a second connector 52. As shown in FIG. 10B, the element body 10 is configured by laminating resin base materials 11, 12, 13, and 14. The resin base materials 12 and 13 include an inductor portion defined by spiral conductor patterns 31 and 32. The spiral conductor patterns 31 and 32 are spiral conductor patterns of which the coil axis is oriented in a direction perpendicular or substantially perpendicular to the faces of the resin base materials 12 and 13 (direction perpendicular or substantially perpendicular to the principal surface of the element body 10).

Figure 10C:
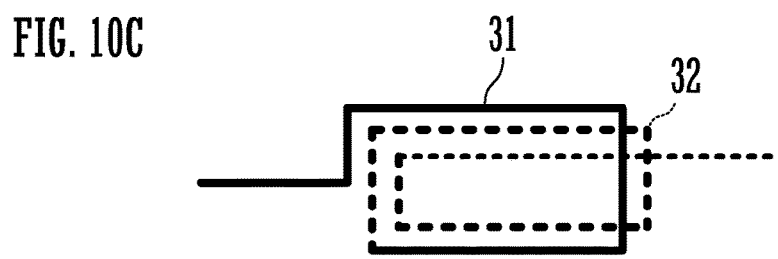
FIG. 10C is a partial plan view showing a conductor pattern of an inductor portion.

The resin base material 12 includes thereon wiring patterns 21 and 22, and the resin base material 14 includes thereon a wiring pattern 23. The first end of the wiring pattern 21 is connected to the outer peripheral end of the conductor pattern 31 of the inductor portion, the inner peripheral end of the conductor pattern 31 is connected to the outer peripheral end of the conductor pattern 32 through the via conductor (interlayer connection conductor), and the inner peripheral end of the conductor pattern 32 is connected to the first end of the wiring pattern 23, and the second end of the wiring pattern 23 is connected to the first end of the wiring pattern 22 through the via conductor. The conductor patterns 31 and 32 are arranged so as not to be continuously overlapped in a plan view. FIG. 10C is a partial plan view showing the conductor pattern of the inductor portion. Other configurations are preferably the same as the configurations shown in FIG. 1B.

In such a configuration, with a slight increase in stray capacitance for the increase in inductance accompanying the increase in the number of layers, the inductor bridge is used as an inductor up to a higher frequency band.

Third Preferred Embodiment

FIG. 11A is a perspective view showing the appearance of an inductor bridge according to a third preferred embodiment of the present invention, and FIG. 11B is an exploded perspective view of the inductor bridge. The inductor bridge 104 is provided with a flexible flat plate-shaped element body 10, a first connector 51, and a second connector 52. As shown in FIG. 11B, the element body 10 is configured by laminating resin base materials 11, 12, 13, and 14. The resin base materials 12 and 13 include an inductor portion defined by spiral conductor patterns 31 and 32. The spiral conductor patterns 31 and 32 are spiral conductor patterns of which the coil axis is oriented in a direction perpendicular or substantially perpendicular to the faces of the resin base materials 12 and 13 (direction perpendicular or substantially perpendicular to the principal surface of the element body 10).

The resin base material 12 includes thereon wiring patterns 21 and 22, and the resin base material 14 includes thereon a wiring pattern 23. The first end of the wiring pattern 21 is connected to the outer peripheral end of the conductor pattern 31 of the inductor portion, the inner peripheral end of the conductor pattern 31 is connected to the outer peripheral end of the conductor pattern 32 through the via conductor (interlayer connection conductor), and the inner peripheral end of the conductor pattern 32 is connected to the first end of the wiring pattern 23, and the second end of the wiring pattern 23 is connected to the first end of the wiring pattern 22 through the via conductor. The outer peripheral ends as well as the inner peripheral ends of the conductor patterns 31 and 32 are connected to each other. In other words, the conductor patterns 31 and 32 are connected in parallel to each other. Other configurations are preferably the same as the configurations shown in FIG. 1B.

With such a configuration, an inductor bridge equipped with an inductor with a low equivalent series resistance is obtained.

Fourth Preferred Embodiment

Figure 12A:
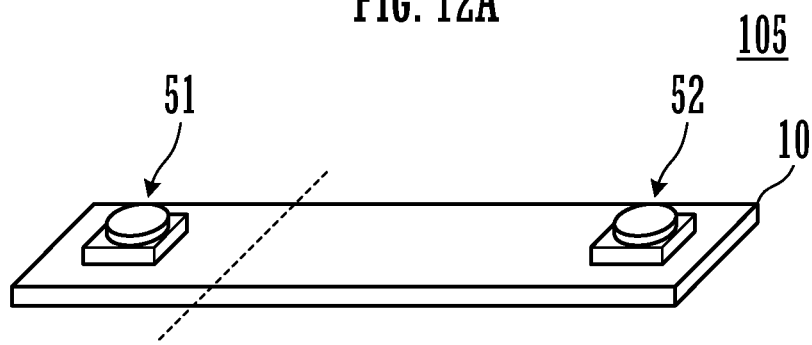
FIG. 12A is a perspective view showing an appearance of an inductor bridge according to a fourth preferred embodiment of the present invention.
Figure 12B:
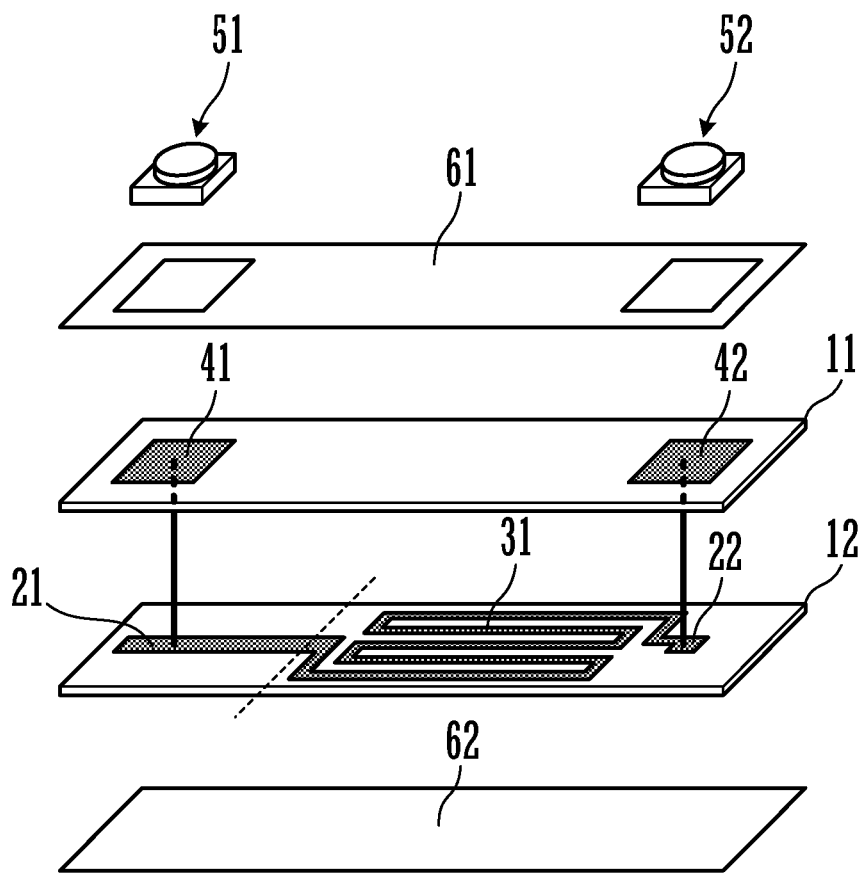
FIG. 12B is an exploded perspective view of the inductor bridge.

FIG. 12A is a perspective view showing the appearance of an inductor bridge according to a fourth preferred embodiment of the present invention, and FIG. 12B is an exploded perspective view of the inductor bridge. The inductor bridge 105 is provided with a flexible flat plate-shaped element body 10, a first connector 51, and a second connector 52. As shown in FIG. 12B, the element body 10 is configured preferably by laminating resin base materials 11 and 12. The resin base material 12 includes an inductor portion defined by a meander line-shaped conductor pattern 31 extending in the shorter direction of the element body.

The resin base material 12 includes thereon wiring patterns 21 and 22. The first end of the wiring pattern 21 is connected to the first end of the conductor pattern 31 of the inductor portion, the second end of the conductor pattern 31 is connected to the first end of the wiring pattern 22, and the second ends of the wiring patterns 21 and 22 are connected to the connector mounting electrodes 41 and 42 through the via conductor. Other configurations are preferably the same as the configurations shown in FIG. 1B.

In FIG. 12A and FIG. 12B, the dashed line indicates a bending position (approximate position). A bending portion is located near the boundary between the position of the inductor portion and the position other than the inductor portion. Since the inductor portion defined by the meander line-shaped conductor pattern 31 has a high rigidity in the longer direction, bending at the position other than the position of the inductor portion becomes easy. Furthermore, with such a configuration, change in inductance by the bending of the element body 10 is significantly reduced or prevented.

It is to be noted that an inductor portion defined by the meander line-shaped conductor pattern of which the lines that are adjacent to each other each extend in the shorter direction of the element body, unlike the conductor pattern of the inductor portion described in the fourth preferred embodiment, enhances the flexibility of the element body in the longer direction. In addition, the amount of the change in inductance with respect to the amount of the bending of the element body is significantly reduced or prevented.

Fifth Preferred Embodiment

Figure 13A:
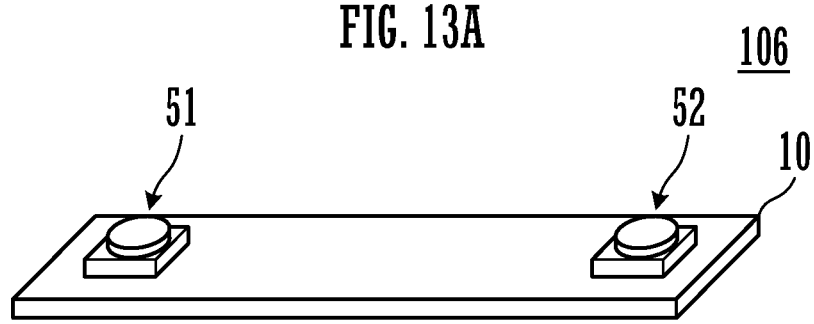
FIG. 13A is a perspective view showing an appearance of an inductor bridge according to a fifth preferred embodiment of the present invention.
Figure 13B:
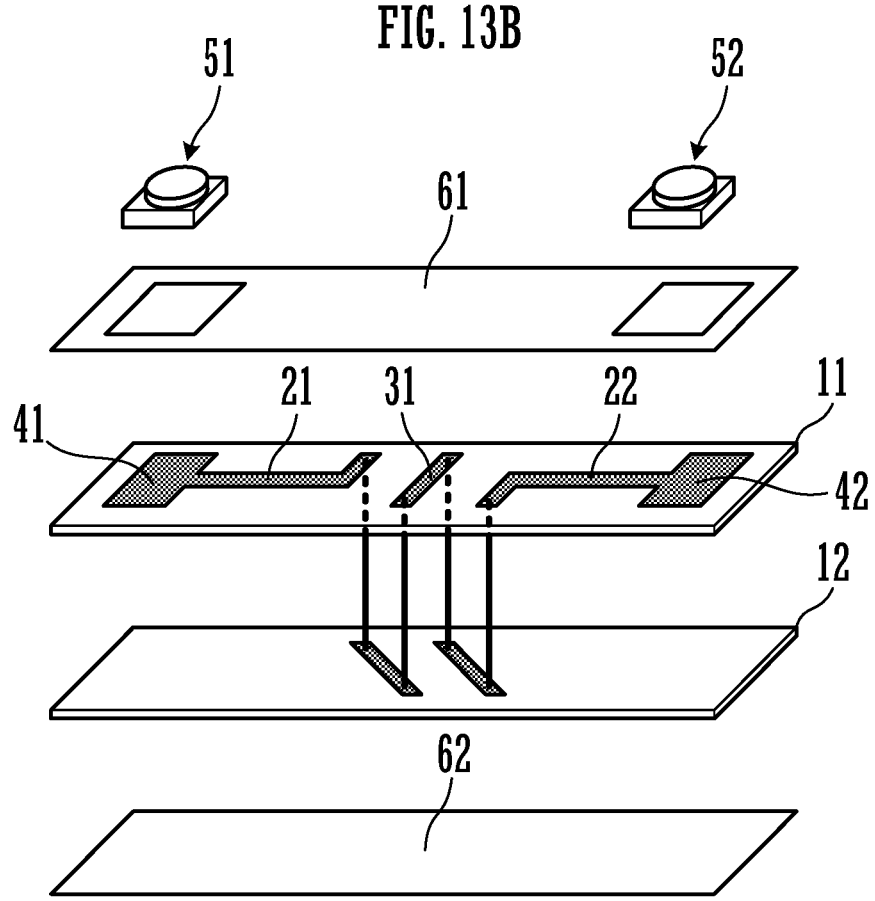
FIG. 13B is an exploded perspective view of the inductor bridge.

FIG. 13A is a perspective view showing the appearance of an inductor bridge according to a fifth preferred embodiment of the present invention, and FIG. 13B is an exploded perspective view of the inductor bridge. The inductor bridge 106 is provided with a flexible flat plate-shaped element body 10, a first connector 51, and a second connector 52. As shown in FIG. 13B, the element body 10 is preferably configured by laminating resin base materials 11 and 12. The resin base materials 11 and 12 include thereon a helical conductor pattern 31 of which the coil axis is oriented in a direction in parallel or substantially parallel to the principal surface of the element body 10.

The resin base material 11 includes thereon wiring patterns 21 and 22. The first end of the wiring pattern 21 is connected to the first end of the conductor pattern 31 of the inductor portion, the second end of the conductor pattern 31 is connected to the first end of the wiring pattern 22, and the second ends of the wiring patterns 21 and 22 are connected to the connector mounting electrodes 41 and 42. Other configurations are preferably the same as the configurations shown in FIG. 1B.

Thus, the helical conductor pattern 31 of which the coil axis is oriented in a direction in parallel or substantially parallel to the principal surface of the element body 10, even if the inductor bridge 106 is adjacent to a conductor, makes it difficult to generate an eddy current in the conductor and significantly reduces the change in inductance by the surrounding environment.

Sixth Preferred Embodiment

FIG. 14A is a perspective view showing the appearance of an inductor bridge according to a sixth preferred embodiment of the present invention, and FIG. 14B is an exploded perspective view of the inductor bridge. The inductor bridge 107 is provided with a flexible flat plate-shaped element body 10, a first connector 51, and a second connector 52. As shown in FIG. 14B, the element body 10 is configured by laminating resin base materials 11, 12, 13, and 14. The resin base materials 12 and 13 include thereon helical conductor patterns 31 and 32 each of which the coil axis is oriented in a direction perpendicular or substantially perpendicular to the principal surface of the element body 10. The resin base material 12 includes an aperture AP, which stores therein a magnetic body core 70 of a ferrite plate. Specifically, the magnetic body core 70 is embedded in the element body 10. Other configurations are preferably the same as the configurations shown in FIG. 1B and FIG. 10B.

Thus, the arrangement of the magnetic body core 70 near the conductor pattern of the inductor portion reduces the size of the inductor portion and thus achieves a small inductor bridge.

Seventh Preferred Embodiment

Figure 15A:
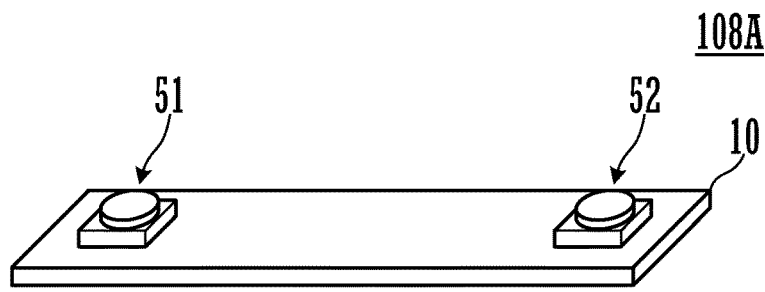
FIG. 15A is a perspective view showing an appearance of an inductor bridge according to a seventh preferred embodiment of the present invention.
Figure 15B:
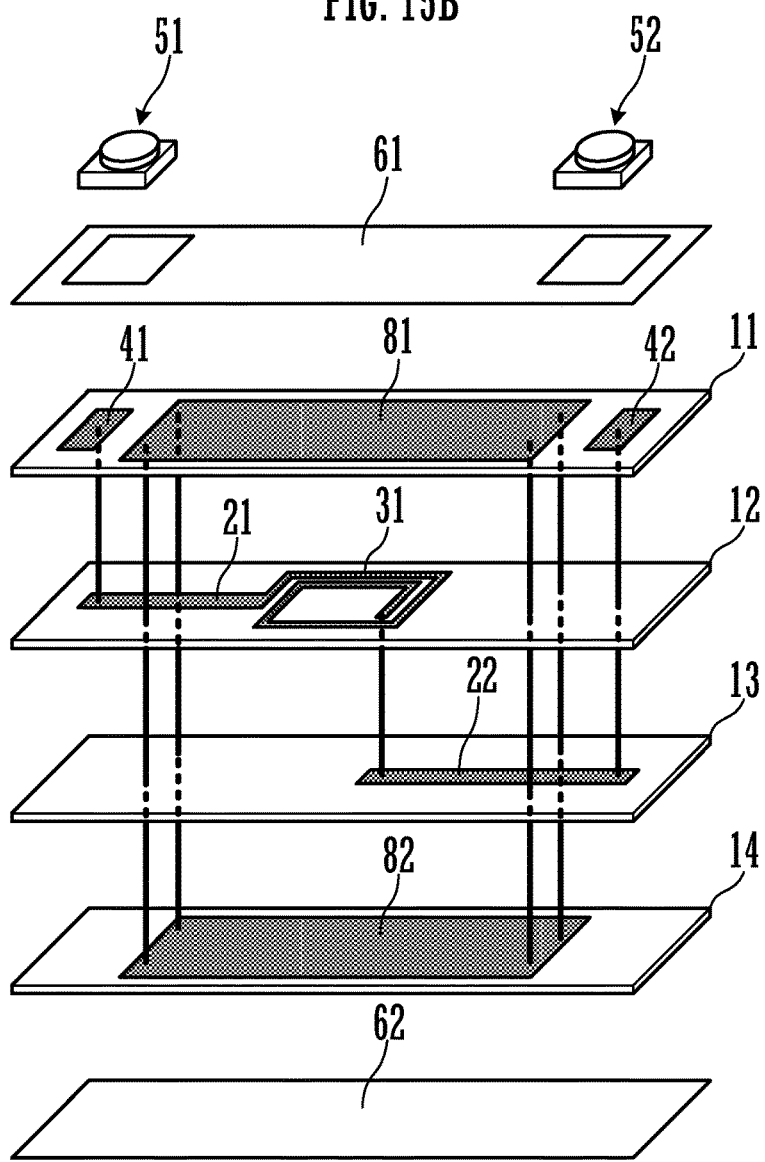
FIG. 15B is an exploded perspective view of the inductor bridge.

FIG. 15A is a perspective view showing the appearance of an inductor bridge according to a seventh preferred embodiment of the present invention, and FIG. 15B is an exploded perspective view of the inductor bridge. The inductor bridge 108A is provided with a flexible flat plate-shaped element body 10, a first connector 51, and a second connector 52. The resin base material includes an inductor portion defined by a spiral conductor pattern 31. The resin base material 12 includes thereon a wiring pattern 21, and the resin base material 13 includes thereon a wiring pattern 22. The first end of the wiring pattern 21 is connected to the outer peripheral end of the conductor pattern 31 of the inductor portion, and the inner peripheral end of the conductor pattern 31 is connected to the first end of the wiring pattern 22 through the via conductor. The resin base material 11 includes thereon connector mounting electrodes 41 and 42 to mount the connectors 51 and 52. These connector mounting electrodes 41 and 42 are connected to the second ends of the wiring patterns 21 and 22 through the via conductor, respectively.

The resin base materials 11 and 14 include thereon shield conductor patterns 81 and 82. In this way, the shield conductor patterns 81 and 82 provided at a position of interposing the inductor portion the shield conductor in a laminating direction electromagnetically shield the inductor portion, which achieves stable characteristics.

It should be noted that the connectors 51 and 52 are coaxial type connectors and include a central conductor that is connected to the connector mounting electrodes 41 and 42, and an outer conductor that is connected to the shield conductor pattern 81.

Figure 16A:
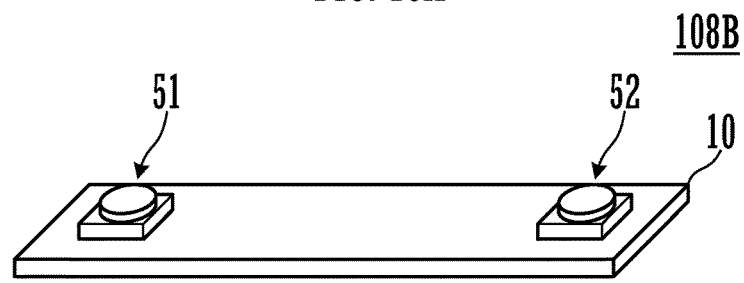
FIG. 16A is a perspective view showing an appearance of another inductor bridge according to the seventh preferred embodiment of the present invention.
Figure 16B:
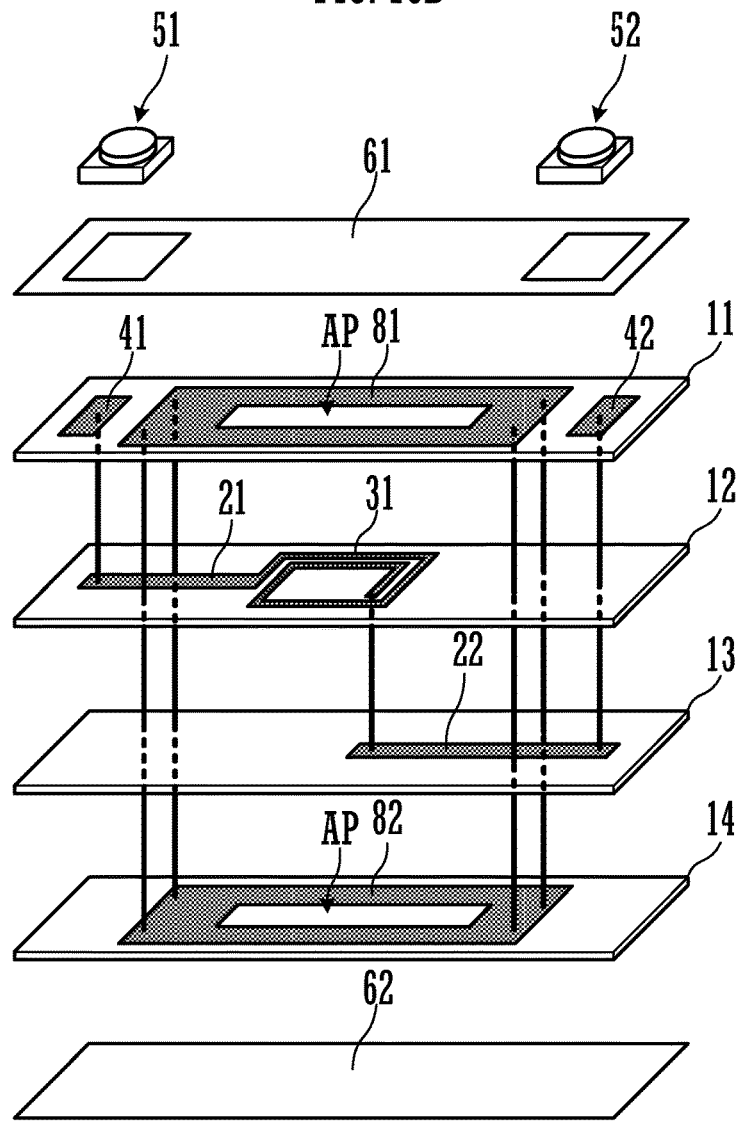
FIG. 16B is an exploded perspective view of the inductor bridge.

FIG. 16A is a perspective view showing the appearance of another inductor bridge 108B according to the seventh preferred embodiment of the present invention, and FIG. 16B is an exploded perspective view of the inductor bridge 108B. The shield conductor patterns 81 and 82 provided in the resin base materials 11 and 14 each include an aperture AP. Other configurations are preferably the same as the configuration of the inductor bridge 108A as shown in FIG. 15A and FIG. 15B. Thus, even if the shield conductor pattern does not continuously expand entirely, the electromagnetic shield effect is obtained. A plurality of apertures AP may be configured to provide a mesh-shaped shield conductor pattern. In addition, the arrangement of the aperture AP at the position corresponding to the inductor portion also equalizes the rigidity of the element body 10.

Eighth Preferred Embodiment

Figure 18:
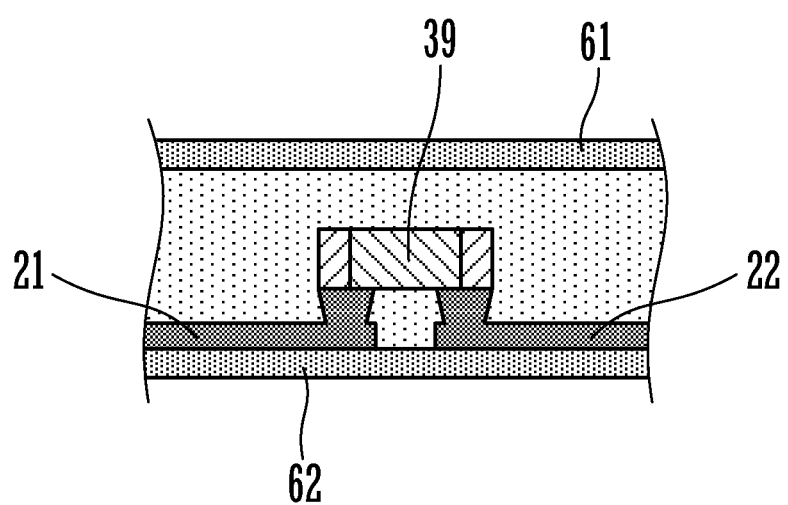
FIG. 18 is a cross sectional view of an inductor portion of an inductor bridge 109.

FIG. 17A is a perspective view showing the appearance of an inductor bridge according to an eighth preferred embodiment of the present invention, and FIG. 17B is an exploded perspective view of the inductor bridge. In addition, FIG. 18 is a cross sectional view of an inductor portion of an inductor bridge 109. The inductor bridge 109 is provided with a flexible flat plate-shaped element body 10, a first connector 51, and a second connector 52. The resin base material 13 includes an inductor portion defined by a chip conductor 39. The resin base material 12 includes an aperture AP in which the chip inductor 39 is stored. The resin base material 13 includes wiring patterns 21 and 22 to which the chip inductor 39 is connected, on the lower surface of the resin base material 13, and the resin base material 11 includes connector mounting electrodes 41 and 42 to mount the connectors 51 and 52, on the upper surface of the resin base material 11. These connector mounting electrodes 41 and 42 are connected to the wiring patterns 21 and 22 through the via conductor, respectively.

In this way, the arrangement of the chip inductor 39 in the center of the element body 10 in both the planar direction and the thickness direction of the element body 10 makes it possible to decrease stress applied to the chip inductor 39 by the bending of the element body 10 and to use the inductor bridge while the flexibility of the element body 10 is maintained. Moreover, the inductor bridge is used as an inductor bridge having a constant thickness.

Ninth Preferred Embodiment

Figure 19:
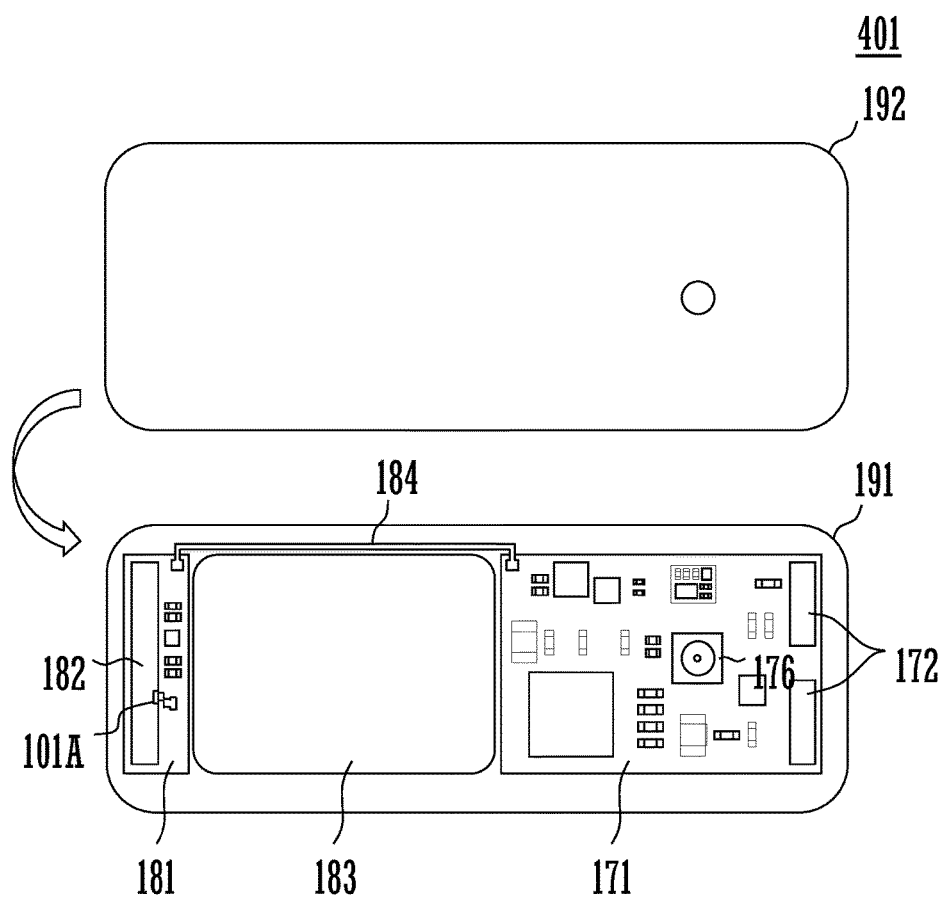
FIG. 19 is a view showing a structure of an inside of a housing of an electronic device 401 according to a ninth preferred embodiment of the present invention, that is, a plan view showing a state in which an upper housing 191 and a lower housing 192 are separated from each other to expose the inside.

FIG. 19 is a view showing a structure of an inside of a housing of an electronic device 401 according to a ninth preferred embodiment of the present invention, that is, a plan view showing a state in which an upper housing 191 and a lower housing 192 are separated from each other to expose the inside. The electronic device 401 is, for example, a portable telephone terminal or a tablet PC, that is, a device provided with the inductor bridge 101A as shown in FIG. 1A and FIG. 1B.

The upper housing 191 stores therein printed wiring boards 171 and 181, a battery pack 183, and the like. The printed wiring board 171 also includes a UHF band antenna 172, a camera module 176, and the like. Similarly, the printed wiring board 181 includes a UHF band antenna 182. The printed wiring board 171 and the printed wiring board 181 are connected to each other through a cable 184.

The printed wiring board 181 and the antenna 182 are connected to each other through the inductor bridge 101A. The configuration of the inductor bridge 101A is as shown in FIG. 1A and FIG. 1B.

It is to be noted that the inductor bridge may be used in place of the cable 184 that connects the printed wiring boards 171 and 181.

Tenth Preferred Embodiment

Figure 20:
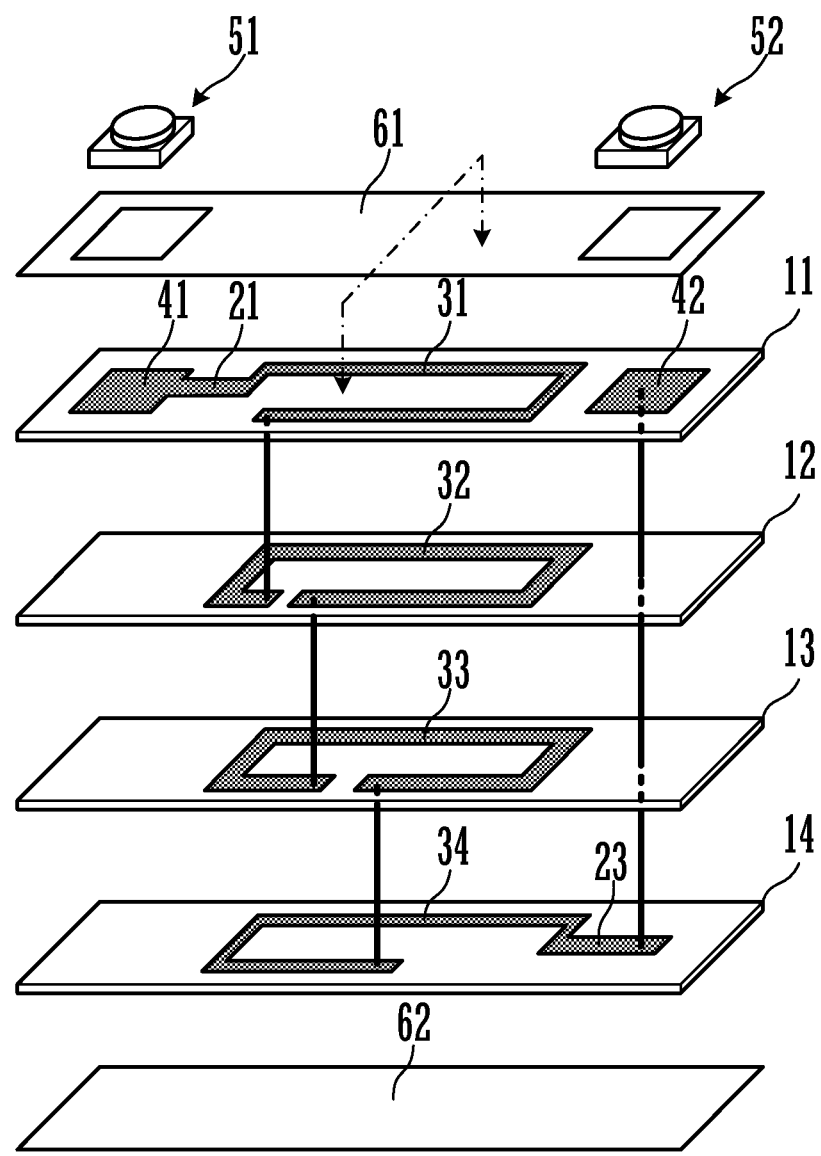
FIG. 20 is an exploded perspective view of an inductor bridge 110 according to a tenth preferred embodiment of the present invention.

FIG. 20 is an exploded perspective view of an inductor bridge 110 according to a tenth preferred embodiment of the present invention. The inductor bridge 110 is provided with a flexible flat plate-shaped element body, a first connector 51, and a second connector 52. The element body is configured by laminating resin base materials 11, 12, 13, and 14.

Figure 21:
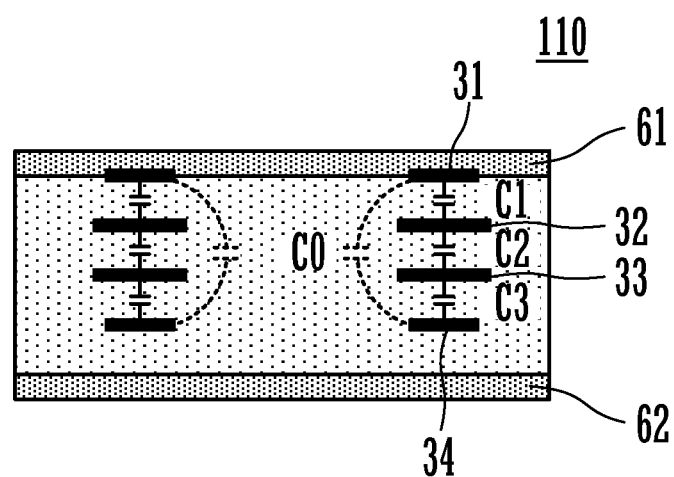
FIG. 21 is a cross sectional view of the inductor bridge 110, that is, a cross sectional view showing a dashed line portion in FIG. 20.

FIG. 21 is a cross sectional view of the inductor bridge 110, that is, a cross sectional view showing a dashed line portion in FIG. 20.

The resin base materials 11 to 14 include an inductor portion defined by conductor patterns 31 to 34. The conductor patterns 31 to 34 preferably are rectangular or substantially rectangular helical conductor patterns each of which the coil axis is oriented in a direction perpendicular or substantially perpendicular to the face of the resin base materials 11 to 14 (direction perpendicular or substantially perpendicular to the principal surface of the element body). The end of the conductor pattern 31 is connected to the first end of the wiring pattern 21, and the end of the conductor pattern 34 is connected to the first end of the wiring pattern 23.

The resin base material 11 includes thereon connector mounting electrodes 41 and 42 to mount the connectors 51 and 52. The connector mounting electrode 41 is connected to the second end of the wiring pattern 21, and the connector mounting electrode 42 is connected to the second end of the wiring pattern 23 through the via conductor.

The conductor patterns 31 to 34 are provided at positions of facing each other between layers. Specifically, the plurality of conductor patterns 31 to 34, when being viewed in a plan view in a laminating direction, are overlapped with each other. Of the plurality of conductor patterns, a line width of the conductor pattern 31 that is close to the first connector 51 (first connecting portion) on a path and a line width of the conductor pattern 34 that is close to the second connector 52 (second connecting portion) on a path are thinner than the line widths of the conductor patterns 32 and 33 of the other layers.

As shown in FIG. 21, since the conductor patterns 31 to 34 are provided at the positions of facing each other between the layers, capacitance C1, C2, and C3 is generated between the conductor patterns that are adjacent to each other in the laminating direction. The line widths of the conductor patterns 31 and 34 are thinner than the line widths of the conductor patterns 32 and 33, and, since the conductor patterns 32 and 33 are interposed between the conductor pattern 31 and the conductor pattern 34, capacitance C0 to be generated between the conductor pattern 31 and the conductor pattern 34 is small. In addition, the capacitance satisfies a relationship of C1<C2 and C3<C2.

Figure 22:
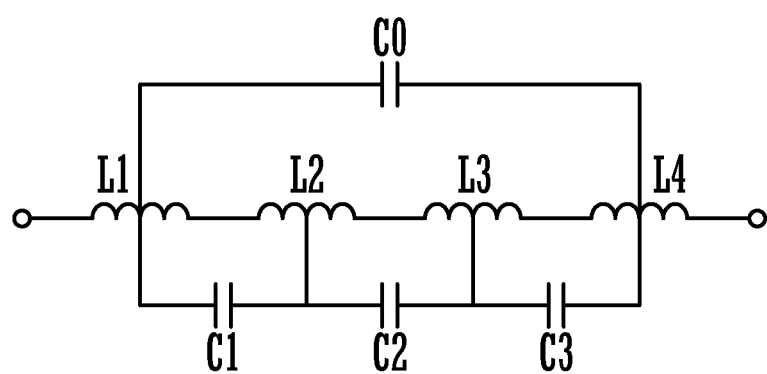
FIG. 22 is an equivalent circuit diagram of the inductor bridge 110.

FIG. 22 is an equivalent circuit diagram of the inductor bridge 110. As shown in FIG. 22, inductors L1, L2, L3, and L4 are equivalent to the inductance components of the conductor patterns 31, 32, 33, and 34, capacitors C1, C2, and C3, as shown in FIG. 21, are equivalent to capacitance components generated between the layers among the conductor patterns 31 to 34, and the capacitor C0 is equivalent to a capacitance component generated between the conductor pattern 31 and the conductor pattern 34. It should be noted that the resistance component of the conductor pattern is omitted in the drawing.

While the self-resonant frequency of the inductor bridge 110 is determined by the inductance components mainly indicated as the inductors L1 to L4 and the capacitance components mainly indicated as the capacitors C0 to C3, of the capacitance generated in each portion, the capacitance of the capacitor C0 to which a large voltage is applied (of which the potential difference between the conductor patterns is large) predominantly determines a self-resonant frequency. According to preferred embodiments of the present invention, since C0 is effectively reduced or prevented, as described above, the self-resonant frequency is increased.

Figure 23:
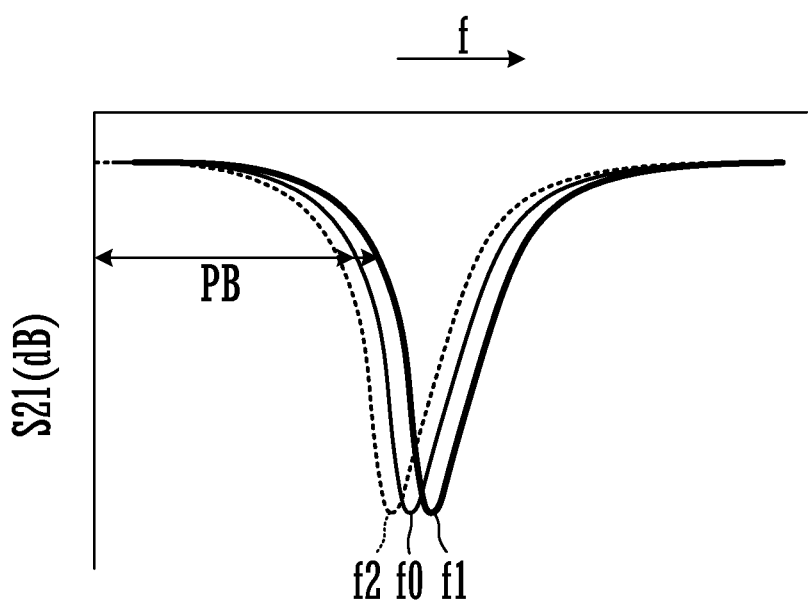
FIG. 23 is a view showing a change in self-resonant frequency.

FIG. 23 is a view showing a change in self-resonant frequency. When the line widths of the conductor patterns 31 to 34 as shown in FIG. 20 and FIG. 21 are equal or substantially equal to each other, the self-resonant frequency is a frequency as indicated by f0. According to the present preferred embodiment of the present invention, the line widths of the conductor patterns 31 and 34 are thinner than the line widths of the conductor patterns 32 and 33, so that the self-resonant frequency becomes higher, as indicated by f1. On the condition that the line widths of the conductor patterns 31 and 34 are thicker than the line widths of conductor patterns 32 and 33, the self-resonant frequency becomes lower, as indicated by f2. According to the present preferred embodiment of the present invention, the line widths of the conductor patterns 31 and 34 are thinner than the line widths of the conductor patterns 32 and 33, so that the self-resonant frequency becomes higher and the pass band width PB is wider.

It is to be noted that even if the line widths of the conductor patterns 31 and 34 are thinner, the line widths of the other conductor patterns 32 and 33 is thicker, the increase in direct current resistance (DCR) in the inductor portion is significantly reduced or prevented.

Eleventh Preferred Embodiment

Figure 24:
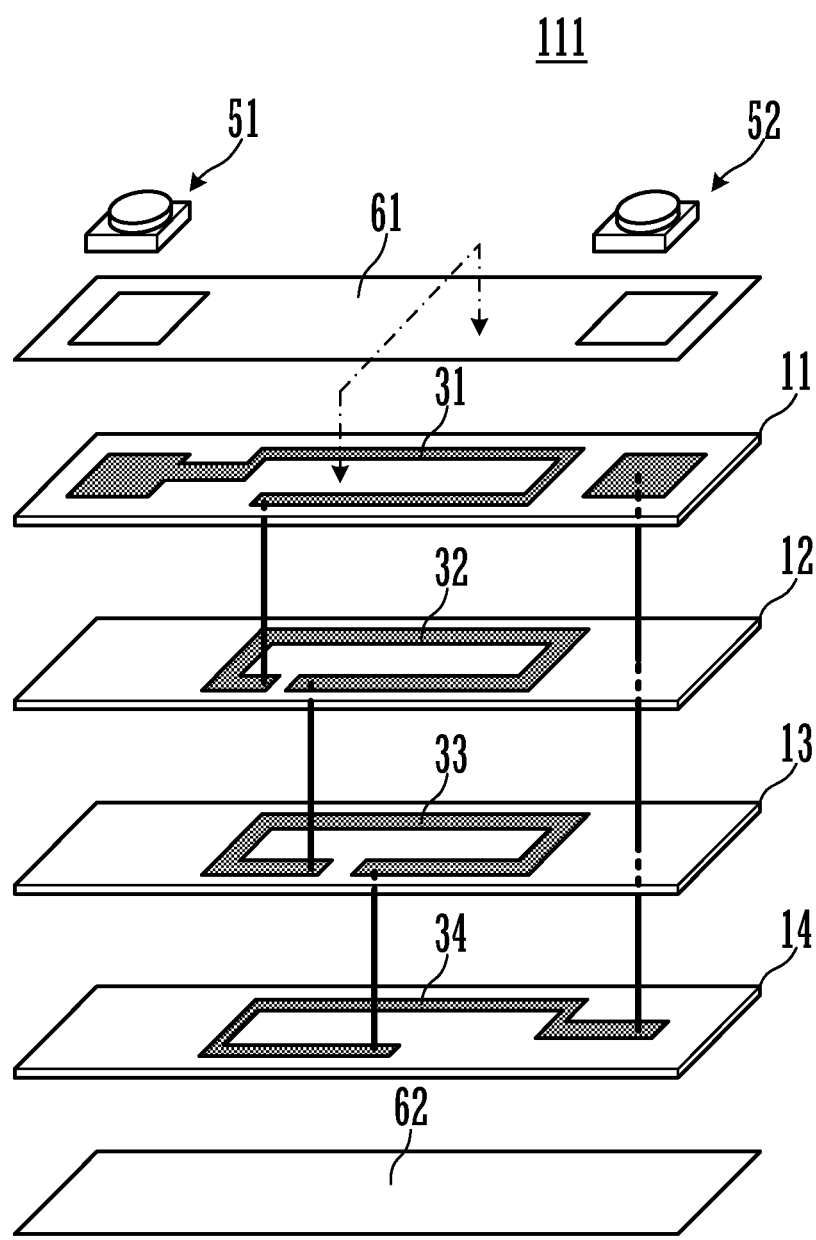
FIG. 24 is an exploded perspective view of an inductor bridge 111 according to an eleventh preferred embodiment of the present invention.

FIG. 24 is an exploded perspective view of an inductor bridge 111 according to an eleventh preferred embodiment of the present invention. The inductor bridge 111 is provided with a flexible flat plate-shaped element body, a first connector 51, and a second connector 52. The element body is configured by laminating resin base materials 11, 12, 13, and 14.

Figure 25:
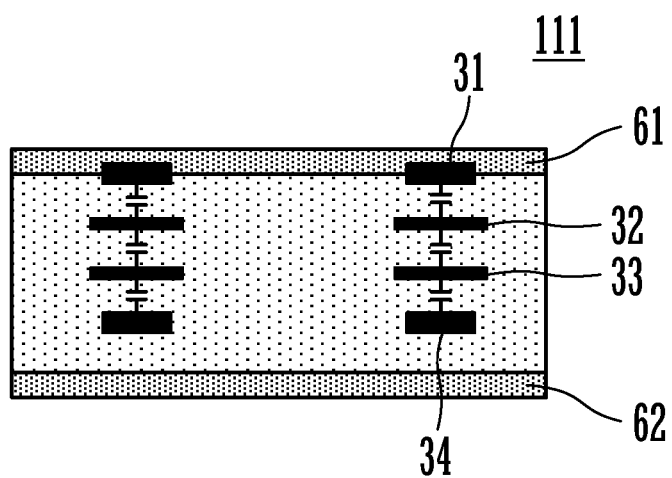
FIG. 25 is a cross sectional view of the inductor bridge 111, that is, a cross sectional view showing a dashed line portion in FIG. 24.

FIG. 25 is a cross sectional view of the inductor bridge 111, that is, a cross sectional view showing a dashed line portion in FIG. 24.

The inductor bridge 111 is different in thickness of the conductor patterns 31 and 34 from the inductor bridge as shown in FIG. 20 and FIG. 21. According to the present preferred embodiment of the present invention, as the line widths of the conductor patterns 31 and 34 are thinner, the conductor thickness of the conductor patterns 31 and 34 are thicker, which prevents direct current resistance (DCR) from increasing. With the configuration, even if the line widths of the conductor patterns 31 and 34 are thinner, the DCR is significantly reduced so as to be quite low.

Twelfth Preferred Embodiment

Figure 26:
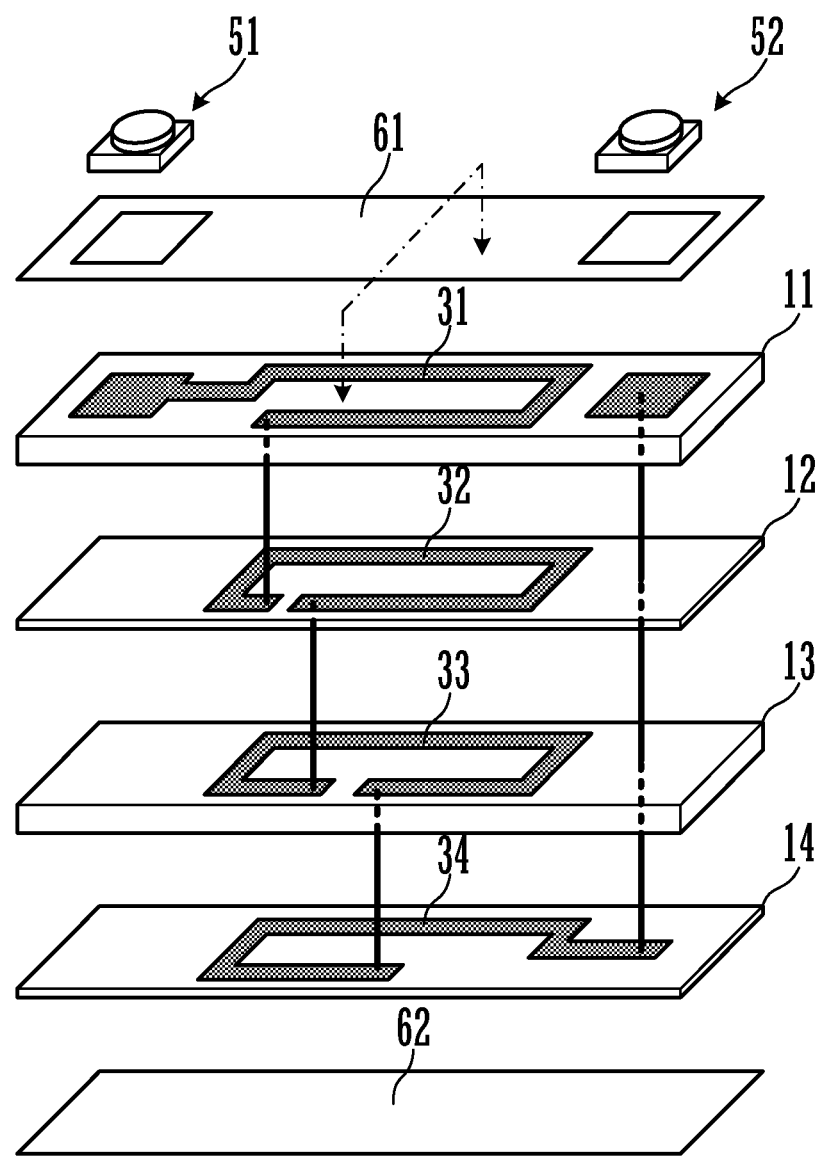
FIG. 26 is an exploded perspective view of an inductor bridge 112 according to a twelfth preferred embodiment of the present invention.

FIG. 26 is an exploded perspective view of an inductor bridge 112 according to a twelfth preferred embodiment of the present invention. The inductor bridge 112 is provided with a flexible flat plate-shaped element body, a first connector 51, and a second connector 52. The element body is configured by laminating resin base materials 11, 12, 13, and 14.

Figure 27:
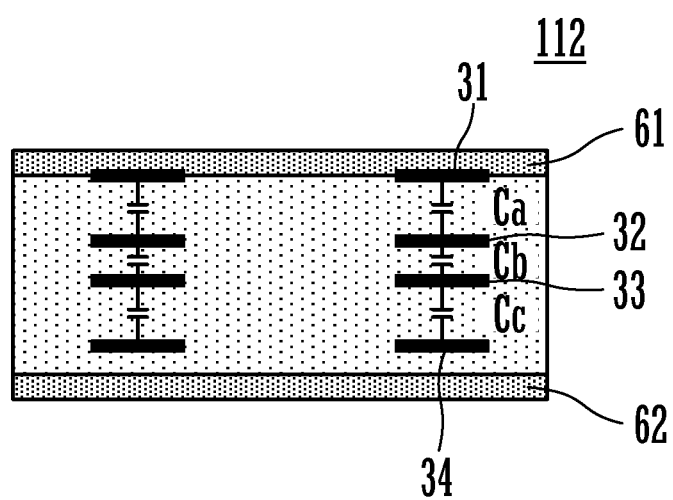
FIG. 27 is a cross sectional view of the inductor bridge 112, that is, a cross sectional view showing a dashed line portion in FIG. 26.

FIG. 27 is a cross sectional view of the inductor bridge 112, that is, a cross sectional view showing a dashed line portion in FIG. 26.

In the present preferred embodiment of the present invention, while the line widths of the conductor patterns 31 to 34 of the inductor portion are equal or substantially equal to each other, the distances between the layers of the conductor patterns 31 to 34 of the inductor portion are not equal to each other. In other words, the distance between the conductor pattern 31 and the conductor pattern 32 is larger than the distance between the conductor pattern 32 and the conductor pattern 33. Similarly, the distance between the conductor pattern 33 and the conductor pattern 34 is larger than the distance between the conductor pattern 32 and the conductor pattern 33.

Figure 28:
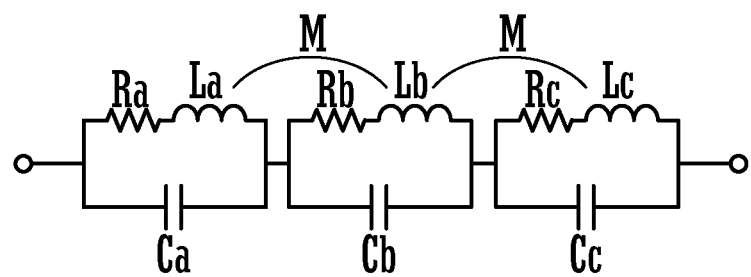
FIG. 28 is an equivalent circuit diagram of the inductor bridge 112.

FIG. 28 is an equivalent circuit diagram of the inductor bridge 112. In FIG. 28, an inductor La and a resistance Ra are equivalent to the inductance component and the resistance component of the conductor patterns 31 and 32. Similarly, an inductor Lb and a resistance Rb are equivalent to the inductance component and the resistance component of the conductor patterns 32 and 33, and an inductor Lc and a resistance Rc are equivalent to the inductance component and the resistance component of the conductor patterns 33 and 34. A mutual inductance M is generated between the inductors La and Lb and between the inductors Lb and Lc, respectively. In addition, a capacitor Ca is equivalent to a capacitance component that is generated between the conductor patterns 31 and 32. Similarly, a capacitor Cb is equivalent to a capacitance component that is generated between the conductor pattern 32 and the conductor pattern 33, and a capacitor Cc is equivalent to a capacitance component that is generated between the conductor pattern 33 and the conductor pattern 34.

Since the distance between the conductor pattern 31 and the conductor pattern 32 and the distance between the conductor pattern 33 and the conductor pattern 34 are larger than the distance between the conductor pattern 32 and the conductor pattern 33, the capacitance Ca, Cb, and Cc satisfies a relationship of (Ca, Cc)<Cb.

The simulation of the above described configuration has revealed that, compared to a case in which the distances between the layers of the conductor patterns 31 to 34 are equal or substantially equal to each other, the self-resonant frequency increases. Thus, among the plurality of conductor patterns, the distance between the conductor patterns 31 and 34 close to the first connector 51 and the second connector 52 on a path and between the conductor patterns of adjacent layers that are adjacent to the conductor patterns 31 and 34 is larger than the distance between the conductor patterns of other adjacent layers, so that the pass band width of the inductor bridge is wider.

It should be noted that while, in the tenth preferred embodiment, the eleventh preferred embodiment, and the twelfth preferred embodiment of the present invention, the conductor pattern that defines the inductor portion preferably is four-layered, the conductor pattern may also be three-layered, or five or more-layered, for example.

Thirteenth Preferred Embodiment

Figure 29A:
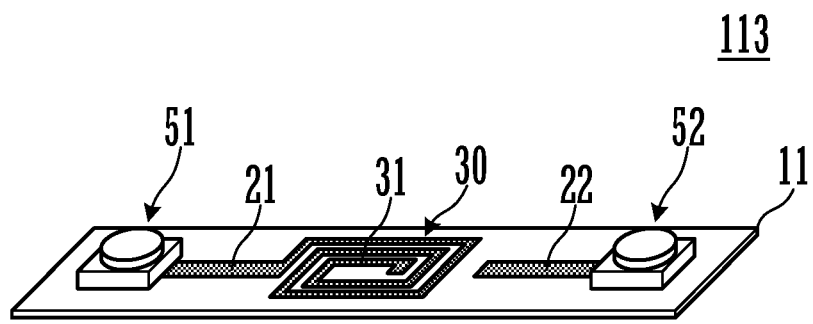
FIG. 29A and FIG. 29B are perspective views of an inductor bridge 113 according to a thirteenth preferred embodiment of the present invention.
Figure 29B:
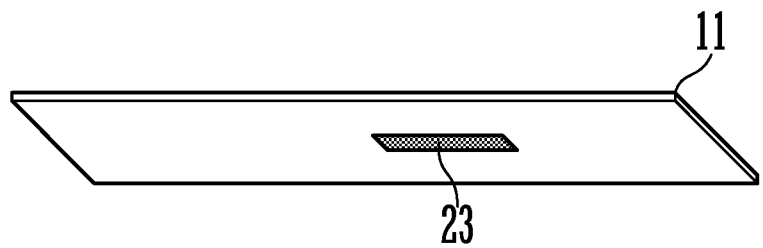

FIG. 29A and FIG. 29B are perspective views of an inductor bridge 113 according to a thirteenth preferred embodiment of the present invention. FIG. 29A is a perspective view in which the upper surface is viewed, and FIG. 29B is a perspective view in which the lower surface is viewed. The resin base material 11 includes a spiral conductor pattern 31 and wiring patterns 21 and 22 on the upper surface of the resin base material 11 and includes a wiring pattern 23 on the lower surface of the resin base material 11. The first end of the wiring pattern 23 is connected to the inner peripheral end of the spiral conductor pattern 31 through the via conductor, and the second end of the wiring pattern 23 is connected to the end portion of the wiring pattern 22 through the via conductor.

While, in the example shown in FIG. 1A and FIG. 1B, the conductor pattern 31 and the wiring patterns 21 and 22 are provided on two resin base materials, like the example shown in FIG. 29A and FIG. 29B, various conductor patterns may be provided on the one-layer resin base material 11. The outermost surface includes thereon a resist layer to protect the conductor patterns, as needed.

According to the present preferred embodiment of the present invention, a substrate of which the opposite surfaces are coated with a metal foil is used and defined by one layer, which eliminates the laminating step and the press-bonding step, that is, simplifies the processing steps.

Fourteenth Preferred Embodiment

Figure 30:
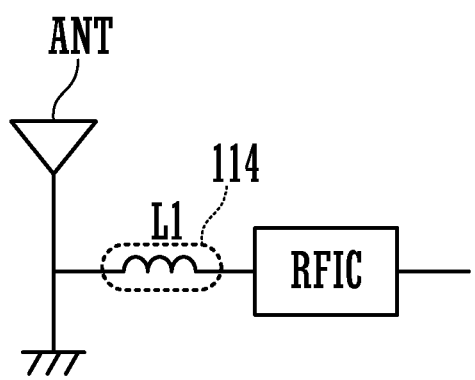
FIG. 30 is a circuit diagram of a high frequency circuit equipped with an inductor bridge and an antenna according to a fourteenth preferred embodiment of the present invention.

FIG. 30 is a circuit diagram of a high frequency circuit equipped with an inductor bridge and an antenna according to a fourteenth preferred embodiment of the present invention. In this example, an inductor bridge 114 is used as the inductor L1 provided in the feed line of the antenna ANT.

Figure 31:
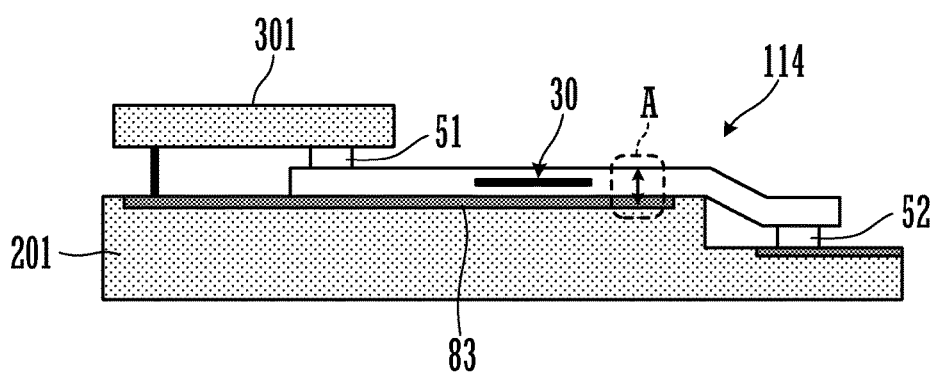
FIG. 31 is a view showing a mounting (arranging) structure of the antenna ANT and the inductor bridge 114 shown in FIG. 30.

FIG. 31 is a view showing a mounting (arranging) structure of the antenna ANT and the inductor bridge 114 shown in FIG. 30.

The antenna substrate 301 includes thereon an antenna element pattern. The first connector 51 of the inductor bridge 114 is connected to a predetermined position of the antenna element pattern. The second connector 52 of the inductor bridge 114 is connected to a connecting portion provided on the upper surface of the mother substrate 201.

The mother substrate 201 that is close to the inductor bridge 114 includes thereon a metal pattern (such as a ground conductor pattern and a wiring pattern connected to an RFIC) 83. The metal pattern 83 is connected to a predetermined position of the antenna element pattern of the antenna substrate 301.

In FIG. 31, since a potential difference is likely to occur between the wiring pattern between the inductor portion 30 of the inductor bridge 114 and the second connector 52, and the metal pattern 83 (region indicated as A in FIG. 31), the parasitic capacitance generated in the region is preferably be small.

Figure 32A:
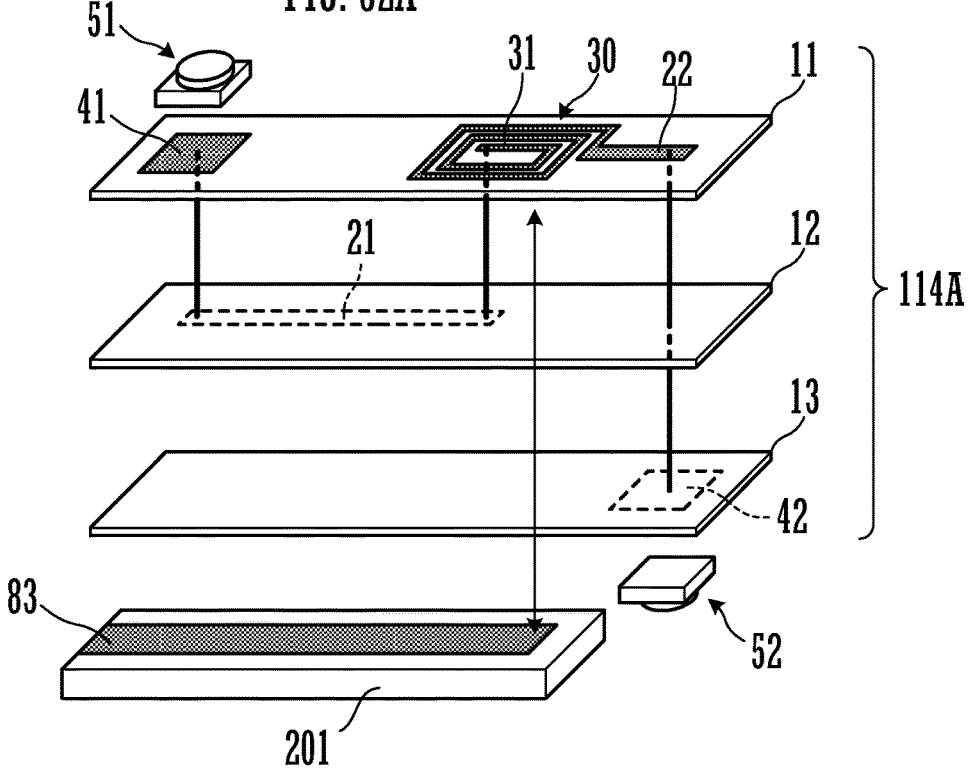
FIG. 32A and FIG. 32B are exploded perspective views showing a mounting structure of the inductor bridge 114 shown in FIG. 31, and a positional relationship between the inductor bridge 114 and a metal pattern 83.
Figure 32B:
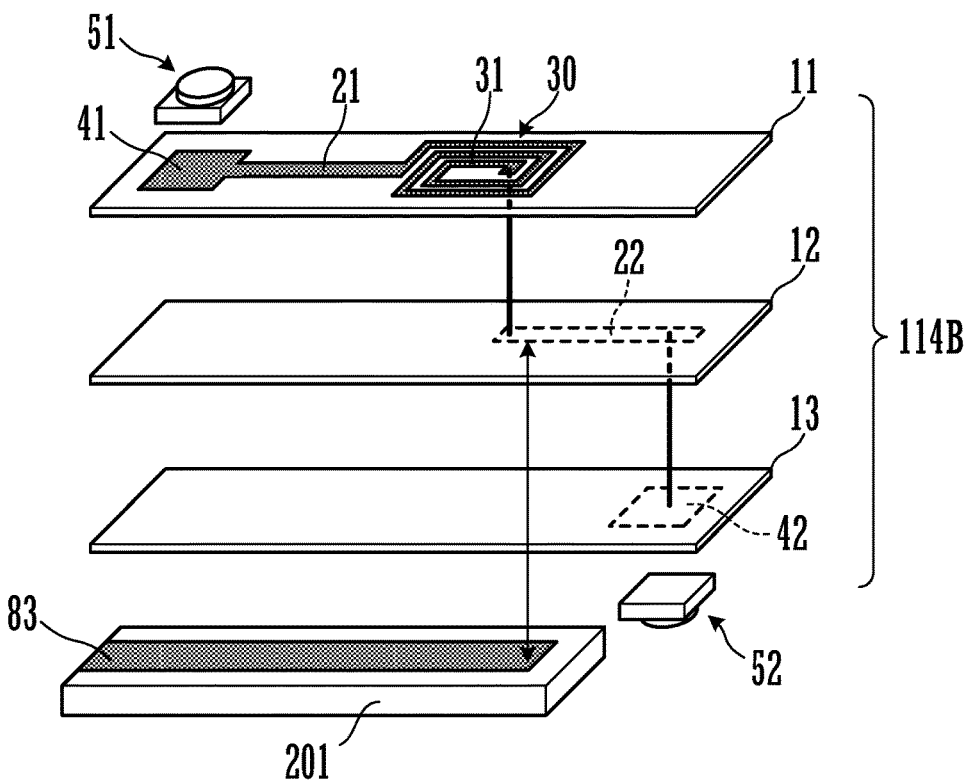

FIG. 32A and FIG. 32B are exploded perspective views showing the mounting structure of the inductor bridge 114 shown in FIG. 31, and a positional relationship between the inductor bridge 114 and the metal pattern 83. In FIG. 32A and FIG. 32B, since the structures of the inductor bridges are different from each other, different reference numerals 114A and 114B are used to identify the inductor bridges, respectively.

In the both structures shown in FIG. 32A and FIG. 32B, the resin base materials 11, 12, and 13 include thereon a spiral conductor pattern 31, wiring patterns 21 and 22, and connector mounting electrodes 41 and 42.

In the example shown in FIG. 32B, in the inductor bridge 114B, the wiring pattern 22 on the side of the second connector 52 to which an RFIC is connected is provided on a layer closer to the metal pattern 83 (planar conductor) than the wiring pattern 21 on the side of the first connector 51. The connector mounting electrode 41 and the metal pattern 83 have the same electric potential, and the parasitic capacitance generated between the wiring pattern 22 and the metal pattern 83 is large. Therefore, the influence on the antenna characteristics is comparatively large.

In contrast, in the example shown in FIG. 32A, in the inductor bridge 114A, the resin base material 11 includes thereon a spiral conductor pattern 31, a wiring pattern 22, and a connector mounting electrode 41. The resin base material 12 includes thereon a wiring pattern 21. The resin base material 13 includes thereon a connector mounting electrode 42.

According to the mounting structure of the inductor bridge shown in FIG. 32A, the wiring pattern 22 on the side of the second connector 52 to which an RFIC is connected and the conductor pattern 31 of the inductor portion 30 are provided on a layer farther away from the metal pattern 83 (planar conductor) than the wiring pattern 21 on the side of the first connector 51. Therefore, the parasitic capacitance generated between the wiring pattern 22 and the conductor pattern 31, and the metal pattern 83 is small, and the influence on the antenna characteristics is small.

Fifteenth Preferred Embodiment

Figure 33:
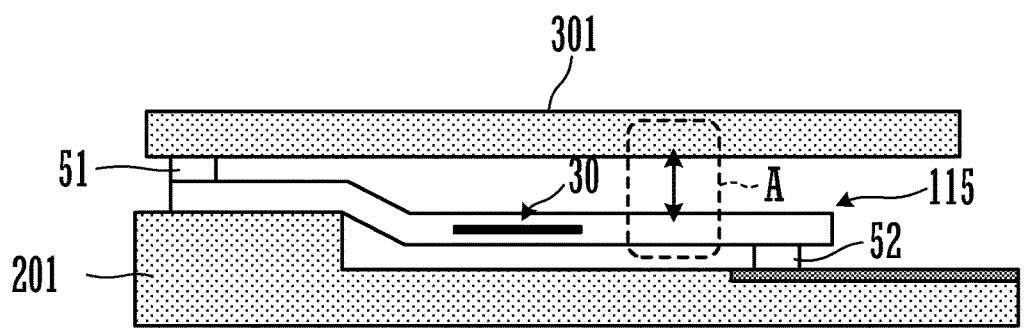
FIG. 33 is a view showing a structure of a high frequency circuit equipped with an inductor bridge 115 and an antenna substrate 301 according to a fifteenth preferred embodiment of the present invention.

FIG. 33 is a view showing a structure of a high frequency circuit equipped with an inductor bridge 115 and an antenna substrate 301 according to a fifteenth preferred embodiment of the present invention. In this example, the inductor bridge 115 is preferably used as the feed line of the antenna. In FIG. 33, since the potential difference is large between the conductor pattern connected to the second connector 52 away from the first connector connected to the antenna substrate 301, and the antenna substrate 301 (region indicated as A in FIG. 33), the parasitic capacitance generated in the portion is preferably small.

Figure 34A:
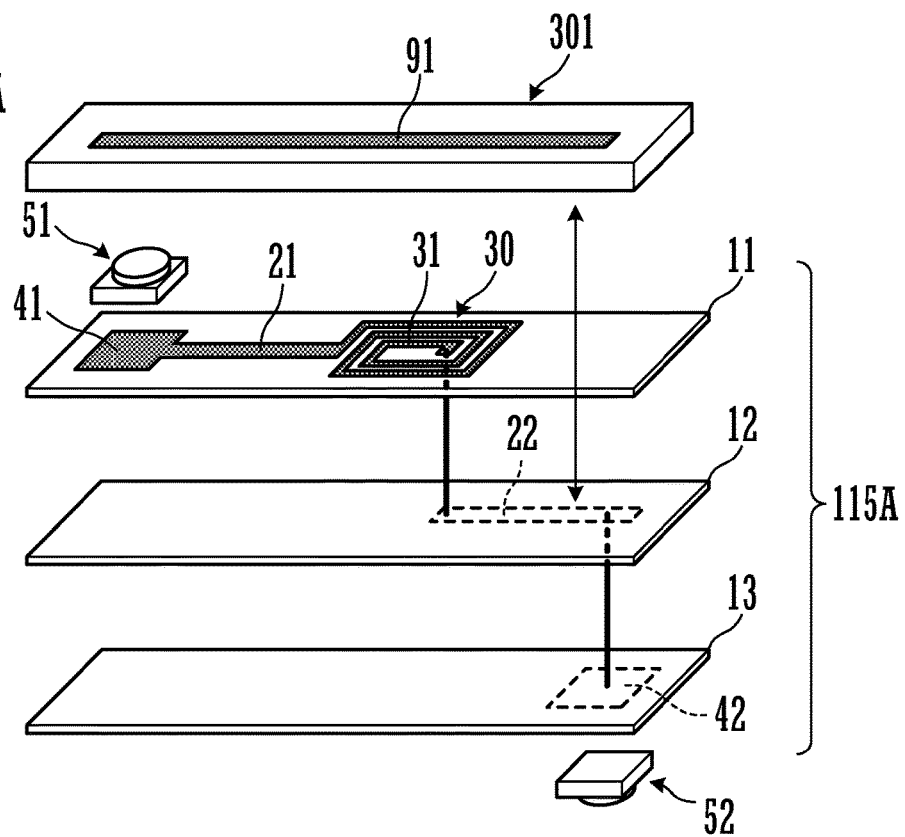
FIG. 34A and FIG. 34B are exploded perspective views showing a mounting structure of the inductor bridge 115 shown in FIG. 33, and a positional relationship between the inductor bridge 115 and the antenna substrate 301.
Figure 34B:
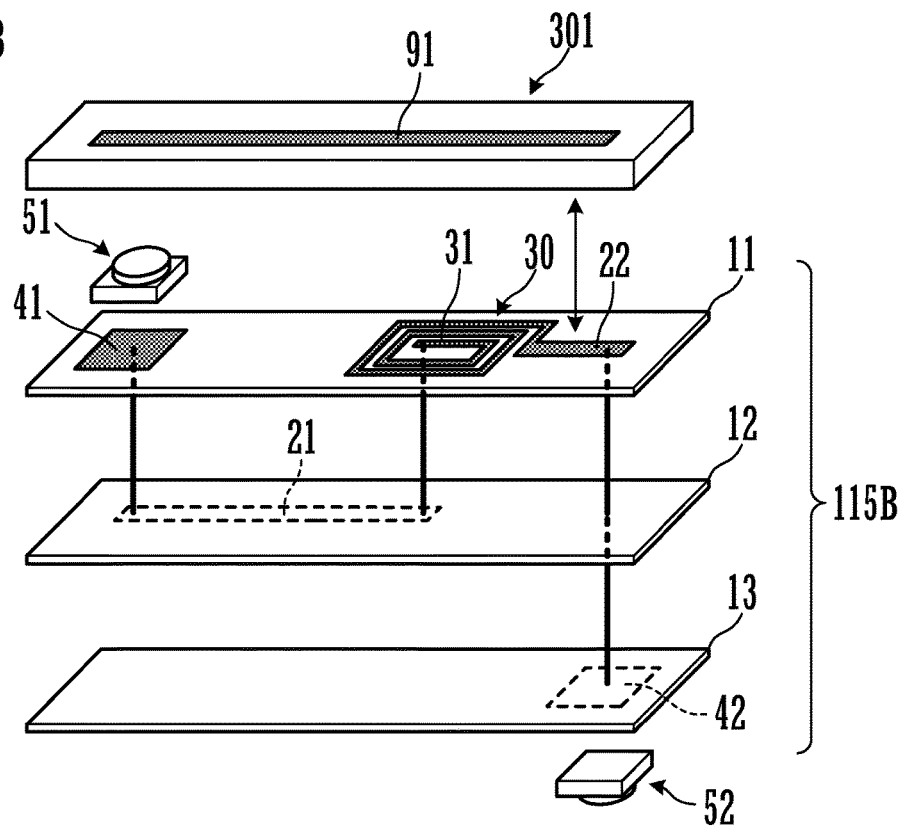

FIG. 34A and FIG. 34B are exploded perspective views showing a mounting structure of the inductor bridge 115 shown in FIG. 33, and a positional relationship between the inductor bridge 115 and the antenna substrate 301. In FIG. 34A and FIG. 34B, since the structures of the inductor bridges are different from each other, different reference numerals 115A and 115B are used to identify the inductor bridges, respectively.

In the both structures shown in FIG. 34A and FIG. 34B, the resin base materials 11, 12, and 13 include thereon a spiral conductor pattern 31, wiring patterns 21 and 22, and connector mounting electrodes 41 and 42. The first connector 51 is connected to the end portion of the antenna element pattern 91 of the antenna substrate.

In the example shown in FIG. 34B, in the inductor bridge 115B, the wiring pattern 22 on the side of the second connector 52 that faces the vicinity of the open end of the antenna element pattern 91 is provided on a layer closer to the antenna element pattern 91 than the wiring pattern 21 on the side of the first connector 51. Therefore, the parasitic capacitance generated between the wiring pattern 22 and the antenna element pattern 91 is large, and the influence on the antenna characteristics is comparatively large.

In contrast, in the example shown in FIG. 34A, in the inductor bridge 115A, the wiring pattern 22 on the side of the second connector 52 that faces the vicinity of the open end of the antenna element pattern 91 is located on a layer farther away from the antenna element pattern 91 than the wiring pattern 21 on the side of the first connector 51. Therefore, the parasitic capacitance generated between the wiring pattern 22 and the antenna element pattern 91 is small, and the influence on the antenna characteristics is small.

Sixteenth Preferred Embodiment

Figure 35:
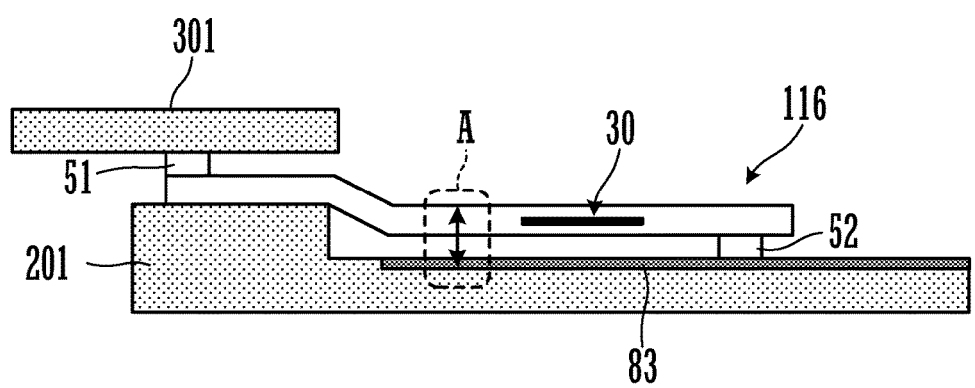
FIG. 35 is a view showing a structure of a high frequency circuit equipped with an inductor bridge 116, an antenna substrate 301, and a mother substrate 201, according to a sixteenth preferred embodiment of the present invention.

FIG. 35 is a view showing a structure of a high frequency circuit equipped with an inductor bridge 116, the antenna substrate 301, and the mother substrate 201, according to a sixteenth preferred embodiment of the present invention. In this example, the inductor bridge 116 is preferably used as the feed line of the antenna. In FIG. 35, since the second connector 52 is connected to the metal pattern 83 and the potential difference is large between the conductor pattern connected to the first connector 51 connected to the antenna substrate 301, and the metal pattern 83 of the mother substrate 201 (region indicated as A in FIG. 35), the parasitic capacitance generated in the portion is preferably small.

Figure 36A:
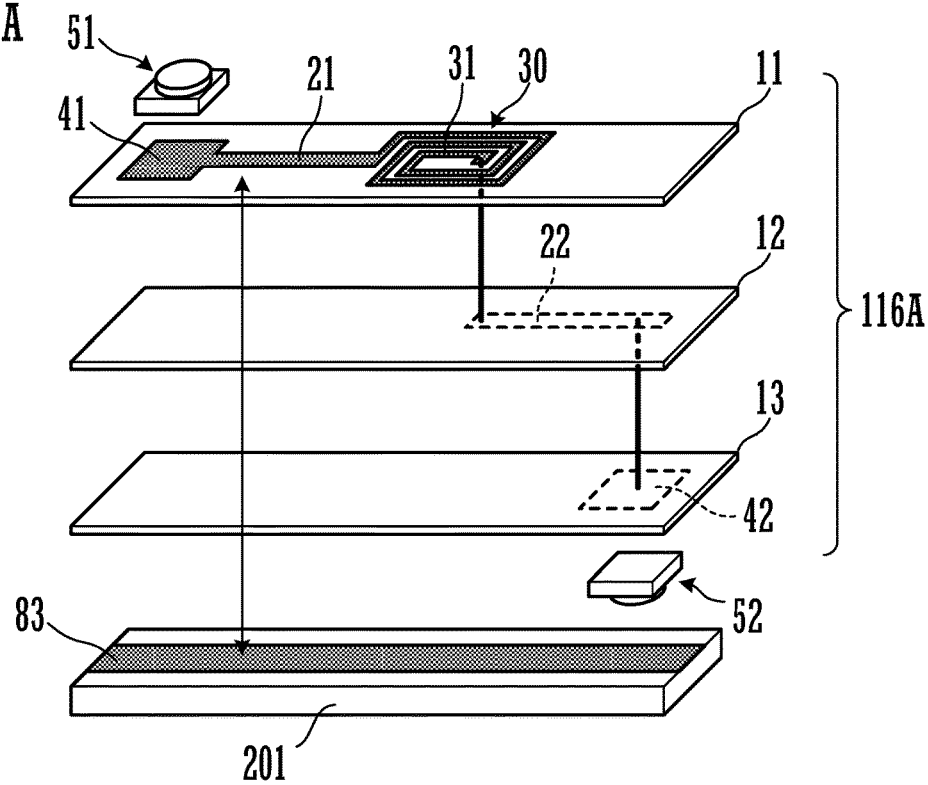
FIG. 36A and FIG. 36B are exploded perspective views showing a mounting structure of the inductor bridge 116 shown in FIG. 35, and a positional relationship between the inductor bridge 116 and the metal pattern 83 of the mother substrate 201.
Figure 36B:
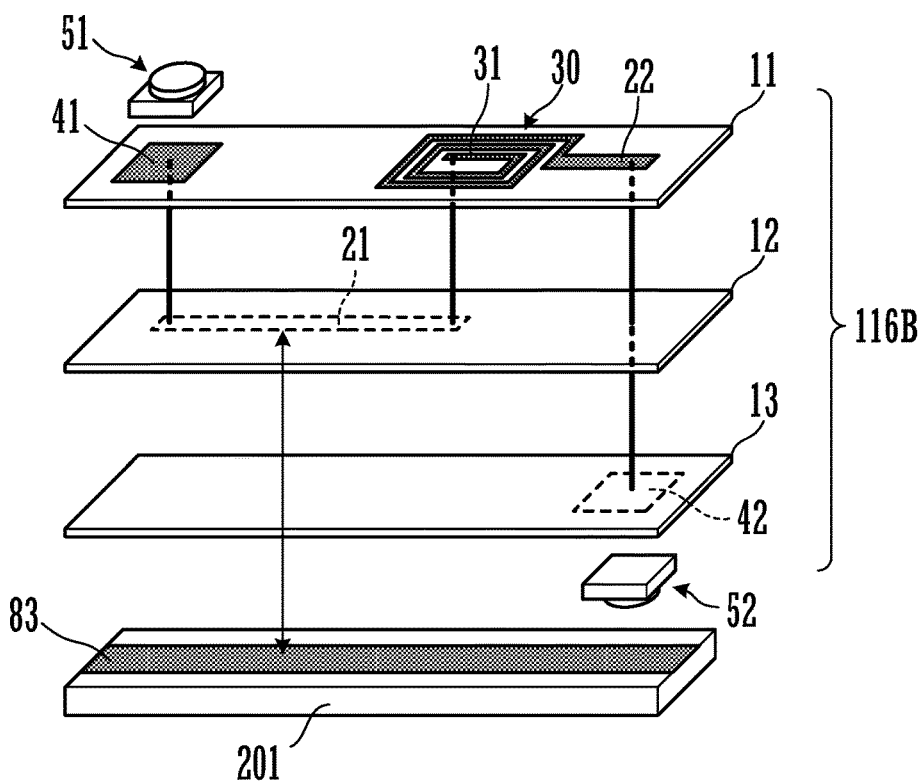

FIG. 36A and FIG. 36B are exploded perspective views showing a mounting structure of the inductor bridge 116 shown in FIG. 35, and a positional relationship between the inductor bridge 116 and the metal pattern 83 of the mother substrate 201. In FIG. 36A and FIG. 36B, since the structures of the inductor bridges are different from each other, different reference numerals 116A and 116B are used to identify the inductor bridges, respectively.

In the both structures shown in FIG. 36A and FIG. 36B, the resin base materials 11, 12, and 13 include thereon a spiral conductor pattern 31, wiring patterns 21 and 22, and connector mounting electrodes 41 and 42. The first connector 51 is connected to the antenna substrate 301.

In the example shown in FIG. 36B, in the inductor bridge 116B, the wiring pattern 21 connected to the first connector 51 connected to the antenna substrate 301 is provided on a layer close to the metal pattern 83 of the mother substrate 201. Therefore, the parasitic capacitance generated between the wiring pattern 21 and the metal pattern 83 is large, and the influence on the antenna characteristics is comparatively large.

In contrast, in the example shown in FIG. 36A, in the inductor bridge 116A, the wiring pattern 21 connected to the first connector 51 connected to the antenna substrate 301 is provided on a layer farther away from the metal pattern 83 of the mother substrate 201 than the wiring pattern 22. Therefore, the parasitic capacitance generated between the wiring pattern 21 and the metal pattern 83 is small, and the influence on the antenna characteristics is small.

Seventeenth Preferred Embodiment

Figure 37:
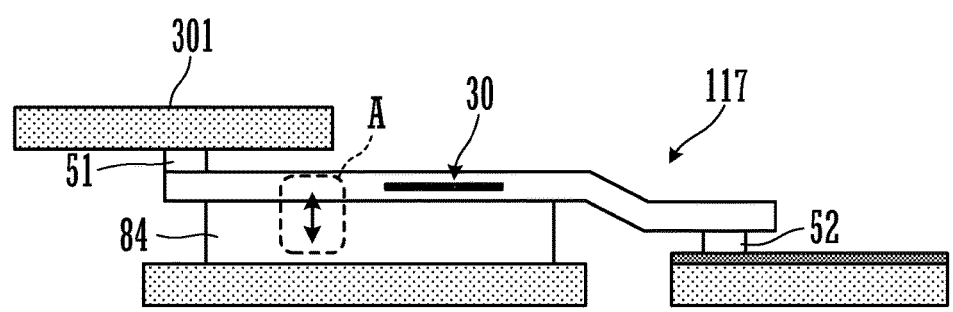
FIG. 37 is a view showing a structure of a high frequency circuit equipped with an inductor bridge 117, an antenna substrate 301, and a metal member 84, according to a seventeenth preferred embodiment of the present invention.

FIG. 37 is a view showing a structure of a high frequency circuit equipped with an inductor bridge 117, an antenna substrate 301, and a metal member 84, according to a seventeenth preferred embodiment of the present invention. In this example, the inductor bridge 117 is preferably used as the feed line of the antenna. In FIG. 37, since a portion (region indicated as A in FIG. 37) between the conductor pattern connected to the first connector 51 connected to the antenna substrate 301 and a metal member (such as a battery pack and a shield plate of a liquid crystal display panel, for example) 84 exerts a large influence on the antenna characteristics, the parasitic capacitance generated in the portion is preferably small.

Figure 38A:
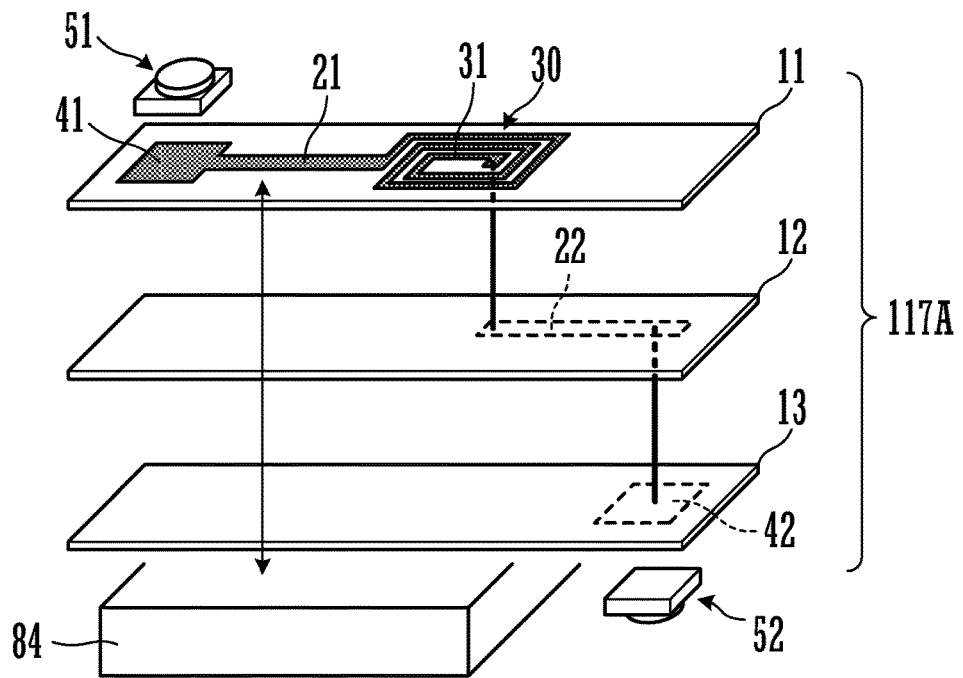
FIG. 38A and FIG. 38B are exploded perspective views showing a mounting structure of the inductor bridge 117 shown in FIG. 37, and a positional relationship between the inductor bridge 117 and the metal member 84.
Figure 38B:
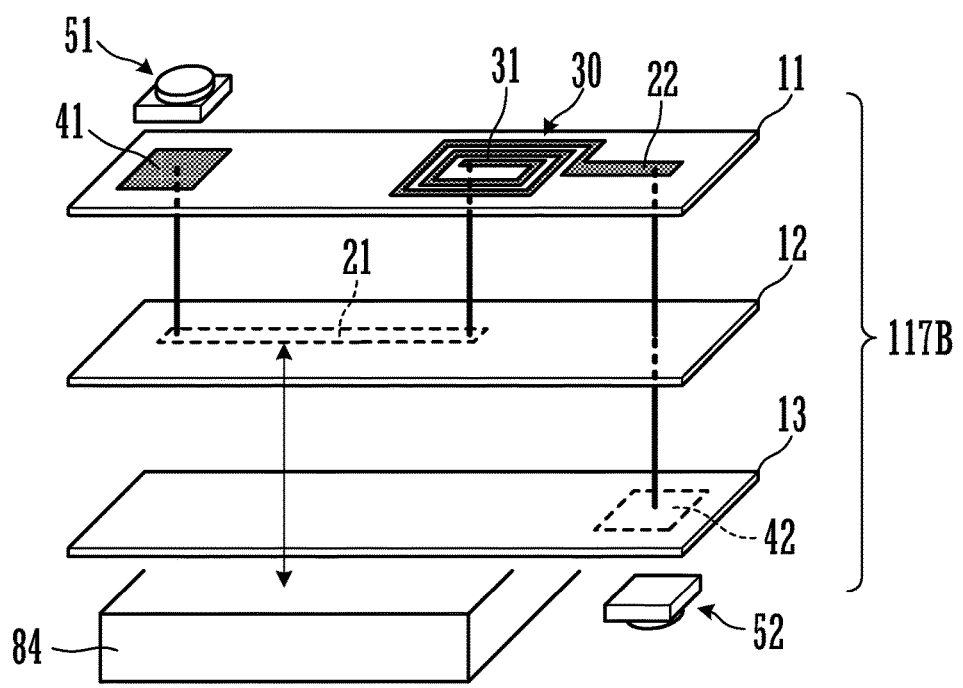

FIG. 38A and FIG. 38B are exploded perspective views showing a mounting structure of the inductor bridge 117 shown in FIG. 37, and a positional relationship between the inductor bridge 117 and the metal member 84. In FIG. 38A and FIG. 38B, since the structures of the inductor bridges are different from each other, different reference numerals 117A and 117B are used to identify the inductor bridges, respectively.

In the both structures shown in FIG. 38A and FIG. 38B, the resin base materials 11, 12, and 13 include thereon a spiral conductor pattern 31, wiring patterns 21 and 22, and connector mounting electrodes 41 and 42. The first connector 51 is connected to the antenna substrate 301.

In the example shown in FIG. 38B, in the inductor bridge 117B, the wiring pattern 21 connected to the first connector 51 connected to the antenna substrate 301 is formed on a layer close to the metal member 84. Therefore, the parasitic capacitance generated between the wiring pattern 21 and the metal member 84 is large, and the influence on the antenna characteristics is comparatively large.

In contrast, in the example shown in FIG. 38A, in the inductor bridge 117A, the wiring pattern 21 connected to the first connector 51 connected to the antenna substrate 301 is provided on a layer farther away from the metal member 84 than the wiring pattern 22. Therefore, the parasitic capacitance generated between the wiring pattern 21 and the metal member 84 is small, and the influence on the antenna characteristics is small.

Eighteenth Preferred Embodiment

Figure 39A:
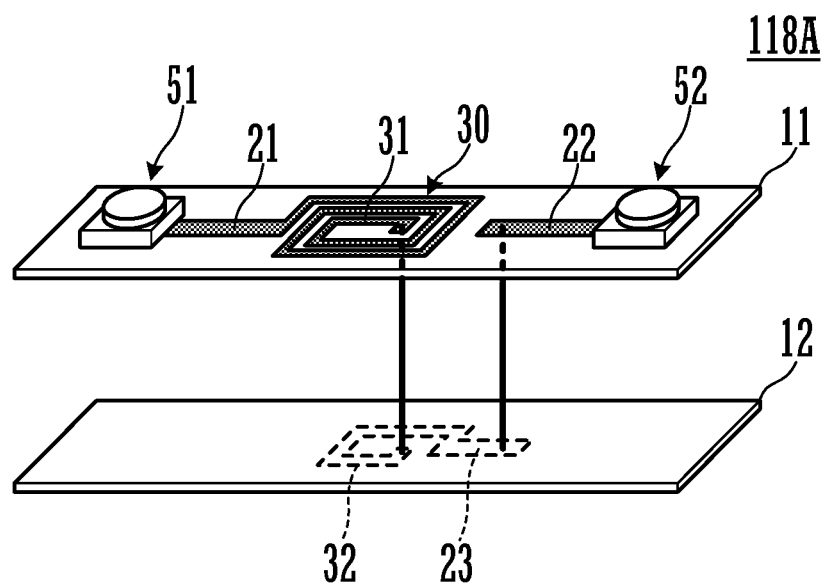
FIG. 39A and FIG. 39B are exploded perspective views of inductor bridges 118A and 118B according to an eighteenth preferred embodiment of the present invention.
Figure 39B:
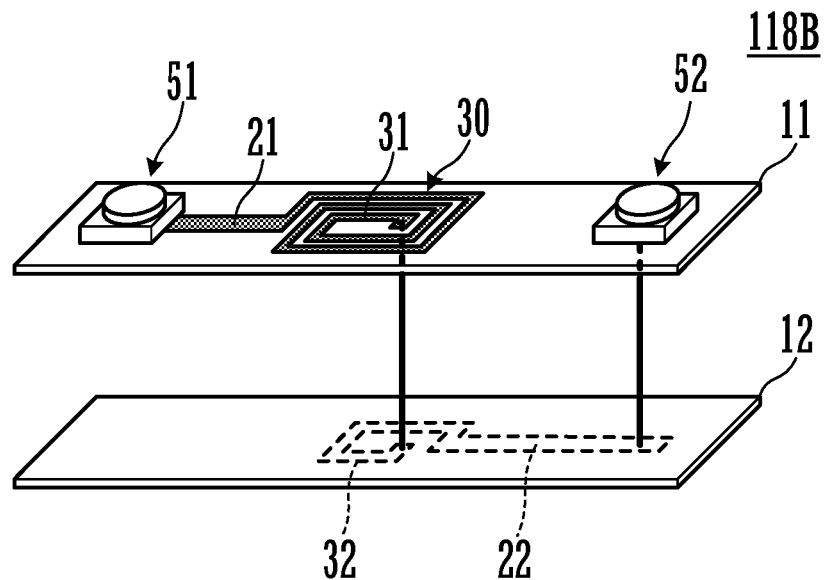

FIG. 39A and FIG. 39B are exploded perspective views of inductor bridges 118A and 118B according to an eighteenth preferred embodiment of the present invention. The resin base materials 11 and 12 include thereon spiral conductor patterns 31 and 32 and wiring patterns 21, 22, and 23.

In this way, the spiral conductor patterns 31 and 32 are provided on the two-layer resin base materials 11 and 12, and the wiring pattern is also provided on the two-layer resin base materials 11 and 12, which configures an inductor bridge only by laminating the two-layer resin base materials. It is to be noted that the outermost surface may preferably include thereon a resist layer to protect the conductor pattern.

Nineteenth Preferred Embodiment

Figure 40:
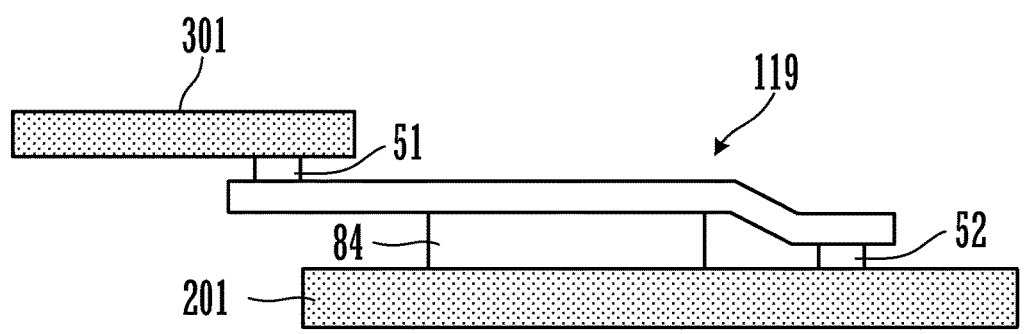
FIG. 40 is a view showing a structure of a high frequency circuit equipped with an inductor bridge 119, an antenna substrate 301, and a metal member 84, according to a nineteenth preferred embodiment of the present invention.

FIG. 40 is a view showing a structure of a high frequency circuit equipped with an inductor bridge 119, an antenna substrate 301, and a metal member 84, according to a nineteenth preferred embodiment of the present invention. In this example, the inductor bridge 119 is preferably used as the feed line of the antenna.

Figure 41A:
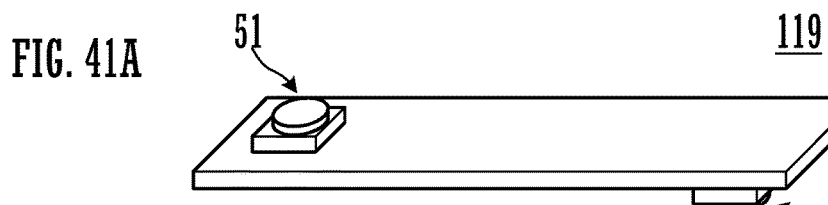
FIG. 41A is a perspective view of the inductor bridge 119 shown in FIG. 40, and FIG. 41B and FIG. 41C are exploded perspective views showing a structure of inductor bridges 119A and 119B, and a positional relationship between the inductor bridges 119A and 119B, and the metal member 84.
Figure 41B:
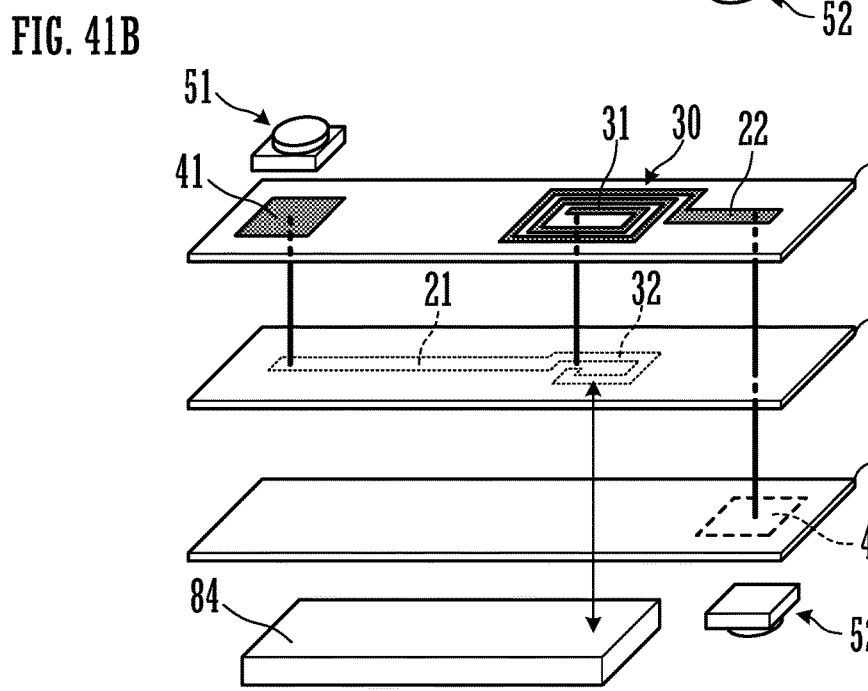
Figure 41C:
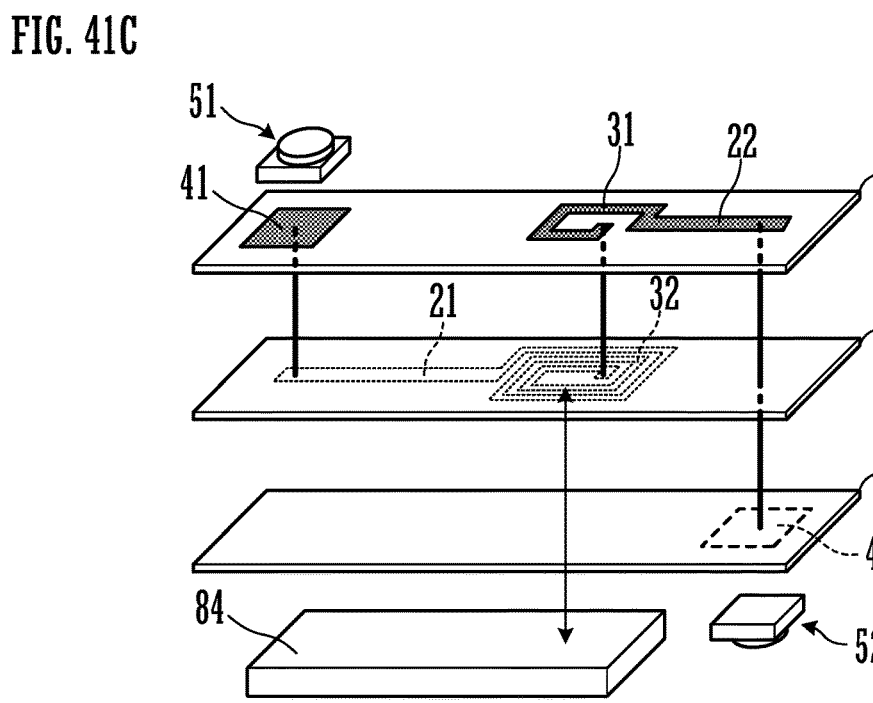

FIG. 41A is a perspective view of the inductor bridge 119 shown in FIG. 40, and FIG. 41B is an exploded perspective view showing a structure of the inductor bridge 119A, and a positional relationship between the inductor bridge 119 and the metal member 84. FIG. 41C is an exploded perspective view showing a structure of the inductor bridge 119B, and a positional relationship between the inductor bridge 119B and the metal member 84. In FIG. 41B and FIG. 41C, since the structures of the inductor bridges are different from each other, different reference numerals 119A and 119B are used to identify the inductor bridges, respectively.

In the both structures shown in FIG. 41B and FIG. 41C, the resin base materials 11, 12, and 13 include thereon spiral conductor patterns 31 and 32, wiring patterns 21 and 22, and connector mounting electrodes 41 and 42. The first connector 51 is connected to the antenna substrate 301.

In the example shown in FIG. 41C, in the inductor bridge 119B, the number of turns of the conductor pattern 32 provided on the resin base material 12 on a side close to the metal member 84 is larger than the number of turns of the conductor pattern 31 provided on the resin base material 11 on a side away from the metal member 84, so that a magnetic field to be generated in the inductor portion is likely to be prevented by the metal member 84. Therefore, a predetermined inductance is difficult to be obtained. In addition, the parasitic capacitance generated between the conductor pattern 32 and the metal member 84 is large.

In contrast, in the example shown in FIG. 41B, in the inductor bridge 119A, the number of turns of the conductor pattern 32 provided on the resin base material 12 on a side close to the metal member 84 is smaller than the number of turns of the conductor pattern 31 provided on the resin base material 11 on a side away from the metal member 84, so that a magnetic field to be generated in the inductor portion is unlikely to be prevented by the metal member 84. Therefore, a reduction in inductance is small. In addition, the parasitic capacitance generated between the conductor pattern 32 and the metal member 84 is also small.

Twentieth Preferred Embodiment

Figure 42:
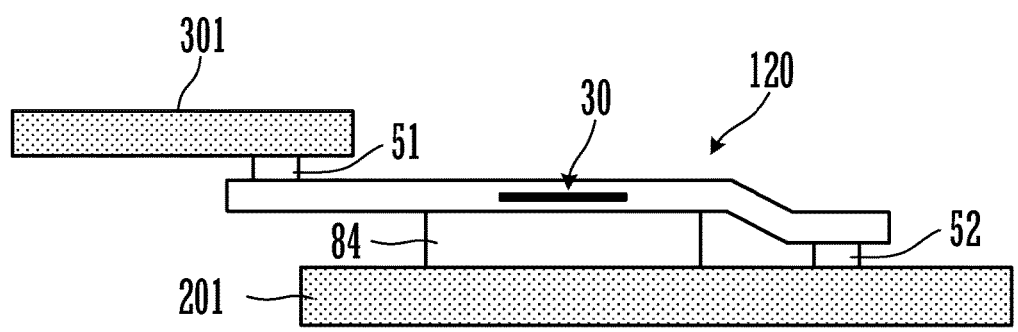
FIG. 42 is a view showing a structure of a high frequency circuit equipped with an inductor bridge 120, an antenna substrate 301, and a metal member 84, according to a twentieth preferred embodiment of the present invention.

FIG. 42 is a view showing a structure of a high frequency circuit equipped with an inductor bridge 120, an antenna substrate 301, and a metal member 84, according to a twentieth preferred embodiment of the present invention. In this example, the inductor bridge 120 is preferably used as the feed line of the antenna.

Figure 43A:
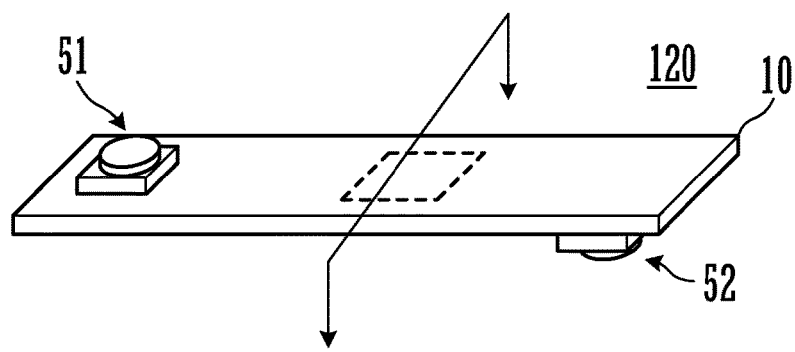
FIG. 43A is a perspective view of the inductor bridge 120.
Figure 43B:
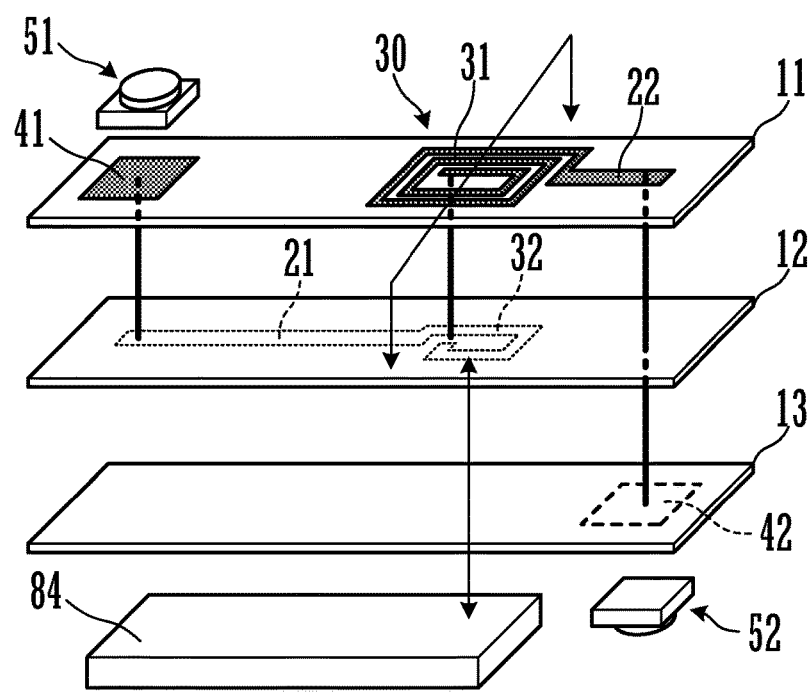
FIG. 43B is an exploded perspective view showing a structure of the inductor bridge 120, and a positional relationship between the inductor bridge 120 and the metal member 84.

FIG. 43A is a perspective view of the inductor bridge 120, and FIG. 43B is an exploded perspective view showing a structure of the inductor bridge 120, and a positional relationship between the inductor bridge 120 and the metal member 84. The resin base materials 11, 12, and 13 include thereon spiral conductor patterns 31 and 32, wiring patterns 21 and 22, and connector mounting electrodes 41 and 42. The resin base materials 11, 12, and 13 are laminated to configure an element body 10. The first connector 51 is connected to the antenna substrate 301.

Figure 44A:
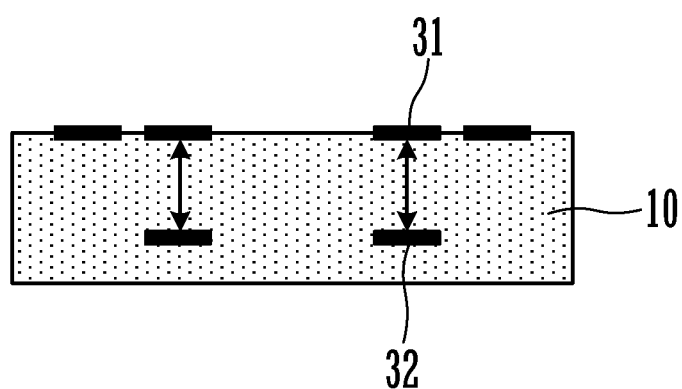
FIG. 44A is a cross sectional view of an element body 10 of the inductor bridge 120.
Figure 44B:
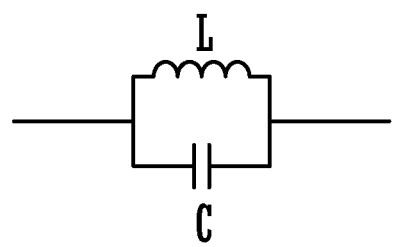
FIG. 44B is an equivalent circuit diagram of the inductor bridge 120.

FIG. 44A is a cross sectional view of the element body 10 of the inductor bridge 120. In this example, the conductor pattern 31 and the conductor pattern 32 face each other in the laminating direction. FIG. 44B is an equivalent circuit diagram of the inductor bridge 120. In this example, the inductor L is mainly equivalent to the inductance by the conductor patterns 31 and 32, and the capacitor C is equivalent to the capacitance generated between the conductor pattern 31 and the conductor pattern 32. The circuit configuration causes the inductor bridge 120 to act as a band elimination filter (BEF) and to have a function to attenuate a predetermined frequency band.

Figure 45A:
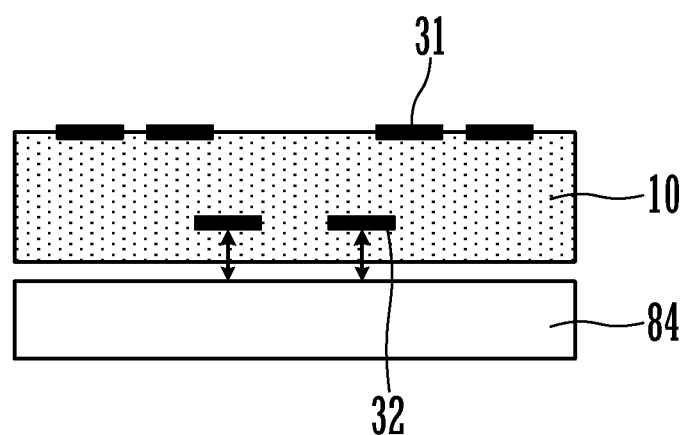
FIG. 45A is a cross sectional view of an inductor bridge of which the internal structure is slightly different from the internal structure of the inductor bridge 120.
Figure 45B:
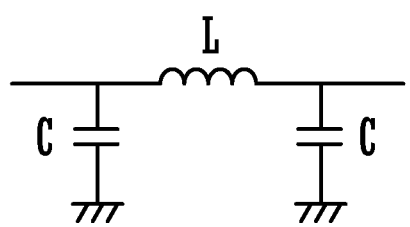
FIG. 45B is an equivalent circuit diagram of the inductor bridge in that case.

FIG. 45A is a cross sectional view of an inductor bridge of which the internal structure is slightly different from the internal structure of the inductor bridge 120, and FIG. 45B is an equivalent circuit diagram of the inductor bridge in that case. In this example, compared to the example shown in FIG. 44A, an area in which the conductor pattern 31 and the conductor pattern 32 face each other in the laminating direction is smaller. The inductor L as shown in FIG. 45B is mainly equivalent to the inductance by the conductor patterns 31 and 32, and the capacitor C is equivalent to the capacitance generated between the conductor patterns 31 and 32, and the metal member 84. The circuit configuration causes the inductor bridge to act as a low pass filter (LPF) and to have a function to attenuate an unnecessary high frequency (high harmonic) component.

Twenty-First Preferred Embodiment

Figure 46:
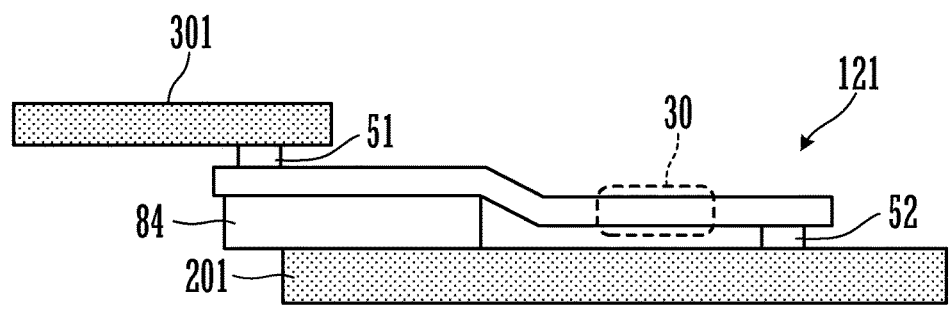
FIG. 46 is a view showing a structure of a high frequency circuit equipped with an inductor bridge 121, an antenna substrate 301, a metal member 84, and a mother substrate 201 according to a twenty-first preferred embodiment of the present invention.
Figure 47:
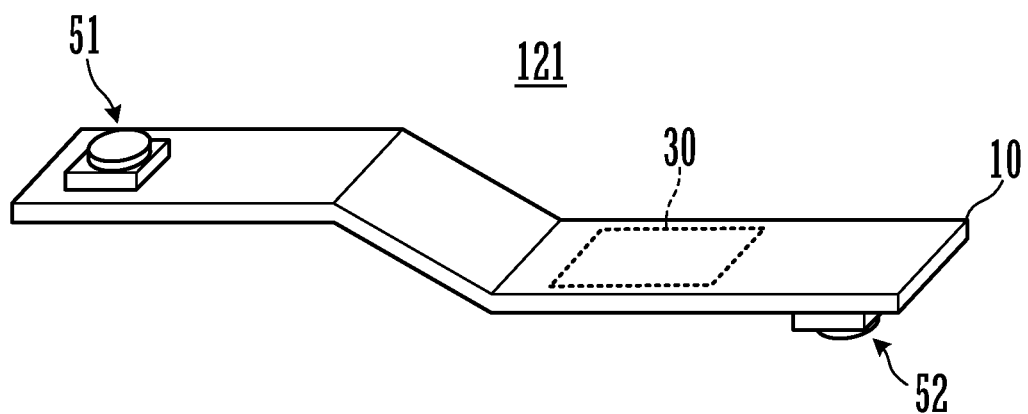
FIG. 47 is a perspective view of the inductor bridge 121.

FIG. 46 is a view showing a structure of a high frequency circuit equipped with an inductor bridge 121, an antenna substrate 301, a metal member 84, and a mother substrate 201, according to a twenty-first preferred embodiment of the present invention. FIG. 47 is a perspective view of the inductor bridge 121. In this example, the inductor bridge 121 is preferably used as the feed line of the antenna.

Figure 48A:
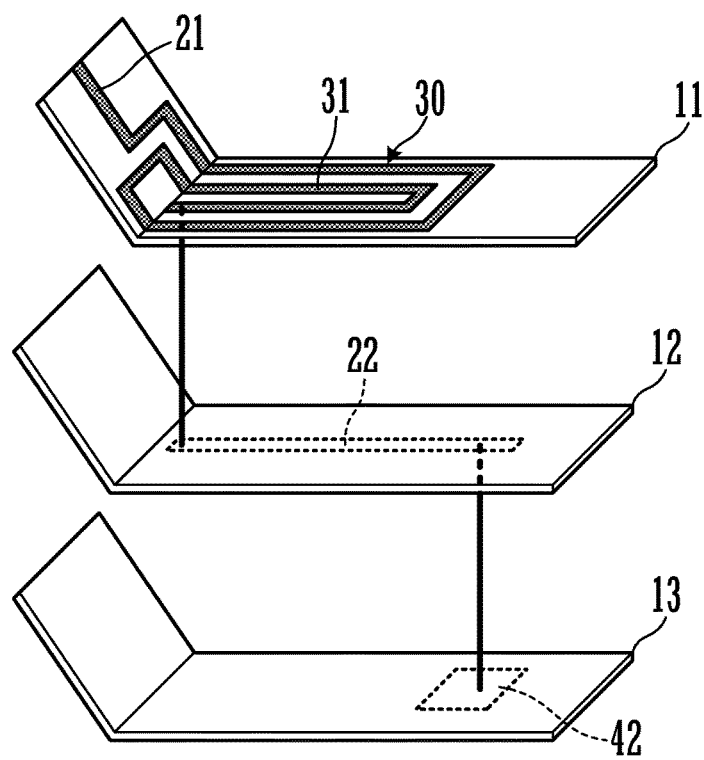
FIG. 48A and FIG. 48B are partially exploded perspective views of the inductor bridge 121 and views showing a bending position at which the inductor bridge 121 is bent.
Figure 48B:
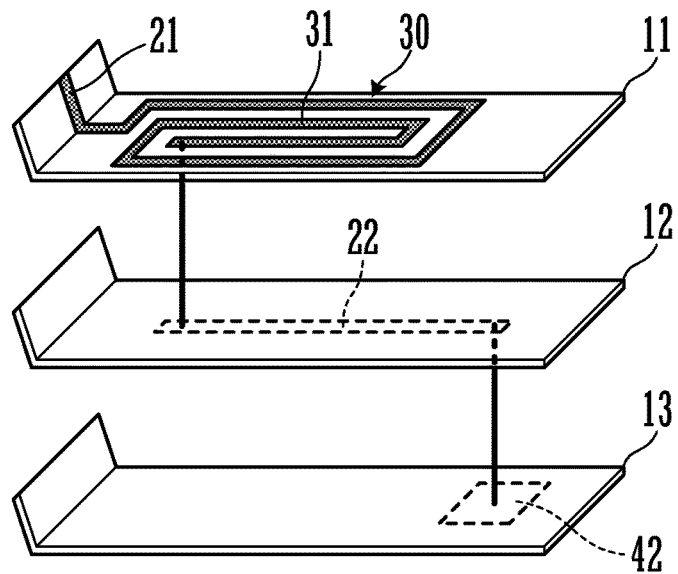

FIG. 48A and FIG. 48B are partially exploded perspective views of the inductor bridge 121 and views showing a bending position at which the inductor bridge 121 is bent. All the resin base materials 11, 12, and 13 include thereon a spiral conductor pattern 31, wiring patterns 21 and 22, and a connector mounting electrode 42.

As shown in FIG. 48B, if the inductor bridge is to be bent at a position in the middle of the wiring pattern 21, the inductor bridge receives stress at an unexpected position, so that the bending position at which the inductor bridge is bent may shift even into the region in which the spiral conductor pattern is formed. In that case, as the spiral conductor pattern 31 deforms, the inductance varies.

On the other hand, as shown in FIG. 48A, if the inductor bridge is bent at the position of the interlayer connection conductor (via conductor) between the spiral conductor pattern 31 and the wiring pattern 22, the bending position does not vary and the bending position is fixed, so that the inductance is prevented from varying unexpectedly.

Figure 49A:
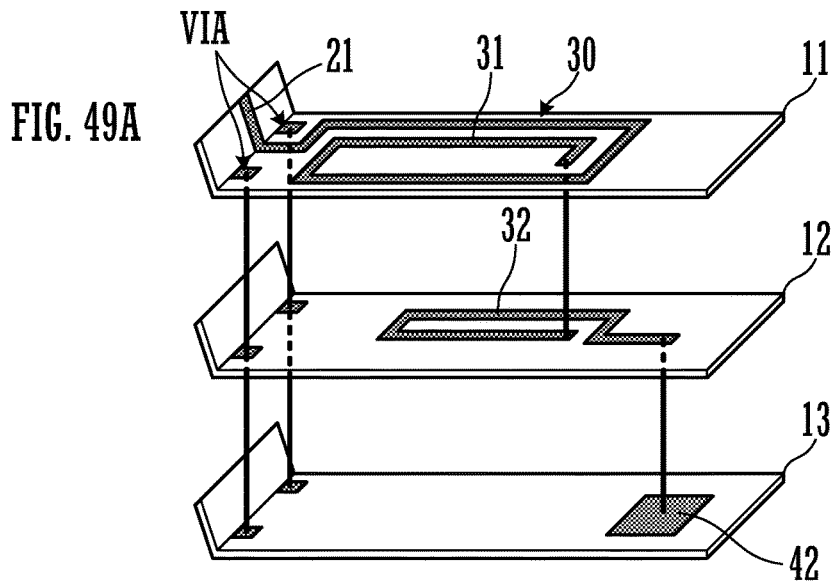
FIG. 49A and FIG. 49B are other partially exploded perspective views of the inductor bridge 121 and views showing a bending position at which the inductor bridge 121 is bent.
Figure 49B:
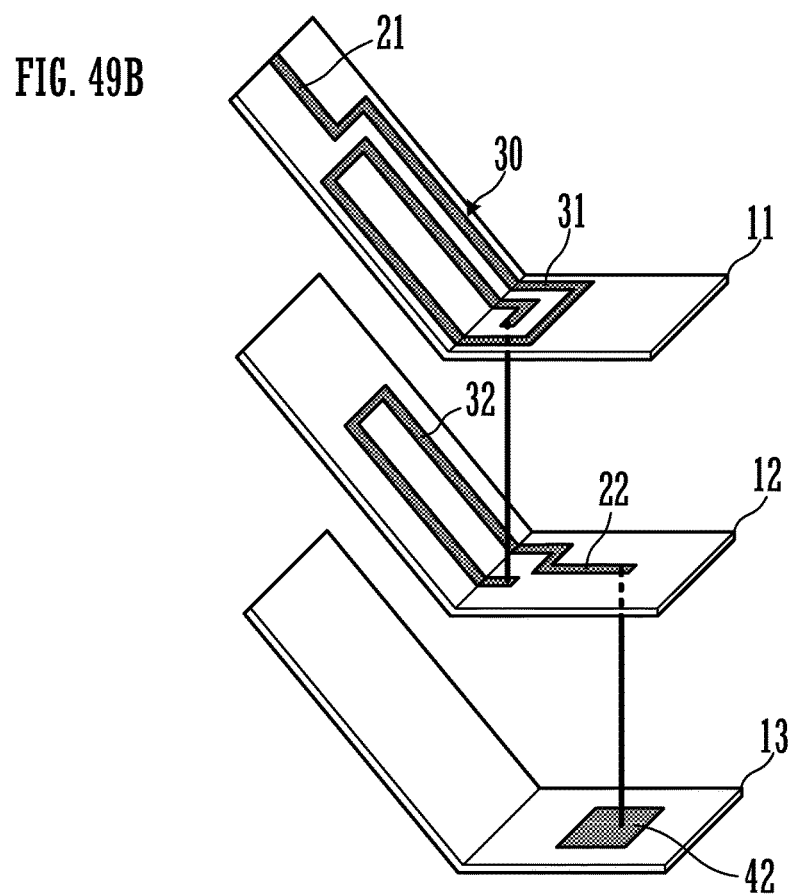

FIG. 49A and FIG. 49B are other partially exploded perspective views of the inductor bridge 121 and views showing a position at which the inductor bridge 121 is bent.

As shown in FIG. 49B, if the inductor bridge receives stress at an unexpected position and the bending position at which the inductor bridge is bent shifts even into the region in which the spiral conductor pattern is provided, the inductance varies due to the deformation of the spiral conductor pattern 31.

On the other hand, as shown in FIG. 49A, if the inductor bridge includes a dummy interlayer connection conductor (via conductor) VIA provided so as to be bent at a position in the middle of the wiring pattern 21, the inductor bridge is bent at the position. Thus, the bending position does not vary and the bending position is fixed, so that the inductance is prevented from varying unexpectedly.

Twenty-Second Preferred Embodiment

Figure 50A:
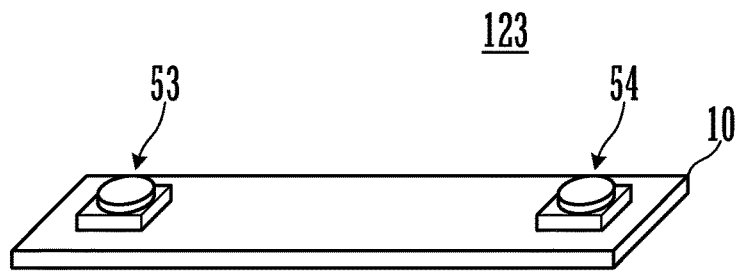
FIG. 50A is a perspective view of an inductor bridge 123 according to a twenty-second preferred embodiment of the present invention.
Figure 50B:
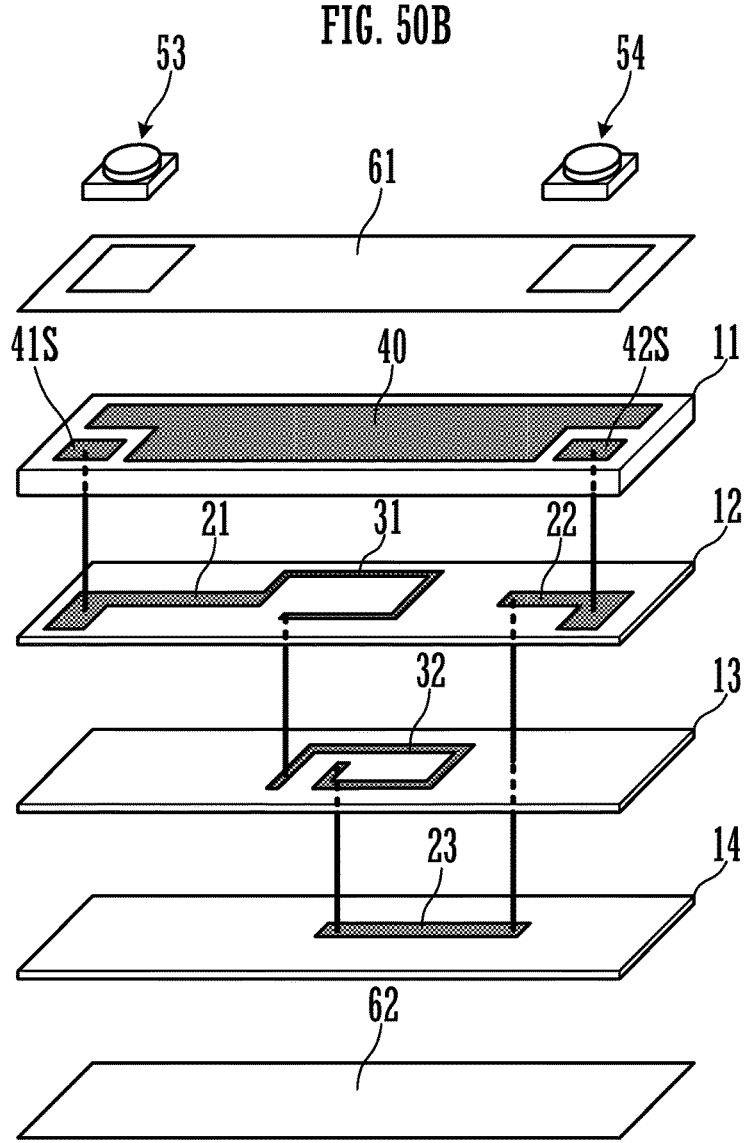
FIG. 50B is an exploded perspective view of the inductor bridge 123.

FIG. 50A is a perspective view of an inductor bridge 123 according to a twenty-second preferred embodiment of the present invention, and FIG. 50B is an exploded perspective view of the inductor bridge 123. The inductor bridge 123 is an element configured to bridge-connect a first circuit and a second circuit by a two-terminal connector. As shown in FIG. 50A, the inductor bridge 123 is provided with a flexible flat plate-shaped element body 10, a first two-terminal connector 53, and a second two-terminal connector 54.

As shown in FIG. 50B, the element body 10 is configured preferably by laminating resin base materials 11, 12, 13, and 14 of a liquid crystal polymer (LCP). The resin base materials 12 and 13 include an inductor portion defined by conductor patterns 31 and 32. The conductor patterns 31 and 32 are spiral conductor patterns of which the coil axis is oriented in a direction perpendicular or substantially perpendicular to the face of the resin base material 12 (direction perpendicular or substantially perpendicular to the principal surface of the element body 10).

The resin base material 12 includes thereon wiring patterns 21 and 22, and the resin base material 14 includes thereon a wiring pattern 23. The resin base material 11 includes thereon connector mounting electrodes 41S and 42S and a ground electrode 40. The central conductors of two-terminal connectors 53 and 54 are connected to the connector mounting electrodes 41S and 42S, respectively, and the outer conductors of the connector mounting electrodes 41S and 42S are connected to the ground electrode 40.

The ground electrode 40 is configured to shield the inductor portion and to reduce or prevent undesired coupling with an external circuit. In addition, the ground electrode 40 also reduces or prevents undesired coupling with the conductors mainly provided on the substrate that is connected to the inductor bridge and the metal member.

The inductance of the conductor pattern 31 is smaller than the inductance of the conductor pattern 32, and the conductor pattern of which the inductance is smaller is close to the ground electrode 40, so that the eddy current generated in the ground electrode 40 is reduced.

Twenty-Third Preferred Embodiment

Figure 51A:
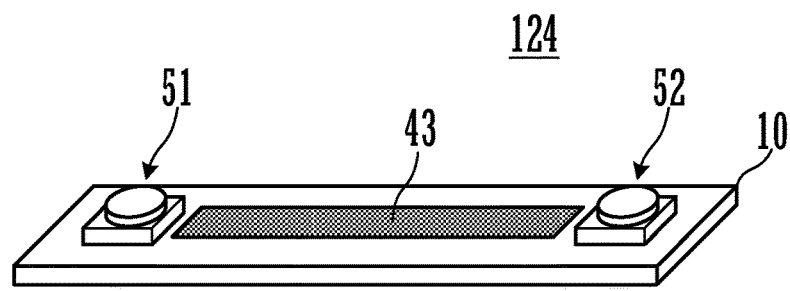
FIG. 51A is a perspective view of an inductor bridge 124 according to a twenty-third preferred embodiment of the present invention.
Figure 51B:
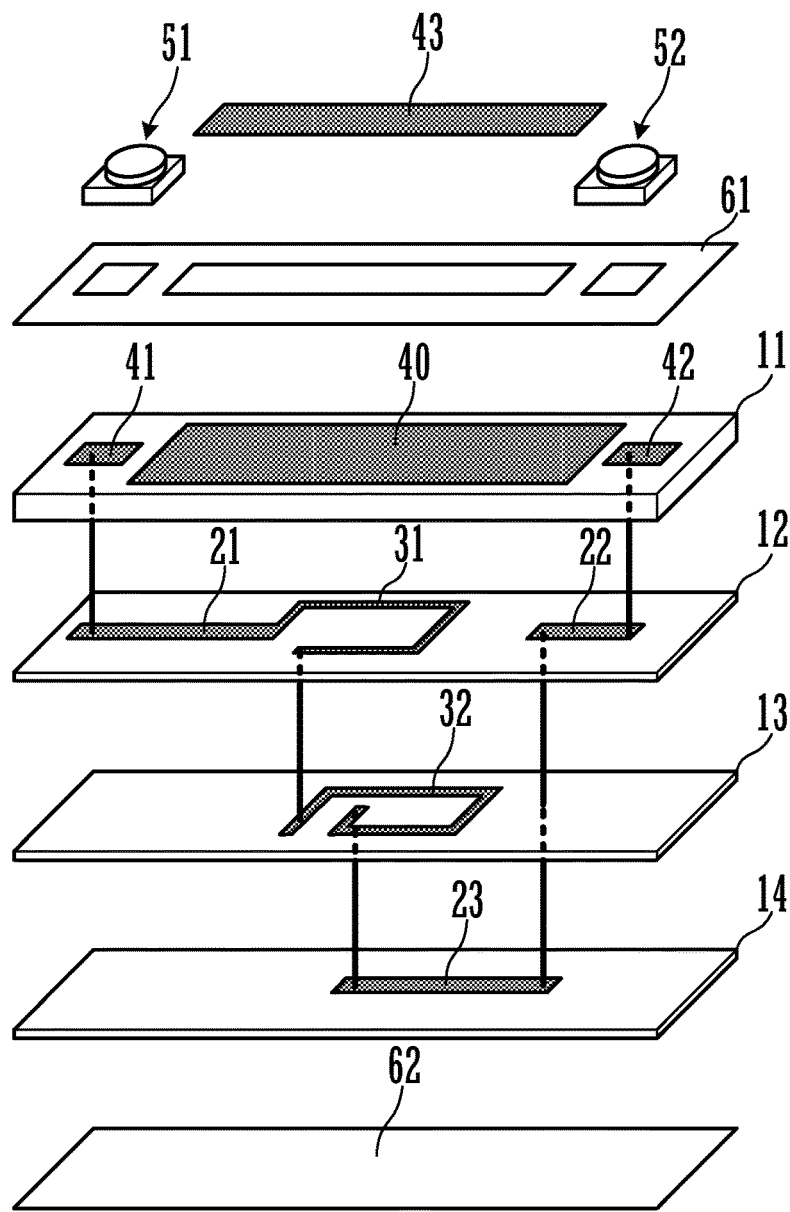
FIG. 51B is an exploded perspective view of the inductor bridge 124.

FIG. 51A is a perspective view of an inductor bridge 124 according to a twenty-third preferred embodiment of the present invention, and FIG. 51B is an exploded perspective view of the inductor bridge 124. As shown in FIG. 51B, the element body 10 is configured preferably by laminating resin base materials 11, 12, 13, and 14. The resin base materials 12 and 13 include an inductor portion defined by conductor patterns 31 and 32. The resin base material 12 includes thereon wiring patterns 21 and 22, and the resin base material 14 includes thereon a wiring pattern 23. The resin base material 11 includes thereon connector mounting electrodes 41 and 42 and a ground electrode 40. The ground electrode 40 includes thereon a conductive adhesive double sided tape 43.

In a state in which the inductor bridge 124 has been incorporated into an electronic device, the conductive adhesive double sided tape 43 is adhered on the ground electrode and the metal member in the housing of the electronic device into which the inductor bridge 124 is incorporated. This enables a ground connection without using a two-terminal connector. It should be noted that conductive adhesive may be used in place of the conductive adhesive double sided tape in order to make the ground connection.

Twenty-Fourth Preferred Embodiment

Figure 52A:
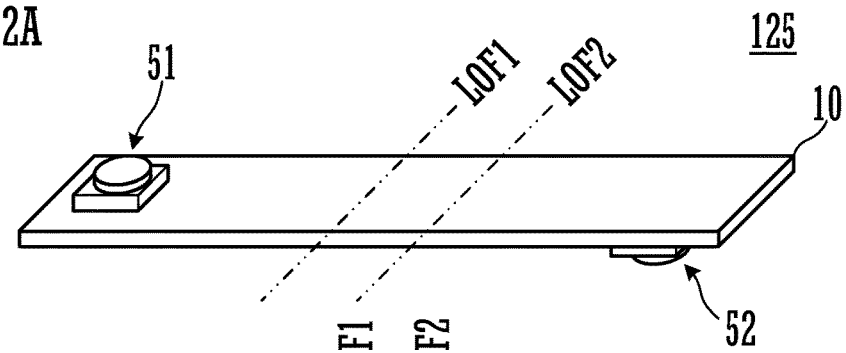
FIG. 52A is a perspective view showing an appearance of an inductor bridge 125 according to a twenty-fourth preferred embodiment of the present invention.
Figure 52B:
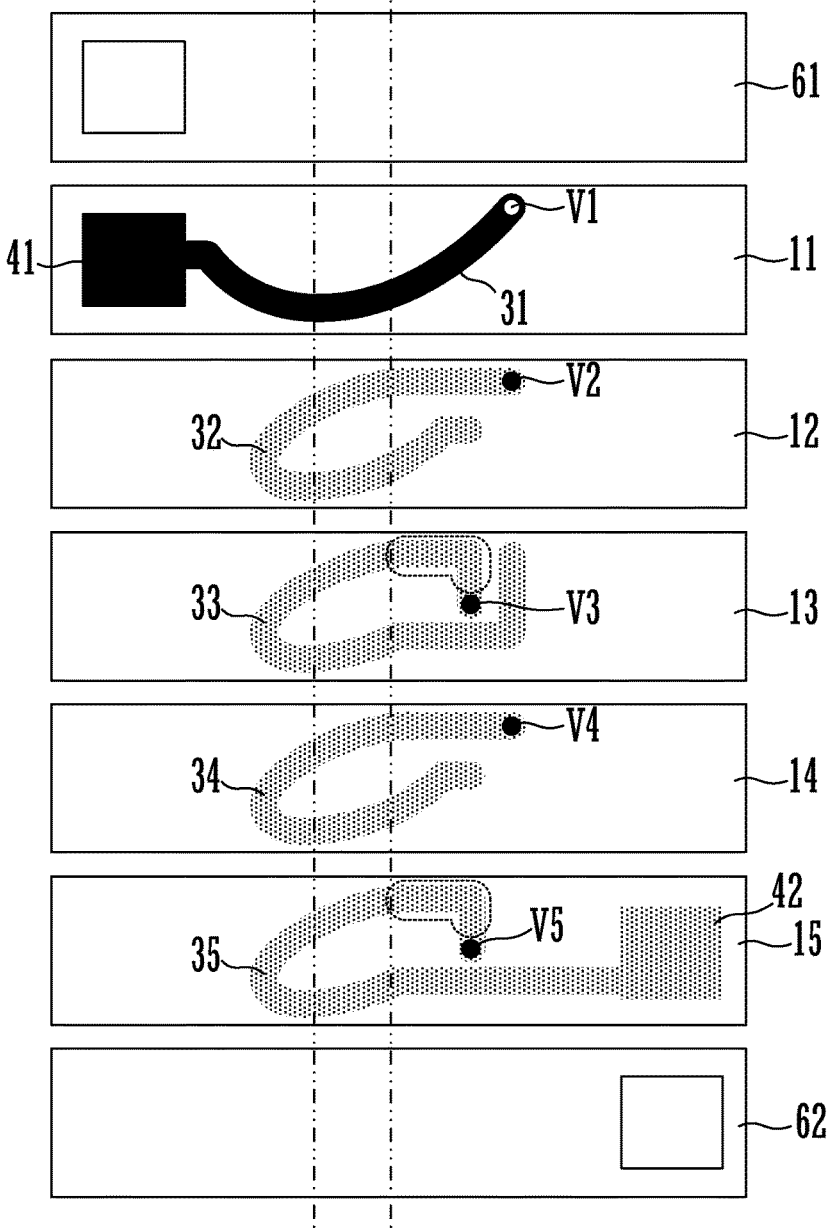
FIG. 52B is an exploded plan view of the inductor bridge 125 according to the twenty-fourth preferred embodiment of the present invention.

FIG. 52A is a perspective view showing the appearance of an inductor bridge 125 according to a twenty-fourth preferred embodiment of the present invention. FIG. 52B is an exploded plan view of the inductor bridge 125 according to the twenty-fourth preferred embodiment of the present invention. The inductor bridge 125 is bent upward along a bending line LOF1 and bent downward along a bending line LOF2 and is used in the preferred embodiment as shown in FIG. 8, for example.

The element body 10 is configured by laminating resin base materials 11, 12, 13, 14, and 15. The resin base material 11 includes a resist layer 61 on the upper surface thereof, and the resin base material 15 includes a resist layer 62 on the lower surface thereof. The resist layers 61 and 62 each include an opening portion. The resin base material 11 includes a wiring pattern 31 on the upper surface thereof. The resin base materials 12 to 15 include loop-shaped conductor patterns 32 to 35 on the lower surfaces thereof. The resin base materials 11 to 15 include interlayer connection conductors V1 to V5. The resin base material 11 includes a connector mounting electrode 41 on the upper surface thereof, and the resin base material 15 includes a connector mounting electrode 42 on the lower surface thereof.

On the resin base material 11, the conductor pattern 31 includes a first end that is connected to the connector mounting electrode 41, and a second end that is connected to the interlayer connection conductor V1. The interlayer connection conductor V1 is connected to the first end of the conductor pattern 32 provided on the resin base material 12. On the resin base material 12, the interlayer connection conductor V2 is connected to the first end of the conductor pattern 32. The second end of the conductor pattern 32 is connected to the interlayer connection conductor V3 provided on the resin base material 13. On the resin base material 13, the interlayer connection conductor V3 is connected to the first end of the conductor pattern 33. The second end of the conductor pattern 33 is connected to the interlayer connection conductor V4 provided on the resin base material 14. On the resin base material 14, the interlayer connection conductor V4 is connected to the first end of the conductor pattern 34. The second end of the conductor pattern 34 is connected to the interlayer connection conductor V5 formed on the resin base material 15. On the resin base material 15, the interlayer connection conductor V5 is connected to the first end of the conductor pattern 35. The second end of the conductor pattern 35 is connected to the connector mounting electrode 42.

The connector mounting electrodes 41 and 42 are connected to the connectors 51 and 52 through the opening portions of resist layers 61 and 62. These conductor patterns and the interlayer connection conductors define an inductor portion including a laminated coil pattern.

According to the present preferred embodiment of the present invention, various operational effects and advantages to be described below are achieved.

Figure 53A:
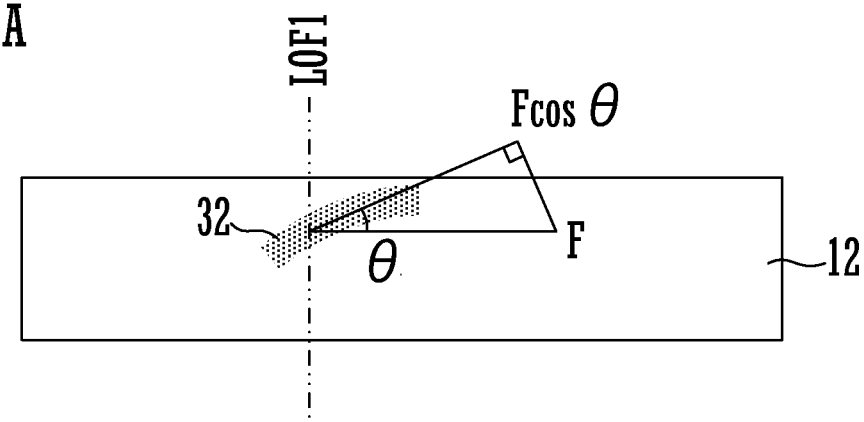
FIG. 53A and FIG. 53B are views showing a part of a conductor pattern near a bending portion.
Figure 53B:
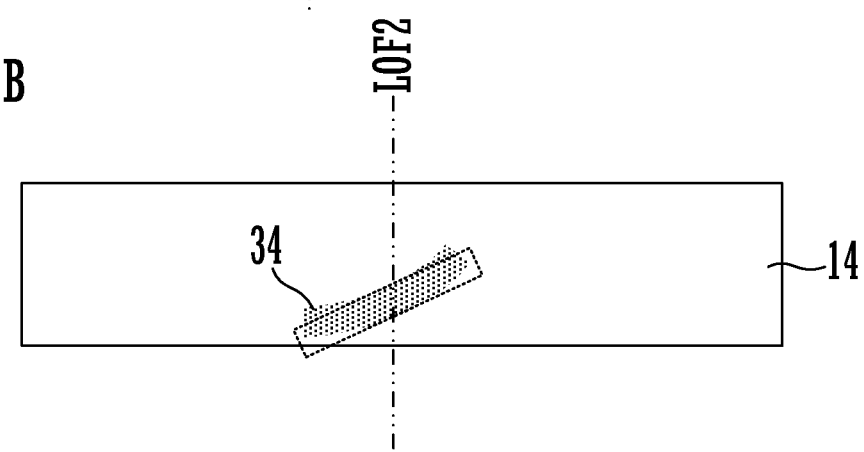
Figure 53C:
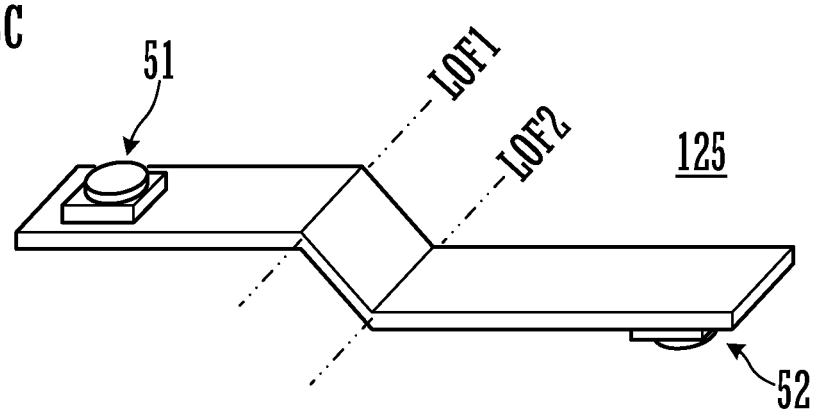
FIG. 53C is a perspective view of the inductor bridge 125 in a state of being bent.

FIG. 53A and FIG. 53B are views showing stress applied to a conductor pattern near the bending portion. FIG. 53C is a perspective view of the inductor bridge 125 in a state of being bent. FIG. 53A and FIG. 53B show representative examples of a part of the conductor patterns 32 and 34. As shown in FIG. 53A, the conductor patterns included in the inductor bridge 125 are formed to include a portion which intersects with the bending lines LOF1 or LOF2, the portion intersecting with the bending lines LOF1 or LOF2 at a predetermined angle without being perpendicular or substantially perpendicular to each other. In other words, the inductor pattern has an approximate shape of an ellipse (leaf shape) in a plan view, the ellipse including a long axis that is patterned so as to be non-perpendicular to each of the bending lines LOF1 and LOF2 (so that the long axis and the short axis of the ellipse are oblique with respect to each of the bending lines LOF1 and LOF2).

The portion of the conductor pattern that intersects the bending lines LOF1 and LOF2 with each other preferably has an elliptical shape, which disperses the stress generated when the element body 10 is bent. Specifically, as shown in FIG. 53A, when the stress applied in the longer direction of the resin base material 12 is represented by F, the stress applied to the conductor pattern 32 at a position in which the conductor pattern 32 and the bending line LOF1 are intersected with each other is $F\cos\theta$. Accordingly, the stress is reduced from F.

In addition, as shown in FIG. 53B, the conductor pattern 34 is curved near the bending line LOF2. Such a curve hardly causes the conductor pattern 34 to be broken since the conductor pattern 34 deforms as the resin base material 14 deforms in the bending portion. For example, the conductor pattern 34 is located on a layer lower than the center of the thickness of the element body 10, so that the bending along the bending line LOF2 applies tensile stress to the conductor pattern 34. Therefore, as shown by a dashed line in FIG. 53B, the conductor pattern 34 tends to extend straight in the vicinity of an intersecting position in which the conductor patterns 34 and the bending line LOF2 are intersected with each other. In this way, the bending portion of the conductor pattern has previously curved and has a so called "bend allowance", which causes the conductor pattern to deform easily. Such an operation further eases the stress applied to the conductor pattern.

Moreover, as shown in FIG. 52B, all the interlayer connection conductors V1 to V5 are provided closer to the side of the connector mounting electrode 42 than to the bending line LOF2. The conductor patterns 33 and 35 connected to the interlayer connection conductors V3 and V5 arranged at the position close to the bending line LOF2, between an area in which the conductor patterns 33 and 35 are overlapped with the bending line LOF2 and the interlayer connection conductors V3 and V5, as shown by being surrounded by the broken line in FIG. 52B, has a curved shape (detour shape). Such a shape of the conductor pattern hardly causes a break between the interlayer connection conductors V3 and V5 and the conductor patterns 33 and 35 since the stress due to bending is not directly transmitted to the interlayer connection conductors V3 and V5 when the element body 10 is bent along the bending line LOF2. It is to be noted that the distance from the bending line LOF2 to the interlayer connection conductors V2 and V4 is large, so that the conductor patterns 32 and 34 are hardly broken without the curved shape (detour shape).

Figure 54A:
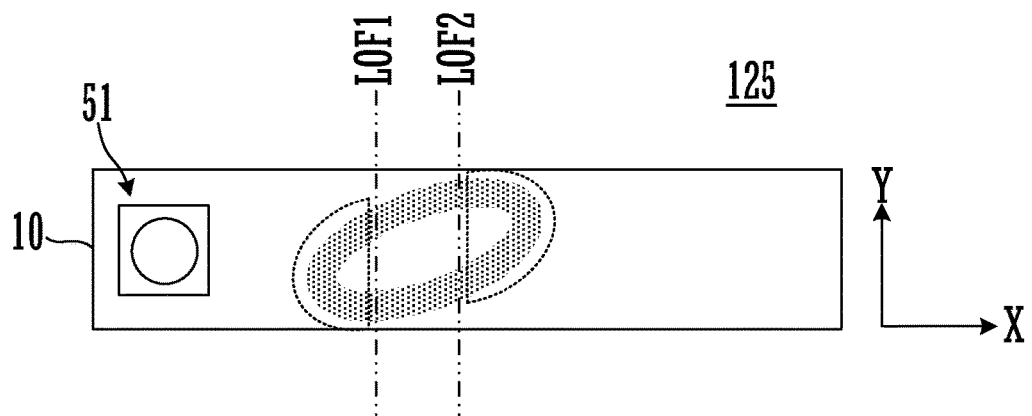
FIG. 54A is a plan view of the inductor bridge 125.
Figure 54B:
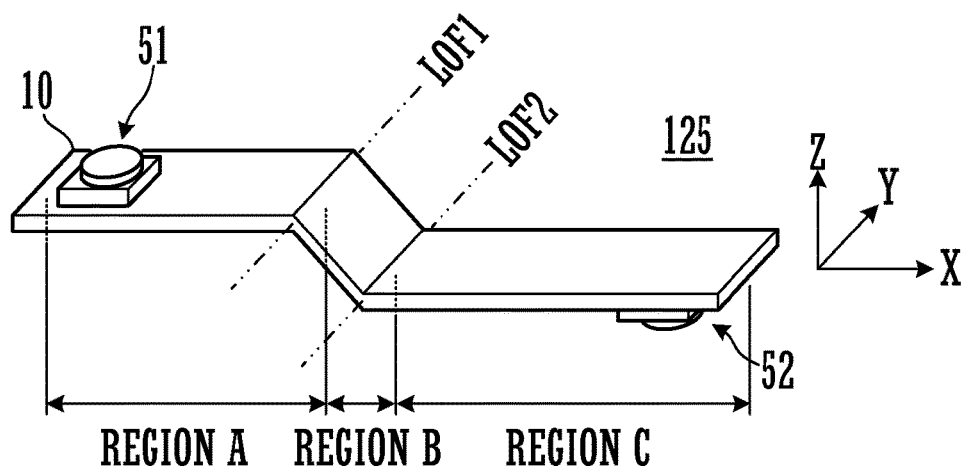
FIG. 54B is a perspective view of the inductor bridge 125 in a state of being bent.

FIG. 54A is a plan view of the inductor bridge 125. FIG. 54A shows the elliptical shape of the conductor pattern in order to show the relationship between the conductor pattern of the inductor portion and a bending position. FIG. 54B is a perspective view of the inductor bridge 125 in a state of being bent.

As shown in FIG. 54A, the inductor bridge 125 includes an elliptically shaped conductor pattern of the inductor portion, the conductor pattern having the long axis inclined with respect to the X axis. Therefore, the conductor pattern of the inductor portion is shifted from a region A to a region B, furthermore, from the region B to a region C, in the in the positive direction of Y-axis. With such a structure, compared to a case in which the long axis of the elliptical shape is oriented in the X-axis direction, the distance between the lines of the conductor patterns over the adjacent regions becomes larger. For example, when the long axis of the elliptical shape is oriented in the X axial direction, and the conductor pattern in the region A and the conductor pattern in the region C are bent upward along the bending line LOF1 and bent downward along the bending line LOF2, the conductor pattern of the region A and the conductor pattern of the region C become closer to each other. In contrast, according to the present preferred embodiment of the present invention, the conductor patterns of the portion shown by the dashed line in FIG. 54A are not much close to each other even by the bending. Therefore, the inter-line capacitance of the conductor pattern of the inductor portion does not become large, which makes it possible to keep the self-resonant frequency high.

In addition, if the element body 10 is flexible, the angle (bending angle) defined by the region A and the region B of the element body 10, and the angle (bending angle) defined by the region B and the region C of the element body 10 are hardly kept constant. As described above, according to the present preferred embodiment of the present invention, the increase in inter-line capacitance by bending is small, so that, due to various bending shapes, the change in electrical characteristics as an inductor element is also small.

Moreover, as is clear when referring to FIG. 52B, FIG. 54A, and FIG. 54B, the interlayer connection conductor is not provided in the region B. Since the interlayer connection conductor is made of a hard material, a portion in which the interlayer connection conductor is provided is more difficult to deform, compared to a portion in which the interlayer connection conductor is not provided. Therefore, compared to the configuration in which the interlayer connection conductor is provided in the region B, the bending along the bending lines LOF1 and LOF2 is easier.

Furthermore, when the interlayer connection conductor is provided in the region B, the conductor pattern of the inductor portion includes in the middle thereof a corner portion (step-shaped portion) defined by the interlayer connection conductor in a cross sectional view. Such a corner portion of the conductor pattern causes a loss of high frequency. According to the present preferred embodiment of the present invention, the conductor pattern of the inductor portion includes in the middle thereof no interlayer connection conductors, which significantly reduces the loss.

It should be noted that, while the preferred embodiments shown in FIGS. 52A and 52B to FIGS. 54A and 54B describe an example in which the inductor bridge is bent along the two bending lines LOF1 and LOF2 parallel to each other, one bending line may also be used to obtain a similar effect.

Twenty-Fifth Preferred Embodiment

Figure 55A:
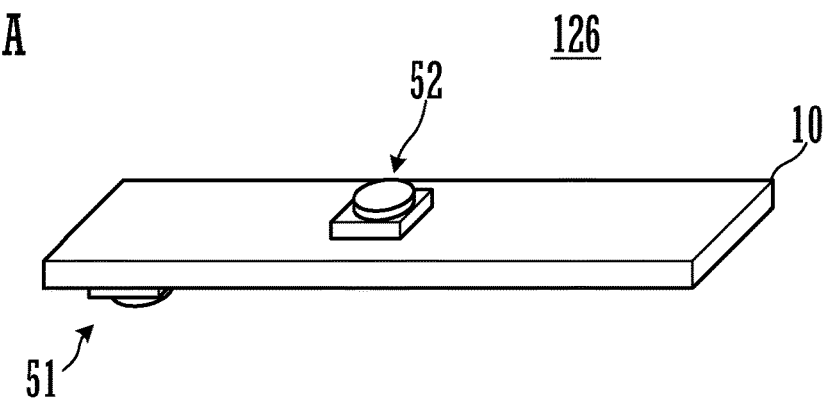
FIG. 55A is a perspective view of an inductor bridge 126 according to a twenty-fifth preferred embodiment of the present invention.
Figure 55B:
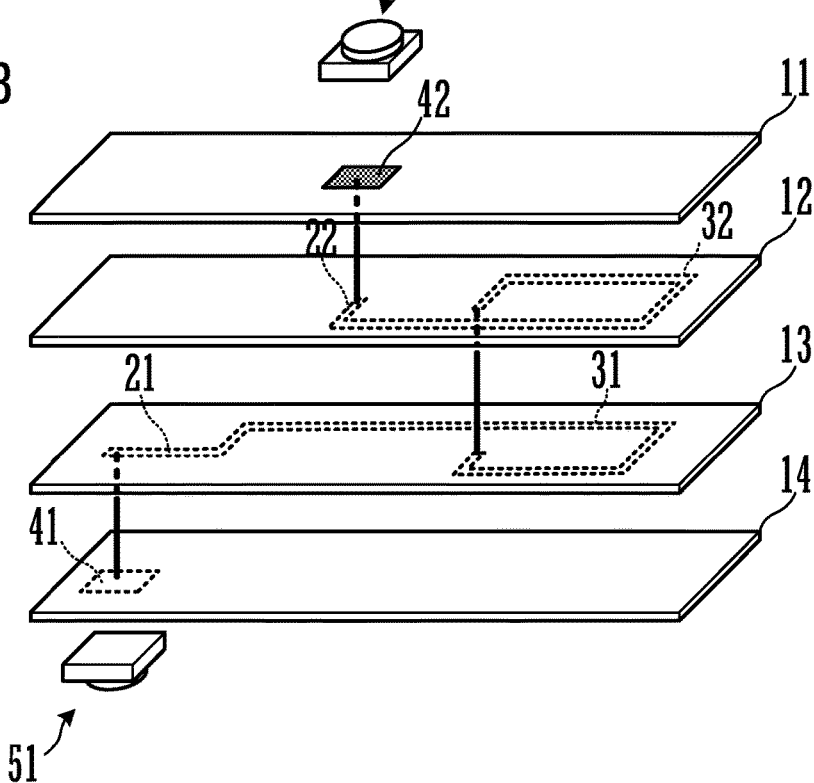
FIG. 55B is an exploded perspective view of the inductor bridge 126.

FIG. 55A is a perspective view of an inductor bridge 126 according to a twenty-fifth preferred embodiment of the present invention, and FIG. 55B is an exploded perspective view of the inductor bridge 126. The inductor bridge 126 includes an element body 10 and an inductor in the element body 10. The element body 10 includes connectors 51 and 52 on the outer surface thereof. As shown in FIG. 55B, the element body 10 is configured preferably by laminating resin base materials 11, 12, 13, and 14. The resin base materials 12 and 13 include on the lower surface thereof an inductor portion defined by conductor patterns 31 and 32. In addition, the resin base materials 12 and 13 include thereon wiring patterns 21 and 22. The resin base material 11 includes a connector mounting electrode 42, and the resin base material 14 includes a connector mounting electrode 41.

While all the preferred embodiments that have been shown so far have described an example in which the element body 10 includes opposite end portions that each include a connecting portion, the following preferred embodiment of the present invention describes an example in which at least one of the two connecting portions is provided at a position different from the position of the end portion of the element body 10.

The main features of the inductor bridge 126 of the present preferred embodiment of the present invention are that: the inductor is electrically connected between the two connectors 51 and 52; in the mechanical structure, the inductor portion is arranged at a portion other than an area between the two connectors 51 and 52; and the portion other than the area between the two connectors 51 and 52 is bent.

Figure 56A:
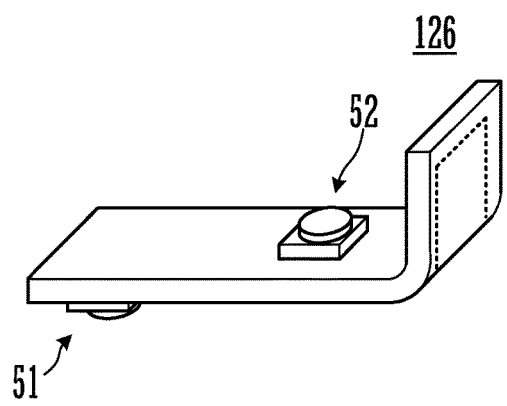
FIG. 56A is a perspective view showing a state in which an inductor portion of the inductor bridge 126 is bent from a portion other than the inductor portion.
Figure 56B:
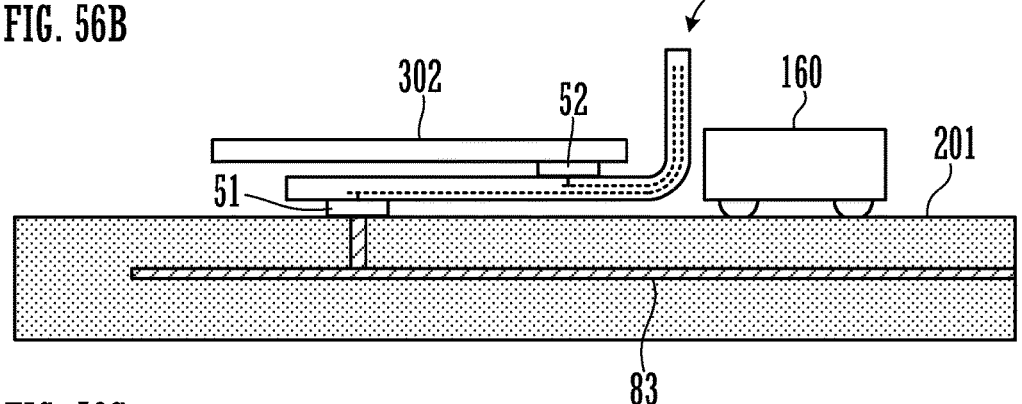
FIG. 56B and FIG. 56C are views showing a state in which the inductor bridge 126 is mounted to a mother substrate 201 together with other components.
Figure 56C:
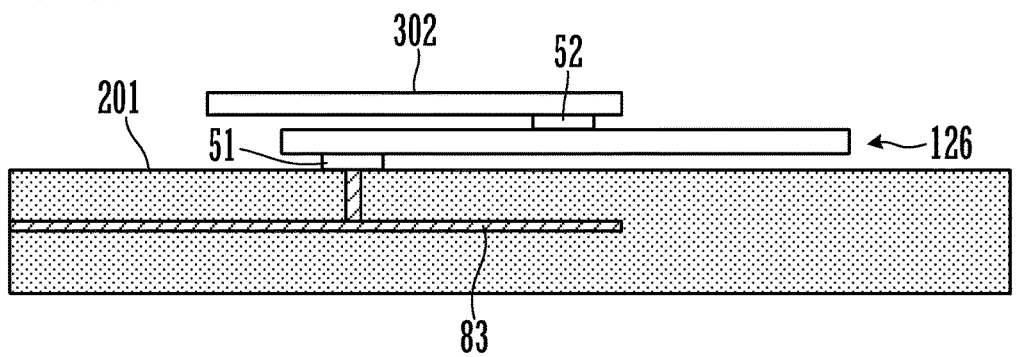

FIG. 56A is a perspective view showing a state in which the inductor portion of the inductor bridge 126 (portion other than the area between the two connectors 51 and 52) is bent from a portion other than the inductor portion. FIG. 56B and FIG. 56C are views showing a state in which the inductor bridge 126 is mounted to the mother substrate 201 together with other components. FIG. 56B and FIG. 56C show the cross sectional surface of the mother substrate 201.

In the example shown in FIG. 56B, the inductor bridge 126 is mounted to the mother substrate 201 in a state in which the connector 51 of the inductor bridge 126 is connected to the connecting portion on the mother substrate 201. The connector 52 of the inductor bridge 126 is connected to a sub substrate 302. The mother substrate 201 includes a mounting component 160 mounted thereto, and the inductor portion of the inductor bridge 126 is located in a clearance between the mounting component 160 and the sub substrate 302.

While the inductor portion includes many conductor patterns and is difficult to be bent, the portion other than the inductor portion is easy to be bent. Thus, as shown in FIG. 56A and FIG. 56B, the inductor bridge is likely to be bent at a boundary between the inductor portion and the portion other than the inductor portion. Since the inductor portion stands perpendicular or substantially perpendicularly to the mother substrate 201, it is easy to arrange the inductor portion in a narrow space between components. Moreover, a required plane area is reduced. Furthermore, in a case in which the mother substrate 201 includes thereon a metal pattern (such as a ground conductor pattern) 83, the inductor portion of the inductor bridge 126 includes a coil axis that is perpendicular or substantially perpendicular to the metal pattern 83, which prevents an eddy current from being generated in the metal pattern 83 and suppresses loss, and change in inductance.

In the example shown in FIG. 56C, the inductor bridge 126 in a flat plate state is mounted to the mother substrate 201. In this way, the inductor bridge 126 is able to be arranged without being bent, as needed.

Twenty-Sixth Preferred Embodiment

Figure 57A:
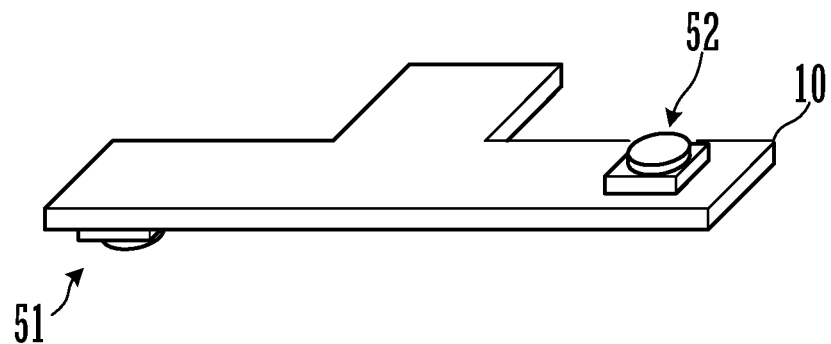
FIG. 57A is a perspective view of an inductor bridge 127 according to a twenty-sixth preferred embodiment of the present invention.
Figure 57B:
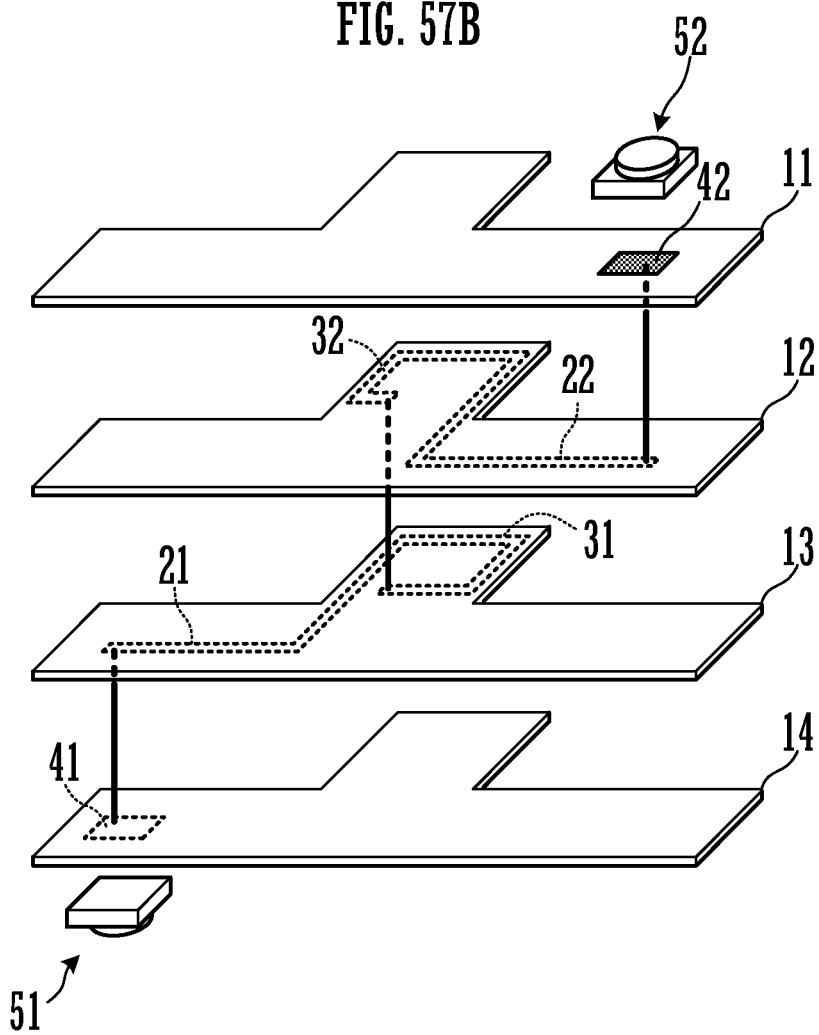
FIG. 57B is an exploded perspective view of the inductor bridge 127.

FIG. 57A is a perspective view of an inductor bridge 127 according to a twenty-sixth preferred embodiment of the present invention, and FIG. 57B is an exploded perspective view of the inductor bridge 127. The inductor bridge 127 includes an element body 10 and an inductor in the element body 10. The element body 10 includes connectors 51 and 52 on the outer surface thereof. As shown in FIG. 57B, the element body 10 is configured preferably by laminating resin base materials 11, 12, 13, and 14. The resin base materials 12 and 13 include on the lower surface thereof an inductor portion defined by conductor patterns 31 and 32. In addition, the resin base materials 12 and 13 include thereon wiring patterns 21 and 22. The resin base material 11 includes a connector mounting electrode 42, and the resin base material 14 includes a connector mounting electrode 41.

The main features of the inductor bridge 127 of the present preferred embodiment of the present invention are that: the inductor is electrically connected between the two connectors 51 and 52; in the mechanical structure, the inductor portion is arranged at a portion different from a portion on a line connecting the two connectors 51 and 52; the portion that is not on the line between the two connectors 51 and 52 is bent; and the inductor bridge is bent along a line parallel or substantially parallel to the line connecting the two connectors 51 and 52.

Figure 58A:
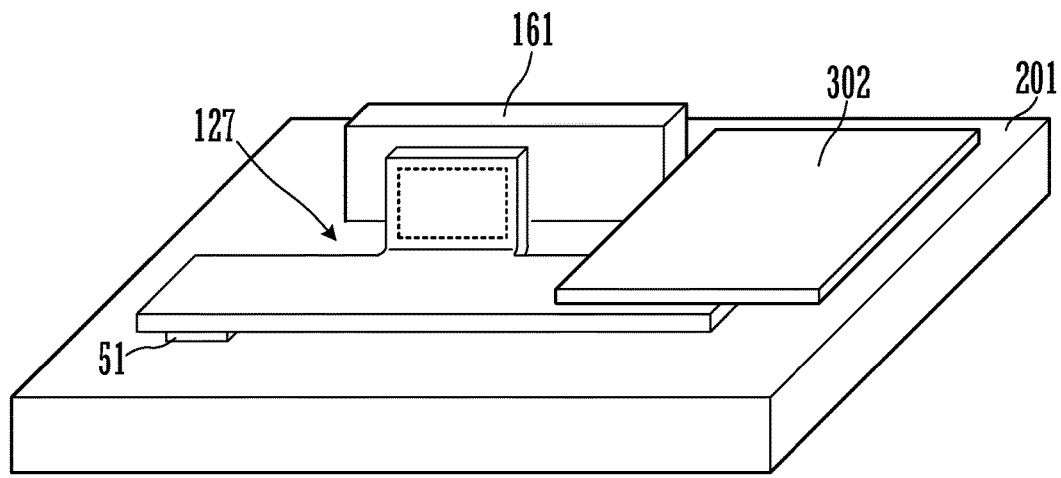
FIG. 58A and FIG. 58B are views showing a state in which the inductor bridge 127 is mounted to a mother substrate 201 together with other components.
Figure 58B:
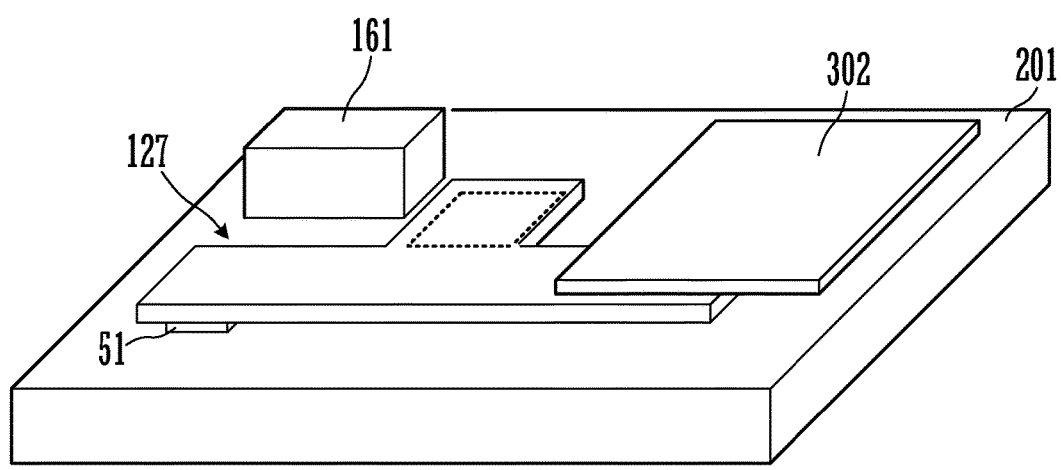

FIG. 58A and FIG. 58B are views showing a state in which the inductor bridge 127 is mounted to the mother substrate 201 together with other components. The first connector 51 of the inductor bridge 127 is connected to the connecting portion on the mother substrate 201. The second connector 52 of the inductor bridge 127 is connected to a sub substrate 302. The mother substrate 201 includes a mounting component 161 mounted thereto.

In particular, in the example shown in FIG. 58A, the inductor portion of the inductor bridge 127 rises so as not to interfere with the mounting component 161. Since the inductor portion rises perpendicular or substantially perpendicularly to the mother substrate 201, it is easy to arrange the inductor portion in a narrow space between components.

Moreover, in the example shown in FIG. 58B, the inductor portion of the inductor bridge 127 does not stand, and the inductor bridge 127 is arranged on the mother substrate 201 so that the inductor portion may not interfere with the mounting component 161.

In this way, the inductor portion preferably is provided at a portion different from a portion on a line connecting the two connectors. The configuration, even when a distance between the two connectors is not secured, generates a predetermined large inductance.

While preferred embodiments of the present invention have been described above, it is to be understood that variations and modifications will be apparent to those skilled in the art without departing from the scope and spirit of the present invention. The scope of the present invention, therefore, is to be determined solely by the following claims.

What is claimed is:

1. An inductor bridge comprising:
a flexible flat plate-shaped element body;
a first connecting portion that is provided on the element body and structured to be connected to a first circuit;
a second connecting portion that is provided on the element body and structured to be connected to a second circuit; and
an inductor portion that is connected between the first connecting portion and the second connecting portion; wherein
the inductor portion includes a plurality of conductor patterns of which a coil axis is oriented in a direction perpendicular or substantially perpendicular to a principal surface of the element body;
the plurality of conductor patterns are provided over a plurality of layers;
the plurality of conductor patterns have a helical shape over the plurality of layers;
the plurality of conductor patterns are provided in a position in which the plurality of conductor patterns face each other between the plurality of layers; and
among the plurality of conductor patterns, a line width of the conductor pattern that is closest to the first connecting portion on a path and a line width of the conductor pattern that is closest to the second connecting portion on a path are thinner than a line width of the conductor patterns of other layers.

2. The inductor bridge according to claim 1, wherein
the first connecting portion is provided on a first end portion of the element body;
the second connecting portion is provided on a second end portion of the element body; and
the element body includes a bending portion between the first end portion and the second end portion.

3. The inductor bridge according to claim 2, wherein the bending portion is arranged at a position other than a line passing through a center of the inductor portion.

4. The inductor bridge according to claim 1, wherein the first connecting portion is structured to be electrically connected to the first circuit by mechanical contact and the second connecting portion is structured to be electrically connected to the second circuit by mechanical contact.

5. An electronic device comprising:
the inductor bridge according to claim 1;
the first circuit; and
the second circuit; wherein
the first circuit and the second circuit are connected to each other through the inductor bridge.

6. An inductor bridge comprising:
a flexible flat plate-shaped element body;
a first connecting portion that is provided on the element body and structured to be connected to a first circuit;
a second connecting portion that is provided on the element body and structured to be connected to a second circuit; and
an inductor portion that is connected between the first connecting portion and the second connecting portion; wherein
the inductor portion includes a plurality of conductor patterns of which a coil axis is oriented in a direction perpendicular or substantially perpendicular to a principal surface of the element body;
the plurality of conductor patterns are provided over a plurality of layers;
the plurality of conductor patterns have a helical shape over the plurality of layers;
the plurality of conductor patterns are provided in a position in which the plurality of conductor patterns face each other between the plurality of layers;
the plurality of conductor patterns includes:
a first conductor pattern that is closest to the first connecting portion or the second connecting portion on a path; and
a second conductor pattern of a layer that is adjacent to the first conductor pattern; and
a distance between the first conductor pattern and the second conductor pattern is larger than a distance between the conductor patterns in other layers that are adjacent to the first conductor pattern.

7. The inductor bridge according to claim 6, wherein
the first connecting portion is provided on a first end portion of the element body;
the second connecting portion is provided on a second end portion of the element body; and
the element body includes a bending portion between the first end portion and the second end portion.

8. The inductor bridge according to claim 7, wherein the bending portion is arranged at a position other than a line passing through a center of the inductor portion.

9. The inductor bridge according to claim 6, wherein the first connecting portion is structured to be electrically connected to the first circuit by mechanical contact and the second connecting portion is structured to be electrically connected to the second circuit by mechanical contact.

10. An electronic device comprising:
the inductor bridge according to claim 6;
the first circuit; and
the second circuit; wherein
the first circuit and the second circuit are connected to each other through the inductor bridge.

11. An electronic device comprising:
an inductor bridge; and
a planar conductor; wherein
the inductor bridge comprises:
a flexible flat plate-shaped element body;
a first connecting portion that is provided on the element body and structured to be connected to a first circuit;
a second connecting portion that is provided on the element body and structured to be connected to a second circuit; and an inductor portion that is connected between the first connecting portion and the second connecting portion;

the inductor portion includes a plurality of conductor patterns of which a coil axis is oriented in a direction perpendicular or substantially perpendicular to a principal surface of the element body;

the plurality of conductor patterns are provided over a plurality of layers; and a layer on which a conductor pattern of the plurality of conductor patterns with a larger number of turns among the plurality of conductor patterns is provided is arranged on a layer spaced farther away from the planar conductor.

12. The electronic device according to claim 11, wherein the plurality of conductor patterns are provided in a position in which the plurality of conductor patterns face each other between the plurality of layers.

13. The electronic device according to claim 11, wherein the plurality of conductor patterns are provided in a position in which a capacitance is generated between the plurality of conductor patterns and the planar conductor.

14. The electronic device according to claim 13, wherein the capacitance and the inductor portion define a low pass filter.

* * * * *